(12) United States Patent
Togawa

(10) Patent No.: US 11,848,162 B2
(45) Date of Patent: Dec. 19, 2023

(54) MULTILAYER CERAMIC ELECTRONIC COMPONENT WITH METAL TERMINALS FOR HIGH WITHSTAND VOLTAGE AND REDUCED MOUNTING AREA

(71) Applicant: Murata Manufacturing Co., Ltd., Nagaokakyo (JP)

(72) Inventor: Makoto Togawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1413 days.

(21) Appl. No.: 16/211,348

(22) Filed: Dec. 6, 2018

(65) Prior Publication Data

US 2019/0180943 A1 Jun. 13, 2019

(30) Foreign Application Priority Data

Dec. 8, 2017 (JP) .................. 2017-236342

(51) Int. Cl.
*H01G 4/38* (2006.01)
*H01G 4/012* (2006.01)
(Continued)

(52) U.S. Cl.
CPC ............... *H01G 4/38* (2013.01); *H01G 4/012* (2013.01); *H01G 4/232* (2013.01); *H01G 4/248* (2013.01);
(Continued)

(58) Field of Classification Search
CPC .......... H01G 4/38; H01G 4/012; H01G 4/232; H01G 4/248; H01G 4/1227; H01G 4/1236;
(Continued)

(56) References Cited

U.S. PATENT DOCUMENTS

2005/0128678 A1* 6/2005 Hidaka ................ H01G 2/12
361/305
2006/0158825 A1* 7/2006 Hidaka ................ H01G 4/232
361/303
(Continued)

FOREIGN PATENT DOCUMENTS

JP 58-56312 A 4/1983
JP 01-067726 U 5/1989
(Continued)

OTHER PUBLICATIONS

Official Communication issued in Japanese Patent Application No. 2017-236342, dated Feb. 18, 2020.

*Primary Examiner* — David M Sinclair
*Assistant Examiner* — Daniel M Dubuisson
(74) *Attorney, Agent, or Firm* — Keating & Bennett, LLP

(57) ABSTRACT

A multilayer ceramic electronic component includes an end surface of a second external electrode and an end surface of a fourth external electrode that face a mounting surface of a mounting substrate on which a first multilayer ceramic electronic component body and a second multilayer ceramic electronic component body are mounted. A first metal terminal is connected to the second external electrode, a second metal terminal is connected to the fourth external electrode, and a connection terminal is connected across a first external electrode and a third external electrode. An insulator is disposed between the first multilayer ceramic electronic component body and the second multilayer ceramic electronic component body.

20 Claims, 28 Drawing Sheets

(51) Int. Cl.
  *H01G 4/232* (2006.01)
  *H01G 4/248* (2006.01)
  *H01G 4/30* (2006.01)
  *H10N 30/50* (2023.01)
  *H10N 30/88* (2023.01)
  *H10N 30/87* (2023.01)
  *H10N 30/853* (2023.01)
  *H01G 4/12* (2006.01)

(52) U.S. Cl.
  CPC ......... *H10N 30/50* (2023.02); *H10N 30/8536* (2023.02); *H10N 30/871* (2023.02); *H10N 30/872* (2023.02); *H10N 30/875* (2023.02); *H10N 30/88* (2023.02); *H01G 4/1227* (2013.01); *H01G 4/1236* (2013.01); *H01G 4/30* (2013.01); *H10N 30/8554* (2023.02)

(58) Field of Classification Search
  CPC ........ H01G 4/30; H01G 2/02; H01L 41/0471; H01L 41/0472; H01L 41/0475; H01L 41/053; H01L 41/083; H01L 41/1871; H01L 41/1876; H05K 1/18
  See application file for complete search history.

(56) References Cited

U.S. PATENT DOCUMENTS

| | | | | |
|---|---|---|---|---|
| 2009/0147440 | A1* | 6/2009 | Cygan | H01G 4/38 361/306.3 |
| 2010/0053842 | A1* | 3/2010 | Devoe | H05K 1/181 361/306.3 |
| 2011/0075318 | A1* | 3/2011 | Suzuki | H01L 41/0477 156/89.16 |
| 2011/0102969 | A1* | 5/2011 | Togashi | H01G 4/232 29/25.03 |
| 2013/0016488 | A1* | 1/2013 | McConnell | H01G 4/232 361/774 |
| 2013/0100576 | A1* | 4/2013 | Seo | H01G 4/12 361/301.4 |
| 2013/0146347 | A1* | 6/2013 | McConnell | H05K 3/303 361/301.4 |
| 2013/0201601 | A1* | 8/2013 | Nishisaka | H01G 4/306 361/301.4 |
| 2014/0002952 | A1* | 1/2014 | McConnell | H01G 4/2325 29/25.42 |
| 2014/0160624 | A1* | 6/2014 | McConnell | H01G 13/006 361/301.4 |
| 2014/0293500 | A1* | 10/2014 | Seo | H01G 4/12 29/25.42 |
| 2015/0170842 | A1* | 6/2015 | An | H01G 4/012 361/321.2 |
| 2016/0219739 | A1* | 7/2016 | Park | H01G 4/30 |
| 2017/0339792 | A1* | 11/2017 | Hattori | H01G 2/065 |
| 2017/0358397 | A1* | 12/2017 | McConnell | H01G 4/002 |
| 2018/0182553 | A1* | 6/2018 | Yazawa | H01G 4/12 |

FOREIGN PATENT DOCUMENTS

| | | | | |
|---|---|---|---|---|
| JP | 3-235317 | A | | 10/1991 |
| JP | 07-135124 | A | | 5/1995 |
| JP | 9-266125 | A | | 10/1997 |
| JP | 2002-57063 | A | | 2/2002 |
| JP | 2003-272946 | A | | 9/2003 |
| JP | 2006-041014 | A | | 2/2006 |
| JP | 2011-40683 | A | | 2/2011 |
| JP | 2011040683 | A | * | 2/2011 ............. H01G 4/252 |
| JP | 2013149675 | A | * | 8/2013 ............. H01G 4/12 |

* cited by examiner

MULTILAYER CERAMIC ELECTRONIC COMPONENT WITH METAL TERMINALS FOR HIGH WITHSTAND VOLTAGE AND REDUCED MOUNTING AREA

CROSS REFERENCE TO RELATED APPLICATIONS

This application claims the benefit of priority to Japanese Patent Application No. 2017-236342 filed on Dec. 8, 2017. The entire contents of this application are hereby incorporated herein by reference.

BACKGROUND OF THE INVENTION

1. Field of the Invention

The present invention relates to a multilayer ceramic electronic component, and particularly, to a multilayer ceramic electronic component suitable for a high withstand voltage.

2. Description of the Related Art

In recent years, miniaturization and high capacitance of a multilayer ceramic capacitor is advancing due to miniaturization and surface mounting of an electronic device. Such a trend also spreads to medium and high voltage capacitors for a backlight and a switching power supply of a liquid crystal display. Thus, in the field of high-withstand voltage multilayer ceramic capacitor, there is also a demand for a smaller and high-capacitance multilayer ceramic capacitor.

For example, the method described in Japanese Patent Application Laid-Open No. 2003-272946 has been proposed as a method for increasing the withstand voltage. In the method of Japanese Patent Application Laid-Open No. 2003-272946, as illustrated in FIGS. 33A to 33C, an internal electrode 4 connected to external electrodes 3 opposed to each other at both ends of a laminated body 2 made of a dielectric are divided into a plurality of pieces, and adjacent internal electrodes 5 are formed with a dielectric layer interposed therebetween so as to overlap both sides of the divided portion. At this point, the internal electrode 5 is not connected to the external electrode 3.

By adopting this structure, a capacitor is formed in a portion in which the internal electrode 4 and the internal electrode 5 are opposed to each other. Thus, a plurality of capacitors are formed between the external electrodes 3 opposed to each other, and the capacitors are connected in series. For this reason, voltage applied to each capacitor is decreased, so that the internal withstand voltage of the laminated body 2 is able to be increased.

However, in order to obtain the higher withstand voltage, it is necessary to increase the number of divided internal electrodes and to increase the number of opposed portions of the internal electrodes (to increase the number of capacitors connected in series). However, there is a limit to the high withstand voltage design within a range of the standard dimensions of the multilayer ceramic capacitor. This is because when the number of divided internal electrodes is increased to increase the number of the opposing portions of the internal electrodes, an effective area of the opposing portion of the internal electrodes is reduced, and the electrostatic capacitance is difficult to acquire.

It is conceivable as a countermeasure against the above-described problem to mount a plurality of multilayer ceramic capacitors having a structure in which the number of opposing portions of the internal electrodes is increased, on the mounting substrate. However, in this case, the mounting area becomes large as the number of multilayer ceramic capacitors is increased.

SUMMARY OF THE INVENTION

Preferred embodiments of the present invention provide multilayer ceramic electronic components that are each capable of achieving compatibility between obtaining the electrostatic capacitance and reducing or preventing the mounting area from becoming large in a high withstand voltage design.

According to a preferred embodiment of the present invention, a multilayer ceramic electronic component includes a first laminated body including a plurality of laminated dielectric layers and a plurality of laminated internal electrodes, the first laminated body including a first main surface and a second main surface that are opposed to each other in a laminating direction, a first side surface and a second side surface that are opposed to each other in a width direction orthogonal or substantially orthogonal to the laminating direction, and a first end surface and a second end surface that are opposed to each other in a length direction orthogonal or substantially orthogonal to the laminating direction and the width direction; a first multilayer ceramic electronic component body including a first external electrode disposed on the first end surface of the first laminated body and a second external electrode disposed on the second end surface of the first laminated body; a second laminated body including a plurality of laminated dielectric layers and a plurality of laminated internal electrodes, the second laminated body including a third main surface and a fourth main surface that are opposed to each other in the laminating direction, a third side surface and a fourth side surface that are opposed to each other in the width direction orthogonal or substantially orthogonal to the laminating body, a third end surface and a fourth end surface that are opposed to each other in the length direction orthogonal or substantially orthogonal to the laminating direction and the width direction; a second multilayer ceramic electronic component body including a third external electrode disposed on the third end surface of the second laminated body and a fourth external electrode disposed on the fourth end surface of the second laminated body; and a first metal terminal, a second metal terminal, and a connection terminal. An end surface of the second external electrode and an end surface of the fourth external electrode face a mounting surface of a mounting substrate on which the first multilayer ceramic electronic component body and the second multilayer ceramic electronic component body are mounted, the first metal terminal is connected to the second external electrode, the second metal terminal is connected across the fourth external electrode, and the connection terminal is connected across the first external electrode and the third external electrode, and an insulator is disposed between the first multilayer ceramic electronic component body and the second multilayer ceramic electronic component body.

In a multilayer ceramic electronic component according to a preferred embodiment of the present invention, preferably the plurality of internal electrodes provided in the first multilayer ceramic electronic component body include a fifth internal electrode connected to the first external electrode; a sixth internal electrode on the same dielectric layer as the fifth internal electrode and connected to the second external electrode while being spaced away from the fifth internal electrode by a predetermined interval; and a seventh internal electrode located on a dielectric layer different from the dielectric layer on which the fifth internal electrode and the sixth internal electrode are located, and the seventh internal electrode is disposed so as to be opposed to a portion of the fifth internal electrode and a portion of the sixth internal electrode.

In a multilayer ceramic electronic component according to a preferred embodiment of the present invention, preferably the plurality of internal electrodes provided in the first multilayer ceramic electronic component body include an eleventh internal electrode connected to the first external electrode; a twelfth internal electrode on a dielectric layer different from the dielectric layer on which the eleventh internal electrode is located, and connected to the second external electrode; at least one thirteenth internal electrode on the dielectric layer as the eleventh internal electrode and spaced away from the eleventh internal electrode by a predetermined interval; and at least one fourteenth internal electrode on the same dielectric layer as the twelfth internal electrode and spaced away from the twelfth internal electrode by a predetermined interval, the thirteenth internal electrode is opposed to any two of a portion of the twelfth internal electrode, a portion of the fourteenth internal electrode, and a portion of another fourteenth internal electrodes, and the fourteenth internal electrode is opposed to any two of a portion of the eleventh internal electrode, a portion of the thirteenth internal electrode and a portion of another thirteenth internal electrode.

In a multilayer ceramic electronic component according to a preferred embodiment of the present invention, preferably the plurality of internal electrodes provided in the first multilayer ceramic electronic component body include a nineteenth internal electrode connected to the first external electrode; a twentieth internal electrode on the same dielectric layer as the nineteenth internal electrode and connected to the second external electrode while being spaced away from the nineteenth internal electrode by a predetermined interval; at least one twenty-first internal electrode on the same dielectric layer as the nineteenth internal electrode and the twentieth internal electrode and spaced away from the nineteenth internal electrode and the twentieth internal electrode by a predetermined interval; and at least two twenty-second internal electrodes on a dielectric layer different from the dielectric layer on which the nineteenth internal electrode and the twentieth internal electrode are located, the twenty-first internal electrode is opposed to a portion of the twenty-second internal electrode and a portion of another twenty-second internal electrode, and the twenty-second internal electrode is opposed to any two of a portion of the nineteenth internal electrode, a portion of the twentieth internal electrode, a portion of the twenty-first internal electrode, and a portion of another twenty-first internal electrode.

In a multilayer ceramic electronic component according to a preferred embodiment of the present invention, preferably the plurality of internal electrodes provided in the second multilayer ceramic electronic component body include an eighth internal electrode connected to the third external electrode; a ninth internal electrode on the same dielectric layer as the eighth internal electrode and connected to the fourth external electrode while being spaced away from the eighth internal electrode by a predetermined interval; and a tenth internal electrode on a dielectric layer different from the dielectric layer on which the eighth internal electrode and the ninth internal electrode are located, and the tenth internal electrode is opposed to a portion of the eighth internal electrode and a portion of the ninth internal electrode.

In a multilayer ceramic electronic component according to a preferred embodiment of the present invention, preferably the plurality of internal electrodes provided in the second multilayer ceramic electronic component body include a fifteenth internal electrode connected to the third external electrode; a sixteenth internal electrode on a dielectric layer different from the dielectric layer on which the fifteenth internal electrode is located, and connected to the fourth external electrode; at least one seventeenth internal electrode on the same dielectric layer as the fifteenth internal electrode and spaced away from the fifteenth internal electrode with a predetermined distance; and at least one eighteenth internal electrode on the same dielectric layer identical as the sixteenth internal electrode and spaced away from the sixteenth internal electrode with a predetermined distance, the seventeenth internal electrode is opposed to any two of a portion of the sixteenth internal electrode, a portion of the eighteenth internal electrode, and a portion of another eighteenth internal electrodes, and the eighteenth internal electrode is provided so as to be opposed to any two of a portion of the fifteenth internal electrode, a portion of the seventeenth internal electrode, and a portion of another seventeenth internal electrode.

In a multilayer ceramic electronic component according to a preferred embodiment of the present invention, preferably the plurality of internal electrodes provided in the second multilayer ceramic electronic component body include a twenty-third internal electrode connected to the third external electrode; a twenty-fourth internal electrode on the same dielectric layer as the twenty-third internal electrode and connected to the fourth external electrode while being spaced away from the twenty-third internal electrode by a predetermined interval; at least one twenty-fifth internal electrode on the same dielectric layer as the twenty-third internal electrode and the twenty-fourth internal electrode and spaced away from the twenty-third internal electrode and the twenty-fourth internal electrode by a predetermined interval; and at least two twenty-sixth internal electrodes on a dielectric layer different from the dielectric layer on which the twenty-third internal electrode and the twenty-fourth internal electrode are located, the twenty-fifth internal electrode is opposed to a portion of the twenty-sixth internal electrode and a portion of another twenty-sixth internal electrode, and the twenty-sixth internal electrode is opposed to any two of a portion of the twenty-third internal electrode, a portion of the twenty-fourth internal electrode, a portion of the twenty-fifth internal electrode, and a portion of another twenty-fifth internal electrode.

In a multilayer ceramic electronic component according to a preferred embodiment of the present invention, preferably the insulator is disposed such that the first main surface or the second main surface of the first multilayer ceramic electronic component body contacts the first main surface of the insulator and such that the third main surface or the fourth main surface of the second multilayer ceramic electronic component body contacts the second main surface of the insulator, or the insulator is disposed such that the first side surface or the second side surface of the first multilayer ceramic electronic component body contacts the first main surface of the insulator and such that the third side surface or the fourth side surface of the second multilayer ceramic electronic component body contacts the second main surface of the insulator.

In a multilayer ceramic electronic component according to a preferred embodiment of the present invention, preferably the first metal terminal includes a first terminal bonding portion connected to the second external electrode, a first extended portion that is connected to the first terminal bonding portion and extends in a direction of the mounting surface such that a gap is provided between the first multilayer ceramic electronic component body and the mounting surface of the mounting substrate, and a first mounting portion connected to the first extended portion, the second metal terminal includes a second terminal bonding portion connected to the fourth external electrode, a second extended portion that is connected to the second terminal bonding portion and extends in the direction of the mounting surface such that a gap is provided between the second multilayer ceramic electronic component body and the mounting surface of the mounting substrate, and a second mounting portion connected to the second extended portion, and the connection terminal includes a third terminal bonding portion connected to the first external electrode, a fourth terminal bonding portion connected to the third external electrode, and a third extended portion that is connected to the third external electrode and the fourth terminal bonding portion and extends in a direction connecting the first external electrode and the third external electrode while being located between the first external electrode and the third external electrode.

In a multilayer ceramic electronic component according to a preferred embodiment of the present invention, preferably the first metal terminal and the second metal terminal are a frame terminal.

In a multilayer ceramic electronic component according to a preferred embodiment of the present invention, preferably the first metal terminal and the second metal terminal are lead wires, the first mounting portion extends on an extension line of the first extended portion, and the second mounting portion extends on an extension line of the second extended portion.

In a multilayer ceramic electronic component according to a preferred embodiment of the present invention, preferably the first metal terminal and the second metal terminal have a U-shape or substantially U-shape in cross section or an L-shape or substantially L-shape in cross section.

In a multilayer ceramic electronic component according to a preferred embodiment of the present invention, preferably the insulator is an insulating sheet or resin.

In a multilayer ceramic electronic component according to a preferred embodiment of the present invention, preferably the insulator is a resin, and the resin is disposed between the first multilayer ceramic electronic component body and the second multilayer ceramic electronic component body, and covers the first multilayer ceramic electronic component body, the second multilayer ceramic electronic component body, the connection terminal, a portion of the first metal terminal, and a portion of the second metal terminal.

According to preferred embodiments of the present invention, multilayer ceramic electronic components that are each capable of achieving compatibility between obtaining the electrostatic capacitance and reducing or preventing the mounting area from becoming large are able to be obtained in the high-withstand voltage design.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the accompanying drawings.

First Preferred Embodiment

Figure 1:
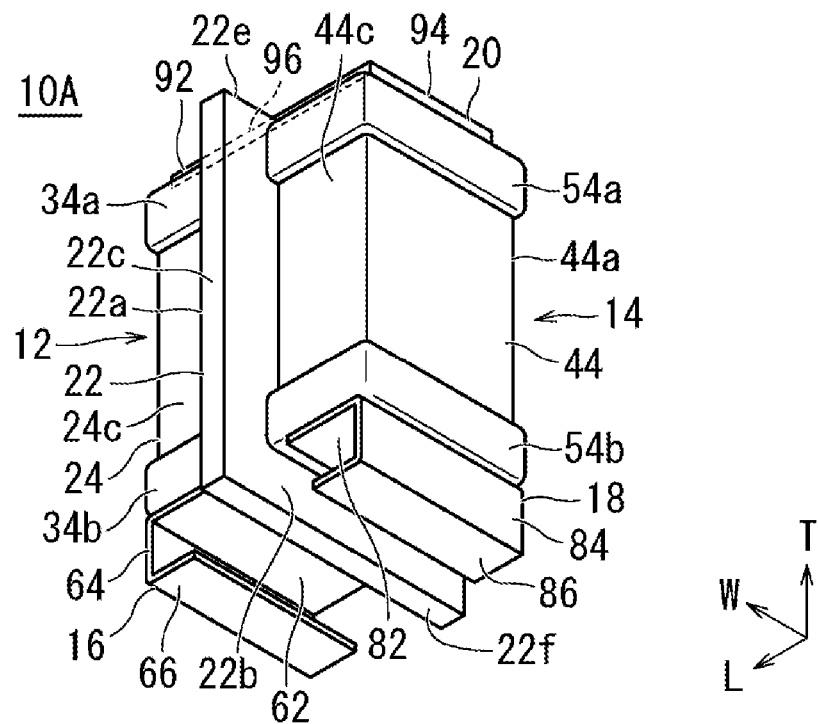
FIG. 1 is an external perspective view illustrating an example of a multilayer ceramic electronic component according to a first preferred embodiment of the present invention.
Figure 2:
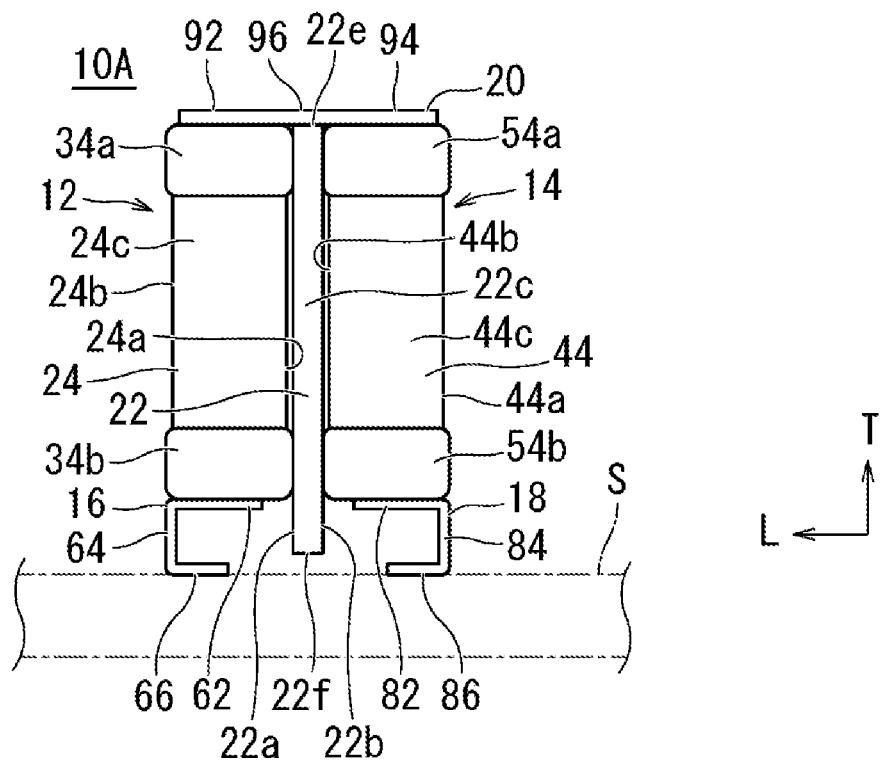
FIG. 2 is a front view of the multilayer ceramic electronic component in FIG. 1.
Figure 3:
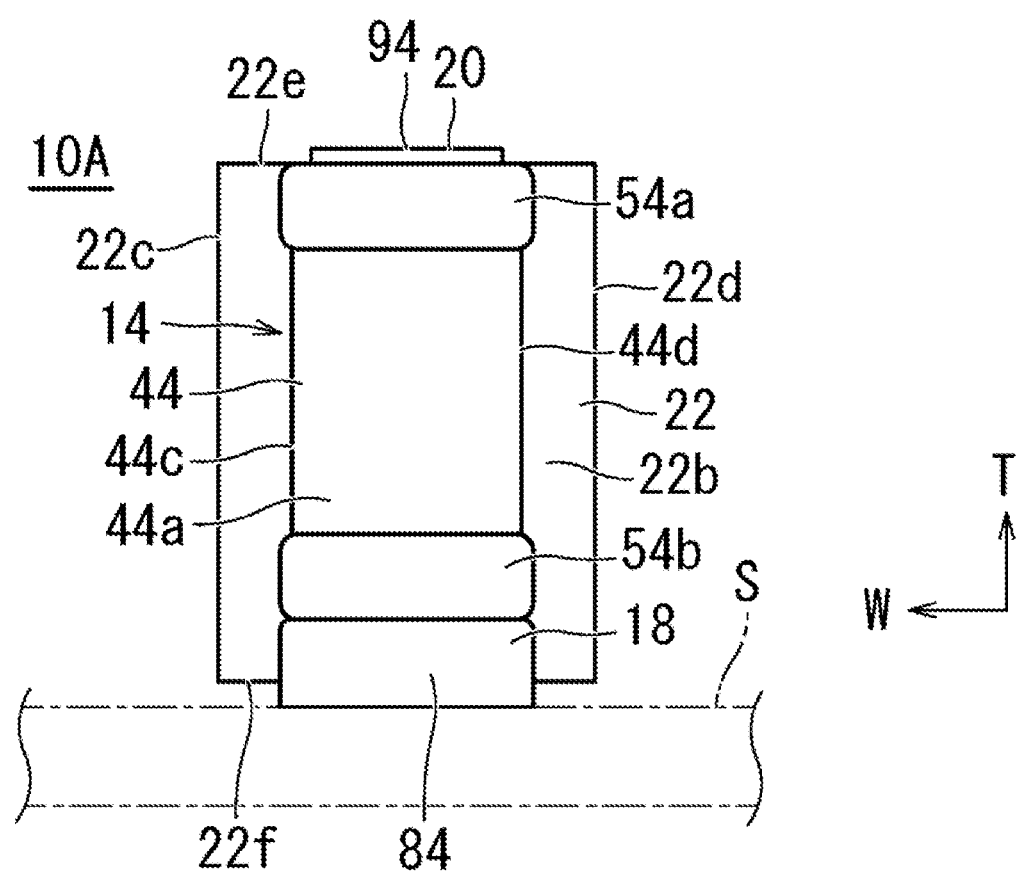
FIG. 3 is a side view of the multilayer ceramic electronic component in FIG. 1.
Figure 4:
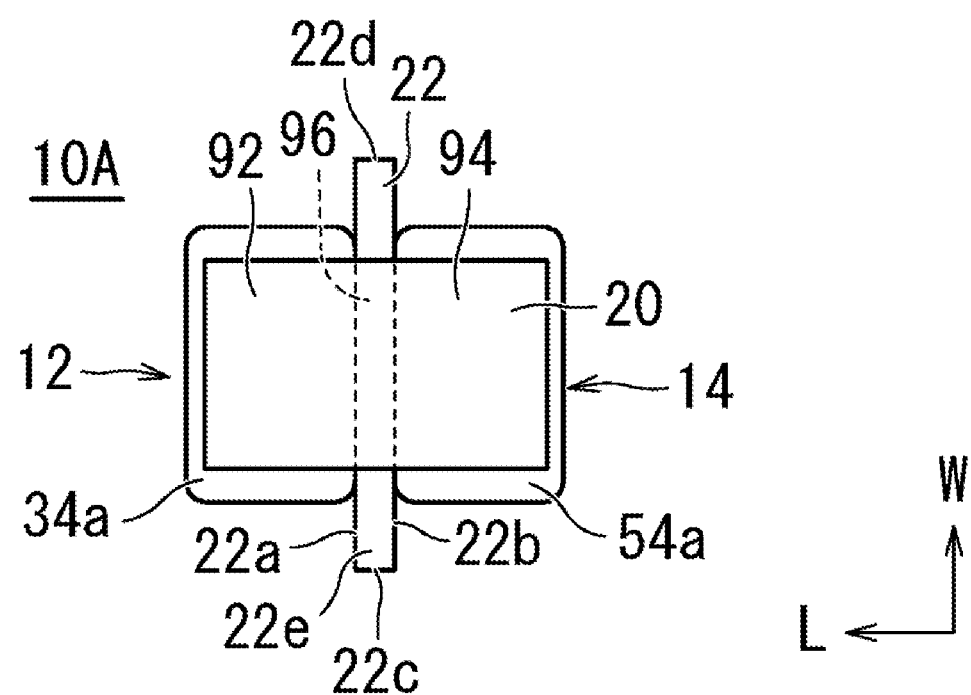
FIG. 4 is a plan view of the multilayer ceramic electronic component in FIG. 1.

A multilayer ceramic electronic component according to a first preferred embodiment of the present invention will be described. FIG. 1 is an external perspective view illustrating the multilayer ceramic electronic component of the first preferred embodiment of the present invention. FIG. 2 is a front view of the multilayer ceramic electronic component in FIG. 1. FIG. 3 is a side view of the multilayer ceramic electronic component in FIG. 1. FIG. 4 is a plan view of the multilayer ceramic electronic component in FIG. 1.

As illustrated in FIGS. 1 to 4, a multilayer ceramic electronic component 10A includes a first multilayer ceramic electronic component body 12, a second multilayer ceramic electronic component body 14, a first metal terminal 16, a second metal terminal 18, a connection terminal 20, and an insulator 22. In FIGS. 1 to 4, a symbol T indicates a height direction of the multilayer ceramic electronic component 10A, a symbol L indicates a length direction of the multilayer ceramic electronic component 10A, and a symbol W indicates a width direction of the multilayer ceramic electronic component 10A.

A dimension in the length direction L of the multilayer ceramic electronic component 10A is set to an L dimension. Although the L dimension is not particularly limited, the L dimension may preferably be in a range from about 1 mm to about 15 mm, for example. A dimension in the height direction T of the multilayer ceramic electronic component 10A is set to a T dimension. Although the T dimension is not particularly limited, the T dimension may preferably be in a range from about 2 mm to about 15 mm, for example. A dimension in the width direction W of the multilayer ceramic electronic component 10A is set to a W dimension. Although the W dimension is not particularly limited, the W dimension may preferably be in a range from about 1 mm to about 15 mm, for example.

The first multilayer ceramic electronic component body includes a rectangular or substantially rectangular parallelepiped first laminated body 24, a first external electrode 34a, and a second external electrode 34b. The second multilayer ceramic electronic component body 14 includes a rectangular parallelepiped second laminated body 44, a third external electrode 54a, and a fourth external electrode 54b.

An end surface of the second external electrode 34b and an end surface of the fourth external electrode 54b face a mounting surface of a mounting substrate S on which the multilayer ceramic electronic component 10A is mounted. Thus, the multilayer ceramic electronic component 10A is mounted on the mounting substrate S while the first multilayer ceramic electronic component body 12 and the second multilayer ceramic electronic component body 14 are in a vertical state. As used herein, the vertical state means a state in which a length direction L (to be described later) of the first multilayer ceramic electronic component body 12 and the second multilayer ceramic electronic component body 14 is parallel or substantially parallel to the height direction T of the multilayer ceramic electronic component 10A.

In a lower portion in the height direction T of the multilayer ceramic electronic component 10A, the first metal terminal 16 is connected to the second external electrode 34b, and the second metal terminal 18 is connected to the fourth external electrode 54b. In an upper portion in the height direction T of the multilayer ceramic electronic component 10A, the connection terminal 20 is connected across the first external electrode 34a and the third external electrode 54a.

The sheet-shaped insulator 22 is disposed between the first multilayer ceramic electronic component body 12 and the second multilayer ceramic electronic component body 14 in the vertically placed state. The insulator 22, the first multilayer ceramic electronic component body 12, and the second multilayer ceramic electronic component body 14 are disposed in parallel or substantially in parallel to one another in the length direction L of the multilayer ceramic electronic component 10A.

The components of the multilayer ceramic electronic component 10A will be described in more detail below.

Figure 5:
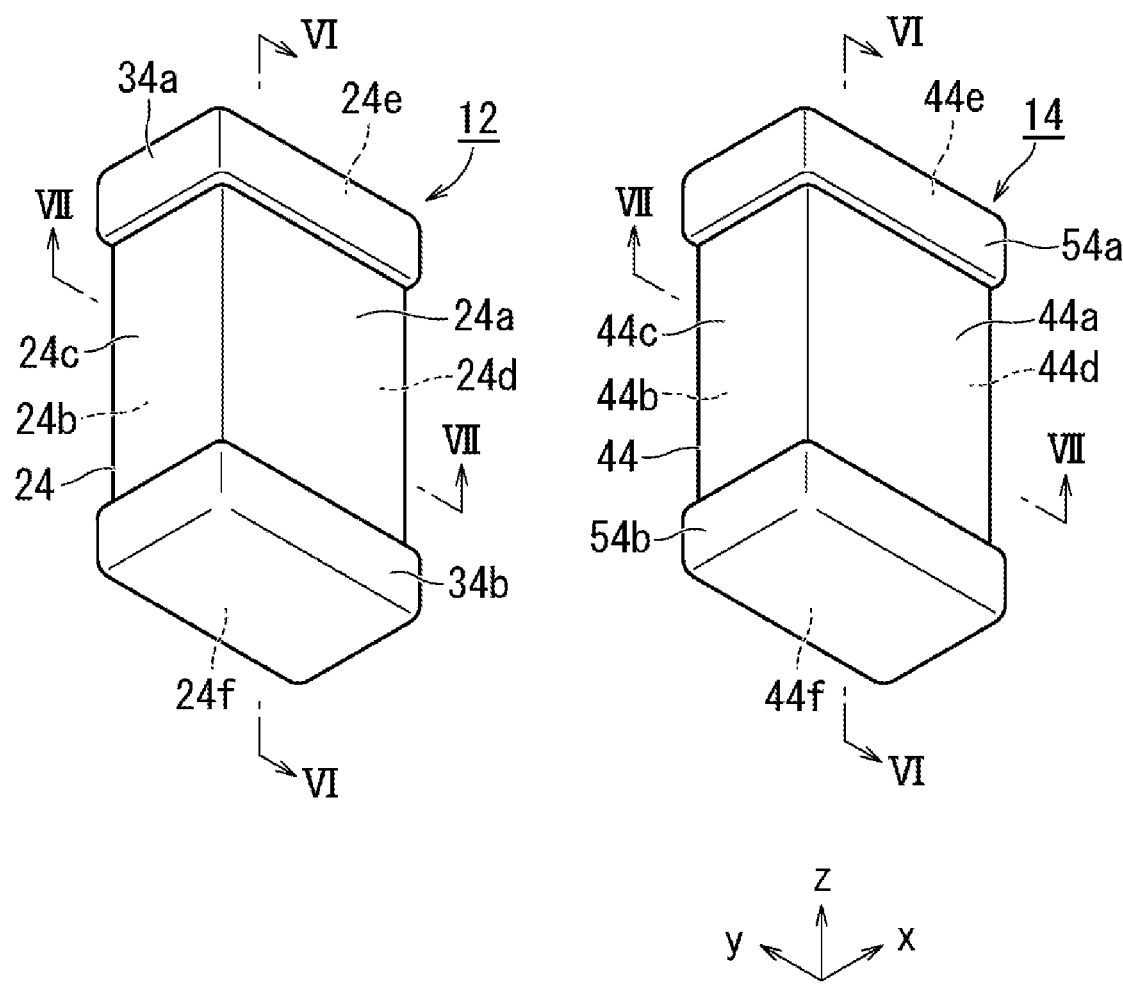
FIG. 5 is an external perspective view illustrating an example of a multilayer ceramic electronic component body in FIG. 1.
Figure 6:
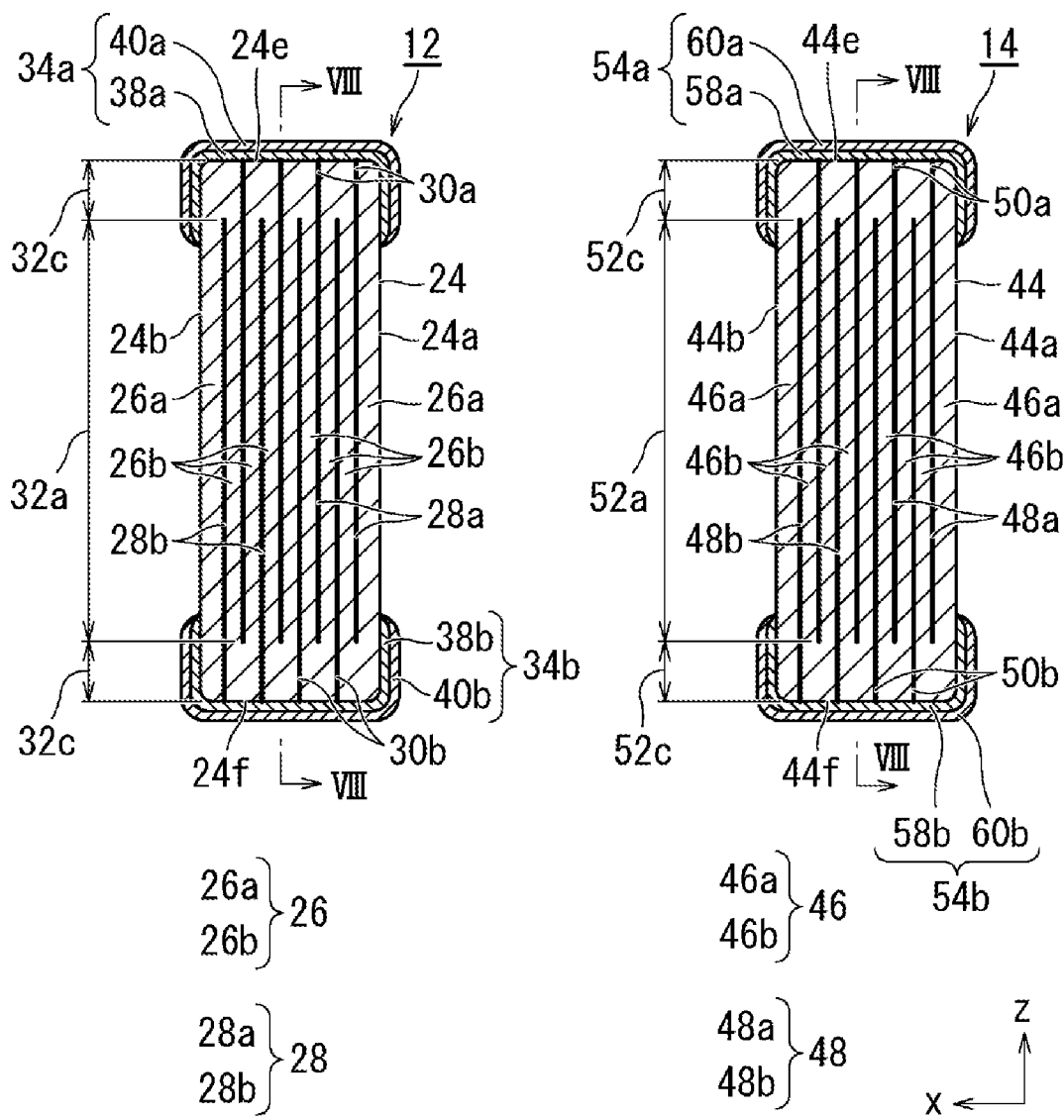
FIG. 6 is a cross-sectional view taken along line VI-VI in FIG. 5.
Figure 7:
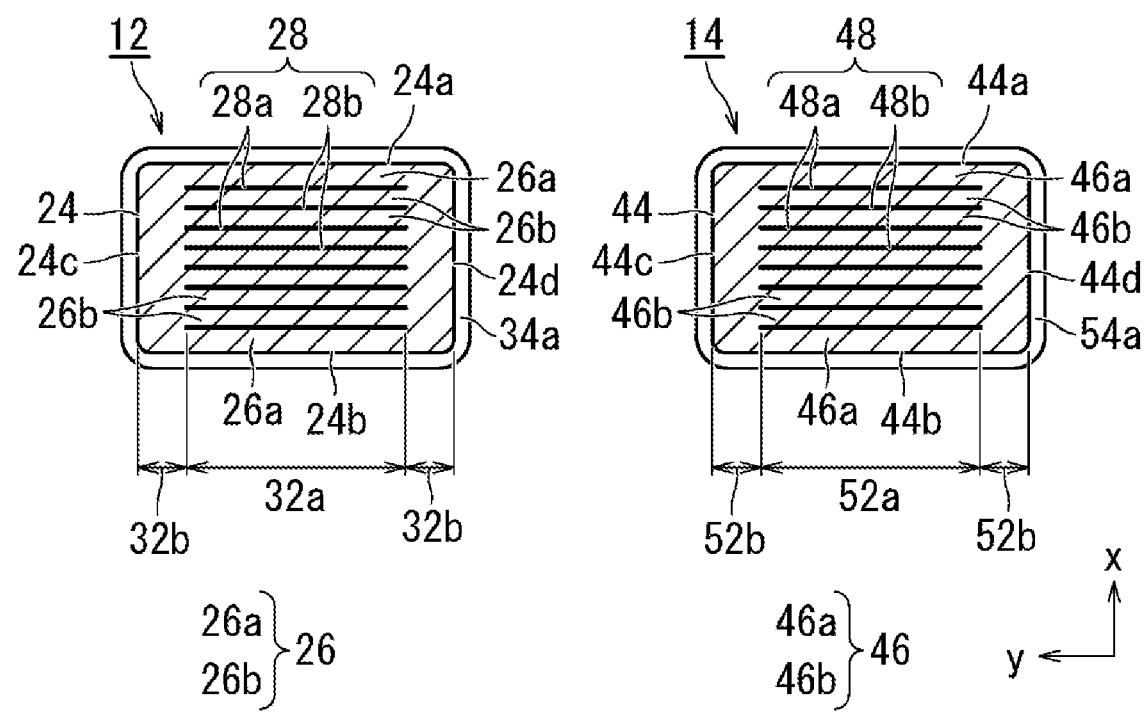
FIG. 7 is a cross-sectional view taken along line VII-VII in FIG. 5.
Figure 8:
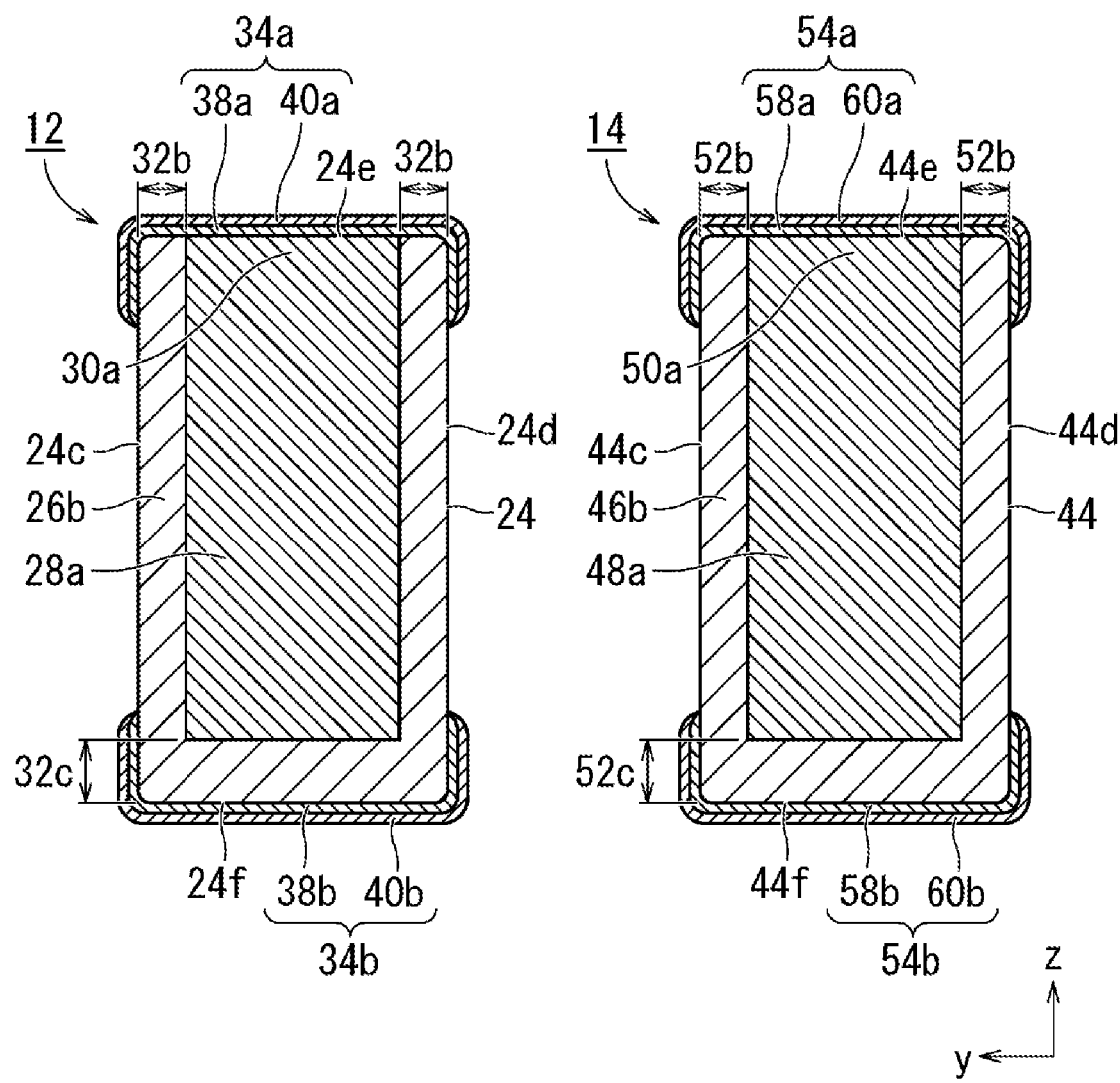
FIG. 8 is a cross-sectional view taken along line VIII-VIII in FIG. 6.

FIG. 5 is an external perspective view illustrating an example of the multilayer ceramic electronic component body in FIG. 1. FIG. 6 is a cross-sectional view taken along line VI-VI in FIG. 5. FIG. 7 is a cross-sectional view taken along line VII-VII in FIG. 5. FIG. 8 is a cross-sectional view taken along line VIII-VIII in FIG. 6.

As illustrated in FIGS. 5 to 8, the first laminated body 24 of the first multilayer ceramic electronic component body 12 includes a plurality of laminated dielectric layers 26 and a plurality of laminated internal electrodes 28. The first laminated body 24 includes a first main surface 24a and a second main surface 24b, which are opposed to each other in a lamination direction x, a first side surface 24c and a second side surface 24d, which are opposite to each other in a width direction y orthogonal or substantially orthogonal to the lamination direction x, and a first end surface 24e and a second end surface 24f, which are opposed to each other in a length direction z orthogonal or substantially orthogonal to the lamination direction x and the width direction y.

Preferably, a corner and the ridgeline of the first laminated body 24 are rounded. The corner is a portion in which three adjacent surfaces of the laminated body intersect, and the ridgeline is a portion in which two adjacent surfaces of the laminated body intersect. Irregularity may be provided in a portion or an entirety of the first main surface 24a and the second main surface 24b, the first side surface 24c and the second side surface 24d, and the first end surface 24e and the second end surface 24f.

The first laminated body 24 includes an outer layer 26a including a plurality of the dielectric layers 26, and an inner layer 26b including one or more of the dielectric layers 26 and a plurality of internal electrodes 28 disposed on one or more of the dielectric layers 26. The outer layer 26a is located on the sides of the first main surface 24a and the second main surface 24b of the first laminated body 24, and includes the plurality of dielectric layers 26 located between the first main surface 24a and the internal electrode 28 closest to the first main surface 24a and the plurality of dielectric layers 26 located between the second main surface 24b and the internal electrode 28 closest to the second main surface 24b. A region sandwiched between both of the outer layers 26a is the inner layer 26b. In other words, the inner layer 26b includes the internal electrode 28, and the outer layer 26a does not include the internal electrode 28.

In the case in which the first multilayer ceramic electronic component body 12 defines and functions as a capacitor, a dielectric ceramic including a component such as, for example, $BaTiO_3$, $CaTiO_3$, $SrTiO_3$, and $CaZrO_3$ may preferably be used as a material for the dielectric layer 26. In the case in which the dielectric material is included as a main component, the dielectric material to which a component with less than the main component, such as an Mn compound, an Fe compound, a Cr compound, a Co compound, and an Ni compound is added may also be used according to a desired characteristic of the first multilayer ceramic electronic component body 12.

In the case in which a piezoelectric ceramic is used for the first laminated body 24, the first multilayer ceramic electronic component body 12 defines and functions as a ceramic piezoelectric element. For example, PZT (lead titanate zirconate)-based ceramic material may preferably be used as a specific example of the piezoelectric ceramic material.

In the case in which a semiconductor ceramic is used for the first laminated body 24, the first multilayer ceramic electronic component body 12 defines and functions as a thermistor element. For example, a spinel-based ceramic material may preferably be used as a specific example of the semiconductor ceramic material.

In the case in which a magnetic ceramic is used for the first laminated body 24, the first multilayer ceramic electronic component body 12 defines and functions as an inductor element. In the case in which the first multilayer ceramic electronic component body 12 defines and functions as the inductor element, the internal electrode 28 is preferably a coil-shaped conductor. For example, a ferrite ceramic material may preferably be used as a specific example of the magnetic ceramic material.

Preferably a thickness of the post-firing dielectric layer 26 is in a range from about 0.5 μm to about 10 μm, for example.

As illustrated in FIG. 6, the first laminated body 24 of the first multilayer ceramic electronic component body 12 includes a plurality of rectangular or substantially rectangular first internal electrodes 28a and a plurality of rectangular or substantially rectangular second internal electrodes 28b. The plurality of first internal electrodes 28a and the plurality of second internal electrodes 28b are buried so as to be alternately arranged at equal or substantially equal intervals along the lamination direction x of the first laminated body 24.

A first extended electrode portion 30a led out to the first end surface 24e of the first laminated body 24 is provided on one end side of the first internal electrode 28a. A second extended electrode portion 30b led out to the second end surface 24f of the first laminated body 24 is provided on one end side of the second internal electrode 28b. Specifically, the first extended electrode portion 30a on one end side of the first internal electrode 28a is exposed on the first end surface 24e of the first laminated body 24. The second extended electrode portion 30b on one end side of the second internal electrode 28b is exposed on the second end surface 24f of the first laminated body 24.

The first laminated body 24 includes an opposed electrode portion 32a in which the first internal electrode 28a and the second internal electrode 28b are opposed to each other with the dielectric layer 26 interposed therebetween in the inner layer 26b of the dielectric layer 26. In the case in which the first multilayer ceramic electronic component body 12 is a capacitor, electrostatic capacitance is produced in the opposed electrode portion 32a.

The first laminated body 24 includes side portions (hereinafter, referred to as "W gaps") 32b of the first laminated body 24, and the W gaps 32b are provided between one end in the width direction y of the opposed electrode portion 32a and the first side surface 24c and between the other end in the width direction y of the opposed electrode portion 32a and the second side surface 24d. The first laminated body 24 includes ends (hereinafter, referred to as "L gaps") 32c of the first laminated body 24, and the L gaps 32c are provided between an end of the first internal electrode 28a on the side opposite to the first extended electrode portion 30a and the second end surface 24f and between an end of the second internal electrode 28b on the side opposite to the second extended electrode portion 30b and the first end surface 24e.

In the first laminated body 24, the internal electrode 28 may be disposed so as to be parallel or substantially parallel to the sheet-shaped insulator 22 (opposed to the insulator 22), or the internal electrode 28 may be disposed so as to be orthogonal or substantially orthogonal to the insulator 22. In the first preferred embodiment, the internal electrode 28 is disposed so as to be parallel or substantially parallel to the insulator 22.

The internal electrode 28 preferably includes, for example, a metal such as Ni, Cu, Ag, Pd, and Au, or an alloy, such as Ag—Pd alloy, which includes one of these metals. The internal electrode 28 may further include dielectric particles having the same or substantially the same composition as the ceramics included in the dielectric layer 26.

Preferably the thickness of the internal electrode 28 is in a range from about 0.2 μm to about 2.0 μm, for example.

The first external electrode 34a is disposed on the side of the first end surface 24e of the first laminated body 24, and the second external electrode 34b is disposed on the side of the second end surface 24f.

The first external electrode 34a is disposed on the surface of the first end surface 24e of the first laminated body 24, extends from the first end surface 24e, and covers the first main surface 24a, the second main surface 24b, the first side surface 24c, and the second side surface 24d. In this case, the first external electrode 34a is electrically connected to the first extended electrode portion 30a of the first internal electrode 28a. Alternatively, the first external electrode 34a may be disposed only on the surface of the first end surface 24e of the first laminated body 24.

The second external electrode 34b is disposed on the surface of the second end surface 24f of the first laminated body 24, extends from the second end surface 24f, and covers the first main surface 24a, the second main surface 24b, the first side surface 24c, and the second side surface 24d. In this case, the second external electrode 34b is electrically connected to the second extended electrode portion 30b of the second internal electrode 28b. Alternatively, the second external electrode 34b may be disposed only on the surface of the second end surface 24f of the first laminated body 24.

In the case in which the first multilayer ceramic electronic component body 12 is a capacitor, in the first laminated body 24, the first internal electrode 28a and the second internal electrode 28b are opposed to each other with the dielectric layer 26 interposed therebetween in each opposed electrode portion 32a, thus producing the electrostatic capacitance. For this reason, the electrostatic capacitance is able to be obtained between the first external electrode 34a to which the first internal electrode 28a is connected and the second external electrode 34b to which the second internal electrode 28b is connected. That is, the first multilayer ceramic electronic component body 12 includes one capacitor in the first laminated body 24.

As illustrated in FIG. 6, the first external electrode 34a includes a first underlying electrode layer 38a and a first plating layer 40a disposed on the surface of the first underlying electrode layer 38a in order from the side of the first laminated body 24. Similarly, the second external electrode 34b includes a second underlying electrode layer 38b and a second plating layer 40b disposed on the surface of the second underlying electrode layer 38b in order from the side of the first laminated body 24.

The first underlying electrode layer 38a is disposed on the surface of the first end surface 24e of the first laminated body 24, extends from the first end surface 24e, and covers a portion of each of the first main surface 24a, the second main surface 24b, the first side surface 24c, and the second side surface 24d. Alternatively, the first underlying electrode layer 38a may be disposed only on the surface of the first end surface 24e of the first laminated body 24.

The second underlying electrode layer 38b is disposed on the surface of the second end surface 24f of the first laminated body 24, extends from the second end surface 24f, and covers a portion of each of the first main surface 24a, the second main surface 24b, the first side surface 24c, and the second side surface 24d. Alternatively, the second underlying electrode layer 38b may be disposed only on the surface of the second end surface 24f of the first laminated body 24.

Each of the first underlying electrode layer 38a and the second underlying electrode layer 38b (hereinafter, also simply referred to as underlying electrode layer) preferably includes, for example, at least one selected from a baking layer, a resin layer, and a thin film layer. In the first preferred embodiment, the first underlying electrode layer 38a and the second underlying electrode layer 38b, which are defined by the baking layer, will be described.

The baking layer includes glass and metal. For example, the metal of the baking layer preferably includes at least one selected from Cu, Ni, Ag, Pb, Ag—Pb alloy, and Au. The glass of the baking layer preferably includes at least one selected from B, Si, Ba, Mg, Al, and Li, for example. A plurality of baking layers may be provided. A conductive paste including glass and metal is applied to the first laminated body 24, and baked to form the baking layer. The baking layer may be formed at the same time as the dielectric layer 26 and the internal electrode are fired, or the baking layer may be formed after the dielectric layer 26 and the internal electrode 28 are fired. Preferably, the thickness of the thickest portion of the baking layer is in a range from about 10 μm to about 50 μm, for example.

A resin layer preferably including conductive particles and a thermosetting resin, for example, may be provided on the surface of the baking layer. The resin layer may be directly provided on the first laminated body 24 without providing the baking layer. A plurality of resin layers may be provided. Preferably, the thickness of the thickest portion of the resin layer is in a range from about 20 μm to about 150 μm, for example.

The thin film layer is formed by a thin film forming method, such as a sputtering method or an evaporation method, for example, and is a layer preferably, for example, having the thickness of about 1 μm or less in which metal particles are deposited.

The first plating layer 40a is disposed on the surface of the first underlying electrode layer 38a so as to cover the first underlying electrode layer 38a. Similarly, the second plating layer 40b is disposed on the surface of the second underlying electrode layer 38b so as to cover the second underlying electrode layer 38b.

For example, at least one metal selected from Cu, Ni, Sn, Ag, Pd, Ag—Pd alloy, and Au or an alloy including the selected metal is preferably used as the first plating layer 40a and the second plating layer 40b (hereinafter, also simply referred to as plating layer).

A plurality of plating layers may be provided. In this case, preferably the plating layer has a two-layer structure of an Ni plating layer and an Sn plating layer, for example. The Ni plating layer covers the surface of the underlying electrode layer, which prevents the underlying electrode layer from being eroded by solder in mounting the multilayer ceramic electronic component 10A on a mounting substrate. By providing the Sn plating layer on the surface of the Ni plating layer, wettability of solder is improved to easily mount the multilayer ceramic electronic component 10A.

Preferably, the thickness per layer of the plating layer is in a range of about 1 μm to about 20 μm, for example. Preferably, the plating layer does not include glass. Preferably, in the plating layer, a ratio of metal per unit volume is greater than or equal to about 99 vol %, for example.

The case in which the first underlying electrode layer 38a and the second underlying electrode layer 38b are defined by a plating electrode will be described below. The first underlying electrode layer 38a is defined by a plating layer directly connected to the internal electrode 28, is directly disposed on the surface of the first end surface 24e of the first laminated body 24, extends from the first end surface 24e, and covers a portion of each of the first main surface 24a, the second main surface 24b, the first side surface 24c, and the second side surface 24d.

The second underlying electrode layer 38b is defined by the plating layer directly connected to the internal electrode 28, is directly disposed on the surface of the second end surface 24f of the first laminated body 24, extends from the second end surface 24f, and covers a portion of each of the first main surface 24a, the second main surface 24b, the first side surface 24c, and the second side surface 24d.

However, a catalyst is provided on the first laminated body 24 as a pretreatment in order that the first underlying electrode layer 38a and the second underlying electrode layer 38b are defined by the plating layer.

Preferably, the first underlying electrode layer 38a defined by the plating layer is covered with the first plating layer 40a. Similarly, preferably, the second underlying electrode layer 38b defined by the plating layer is covered with the second plating layer 40b.

Preferably, for example, the first underlying electrode layer 38a, the second underlying electrode layer 38b, the first plating layer 40a, and the second plating layer 40b include at least one metal selected from Cu, Ni, Sn, Pb, Au, Ag, Pd, Bi, and Zn or an alloy including the selected metal.

The first plating layer 40a and the second plating layer 40b are provided as necessary, and the first external electrode 34a may be defined by only the first underlying electrode layer 38a, and the second external electrode 34b may be defined by only the second underlying electrode layer 38b. The first plating layer 40a and the second plating layer 40b may be provided as outermost layers of the first external electrode 34a and the second external electrode 34b, and another plating layer may be provided on the first plating layer 40a or the second plating layer 40b.

Preferably, the thickness per plating layer is in a range from about 1 µm to about 15 µm, for example. Preferably, the plating layer does not include glass. Preferably, in the plating layer, a ratio of metal per unit volume is greater than or equal to about 99 vol %, for example.

Figure 9:
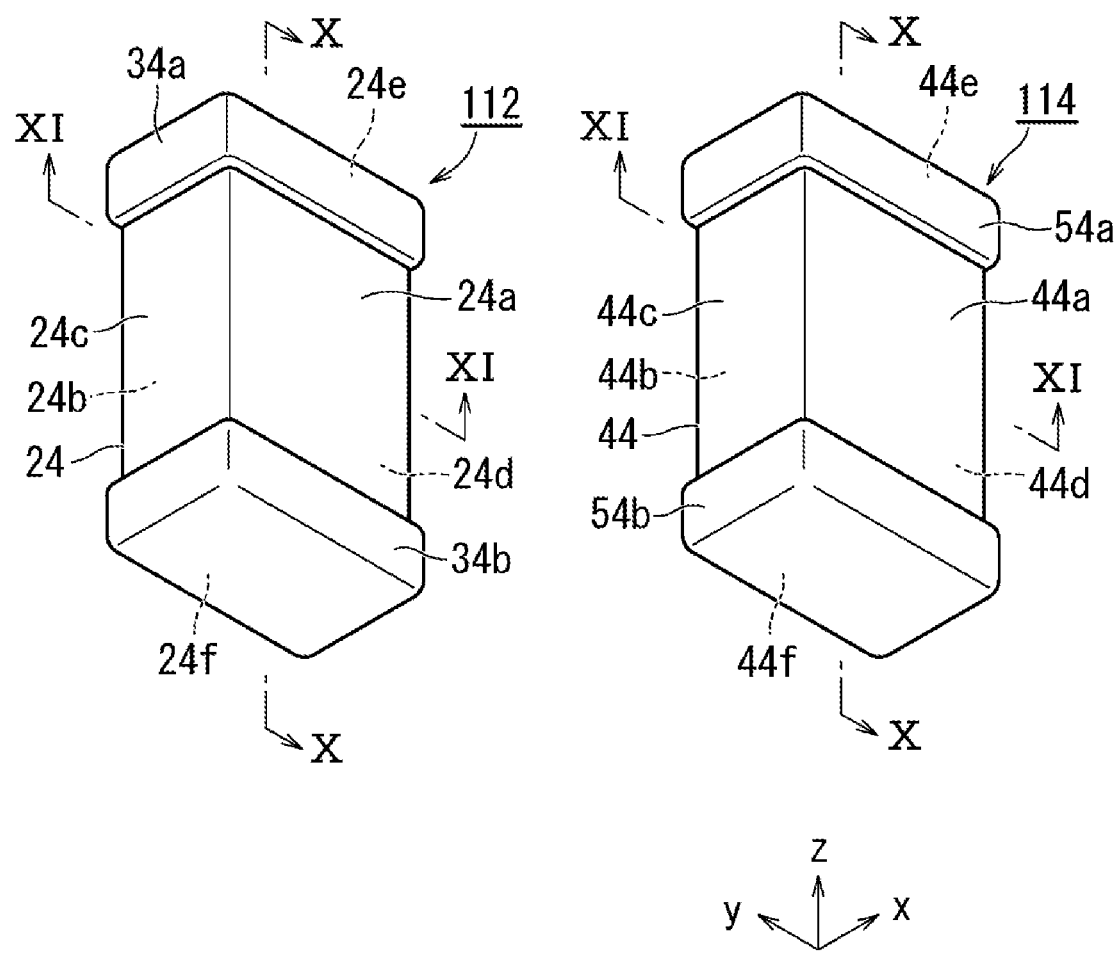
FIG. 9 is an external perspective view illustrating another example of the multilayer ceramic electronic component body in FIG. 1.

A first multilayer ceramic electronic component body 112 in FIG. 9 is provided as another example of the first multilayer ceramic electronic component body 12 according to a preferred embodiment in FIG. 1. The structure of the first multilayer ceramic electronic component body 112 is the same as or similar to that of the first multilayer ceramic electronic component body 12, except for the internal electrode. Thus, the same or similar portions as those of the first laminated ceramic electronic component body 12 are denoted by the same reference numerals, and the description thereof is omitted.

Figure 10:
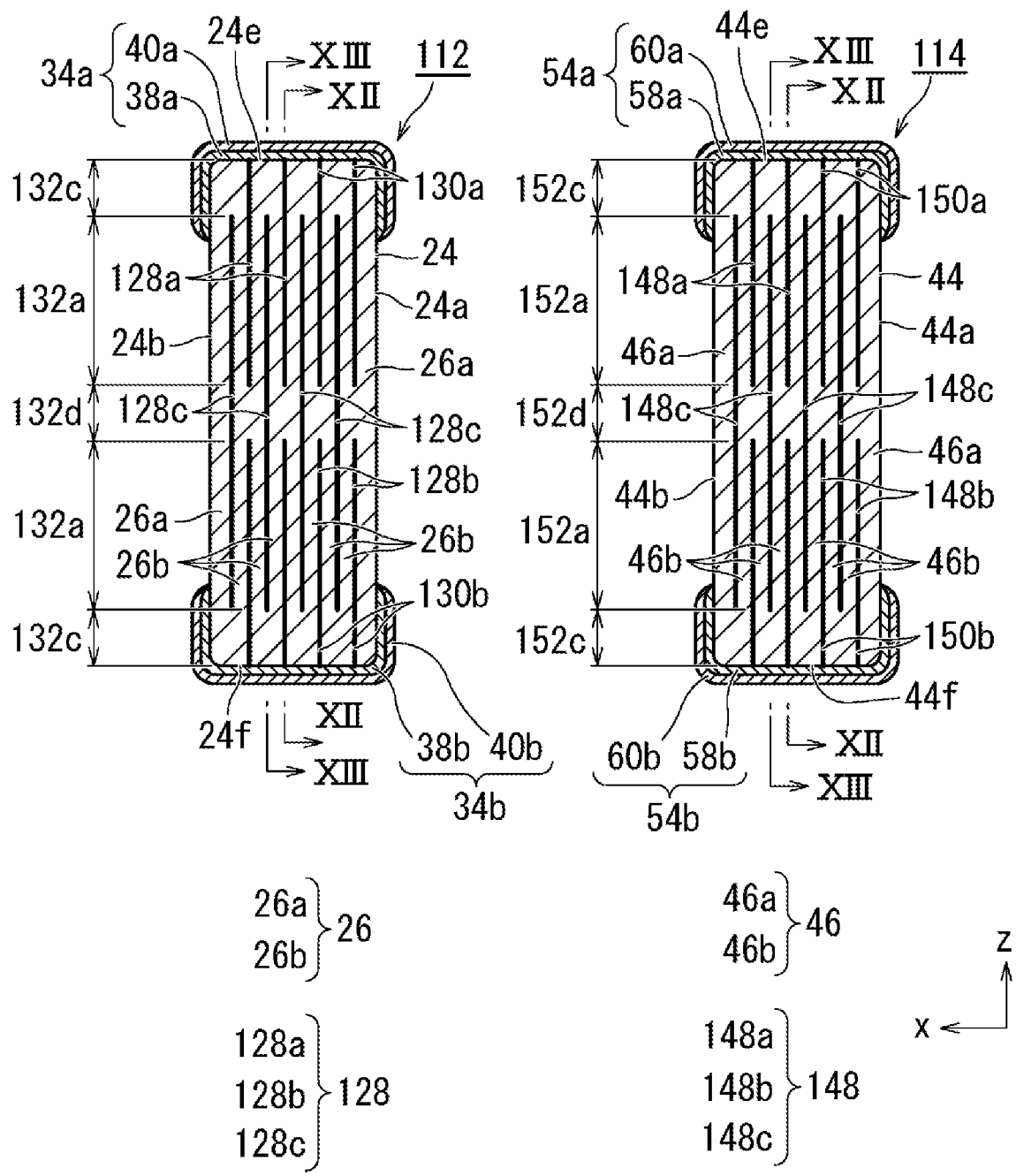
FIG. 10 is a cross-sectional view taken along line X-X in FIG. 9.
Figure 11:
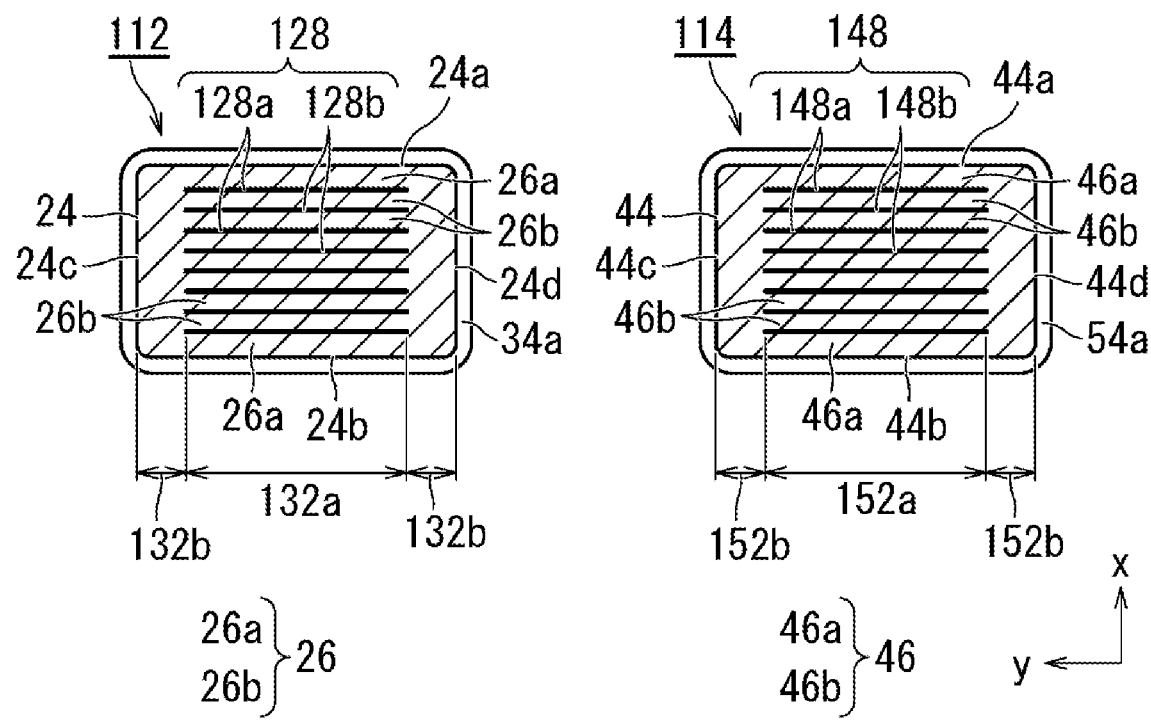
FIG. 11 is a cross-sectional view taken along line XI-XI in FIG. 9.
Figure 12:
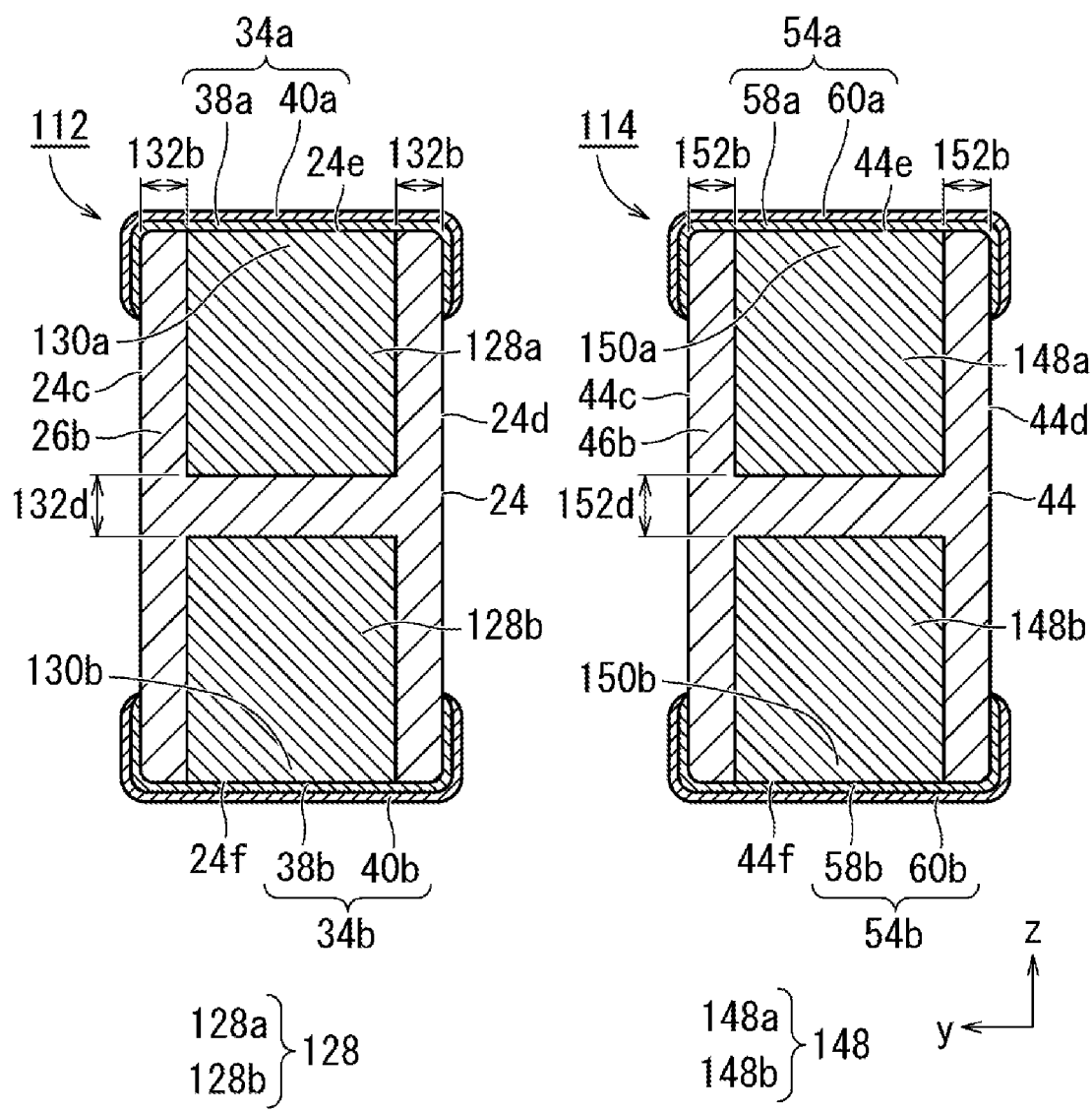
FIG. 12 is a cross-sectional view taken along line XII-XII in FIG. 10.
Figure 13:
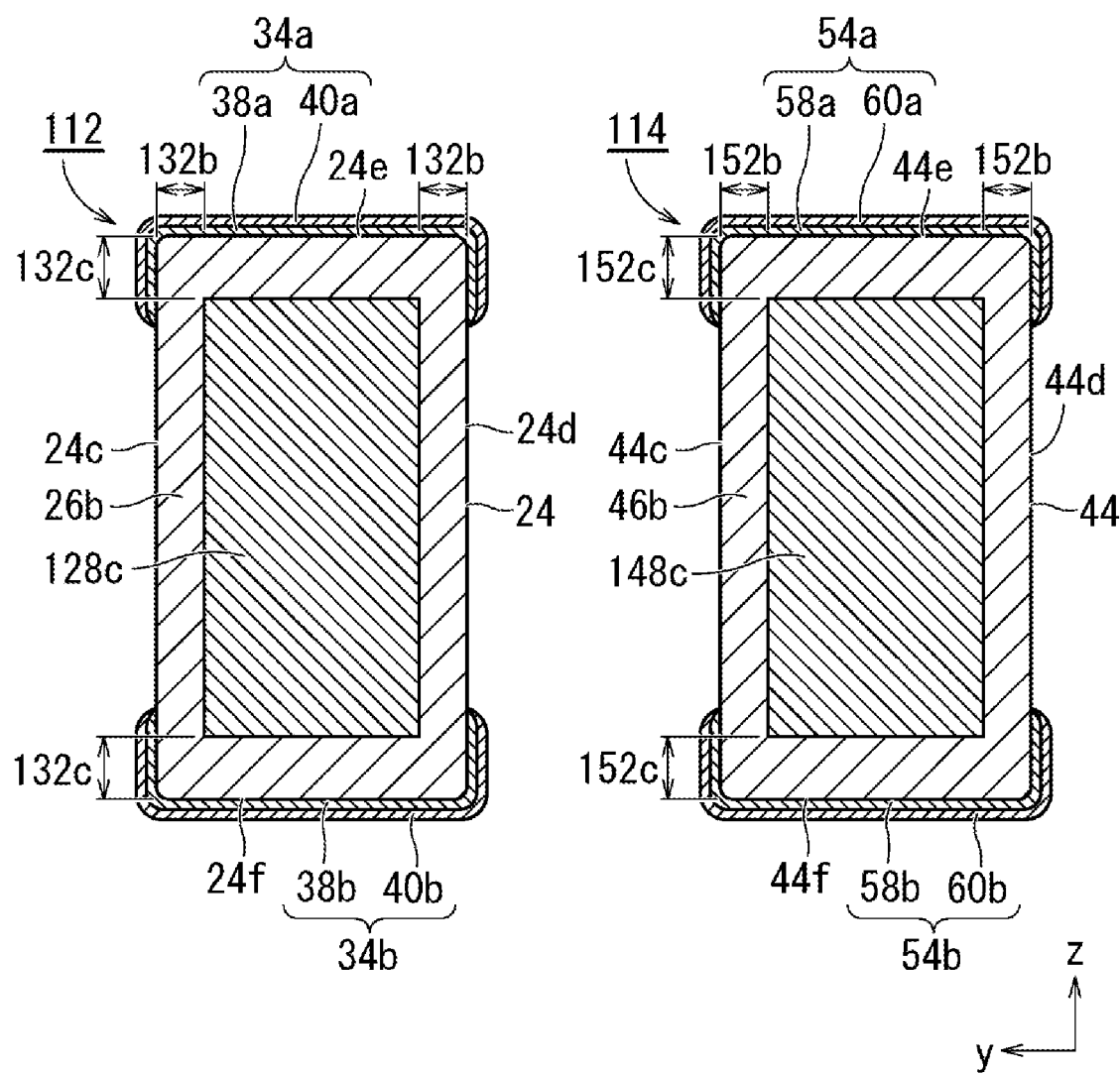
FIG. 13 is a cross-sectional view taken along line XIII-XIII in FIG. 10.

FIG. 9 is an external perspective view of the multilayer ceramic electronic component body 112. FIG. 10 is a cross-sectional view taken along line X-X in FIG. 9. FIG. 11 is a cross-sectional view taken along line XI-XI in FIG. 9. FIG. 12 is a cross-sectional view taken along line XII-XII in FIG. 10. FIG. 13 is a cross-sectional view taken along line XIII-XIII in FIG. 10.

The first multilayer ceramic electronic component body 112 includes two capacitors connected in series in the first laminated body 24.

As illustrated in FIG. 10, the first laminated body 24 of the first multilayer ceramic electronic component body 112 includes a fifth internal electrode 128a connected to the first external electrode 34a, a sixth internal electrode 128b, which is located on the same dielectric layer 26 as the fifth internal electrode 128a and connected to the second external electrode 34b while being spaced away from the fifth internal electrode 128a by a predetermined interval 132d, and a seventh internal electrode 128c, which is located on a dielectric layer 26 different from the dielectric layer 26 on which the fifth internal electrode 128a and the sixth internal electrode 128b are located. The fifth internal electrode 128a, the sixth internal electrode 128b, and the seventh internal electrode 128c are buried so as to be alternately arranged at equal or substantially equal intervals along the lamination direction x of the first laminated body 24.

A fifth extended electrode portion 130a led out to the first end surface 24e of the first laminated body 24 is provided on one end side of the fifth internal electrode 128a. A sixth extended electrode portion 130b led out to the second end surface 24f of the first laminated body 24 is provided on one end side of the sixth internal electrode 128b. Specifically, the fifth extended electrode portion 130a on one end side of the fifth internal electrode 128a is exposed on the first end surface 24e of the first laminated body 24, and connected to the first external electrode 34a. The sixth extended electrode portion 130b on one end side of the sixth internal electrode 128b is exposed on the second end surface 24f of the first laminated body 24, and connected to the second external electrode 34b.

The seventh internal electrode 128c does not include an extended electrode portion, and is not exposed on the surface of the first laminated body 24. Thus, the seventh internal electrode 128c is connected to neither the first external electrode 34a nor the second external electrode 34b.

The seventh internal electrode 128c is opposed to a portion of the fifth internal electrode 128a and a portion of the sixth internal electrode 128b. That is, in the first laminated body 24, opposed electrode portions 132a are provided in a portion in which a portion of the fifth internal electrode 128a is opposed to the seventh internal electrode 128c with the dielectric layer 26 interposed therebetween and a portion in which a portion of the sixth internal electrode 128b is opposed to the seventh internal electrode 128c with the dielectric layer 26 interposed therebetween. In the case in which the first multilayer ceramic electronic component body 112 is a capacitor, the electrostatic capacitance is produced in each of the two opposed electrode portions 132a.

The first laminated body 24 includes W gaps 132b between one end in the width direction y of the opposed electrode portion 132a and the first side surface 24c and between the other end in the width direction y of the opposed electrode portion 132a and the second side surface 24d. The first laminated body 24 includes L gaps 132c between one end of the seventh internal electrode 128c and the first end surface 24e and between the other end of the seventh internal electrode 128c and the second end surface 24f.

In the first laminated body 24, the internal electrode 128 may be disposed so as to be parallel or substantially parallel to the sheet-shaped insulator 22 (opposed to the insulator 22), or the internal electrode 128 may be disposed so as to be orthogonal or substantially orthogonal to the insulator 22.

In the case in which the first multilayer ceramic electronic component body 112 is a capacitor, in the first laminated body 24, in each opposed electrode portion 132a, the fifth internal electrode 128a and the seventh internal electrode 128c are opposed to each other with the dielectric layer 26 interposed therebetween, and the sixth internal electrode 128b and the seventh internal electrode 128c are opposed to each other with the dielectric layer 26 interposed therebetween, thus producing the electrostatic capacitance. Consequently, in the first multilayer ceramic electronic component body 112, the two capacitors are connected in series between the first external electrode 34a and the second external electrode 34b. For this reason, the voltage applied to each capacitor is decreased, so that the internal withstand voltage is able to be further increased.

Figure 14:
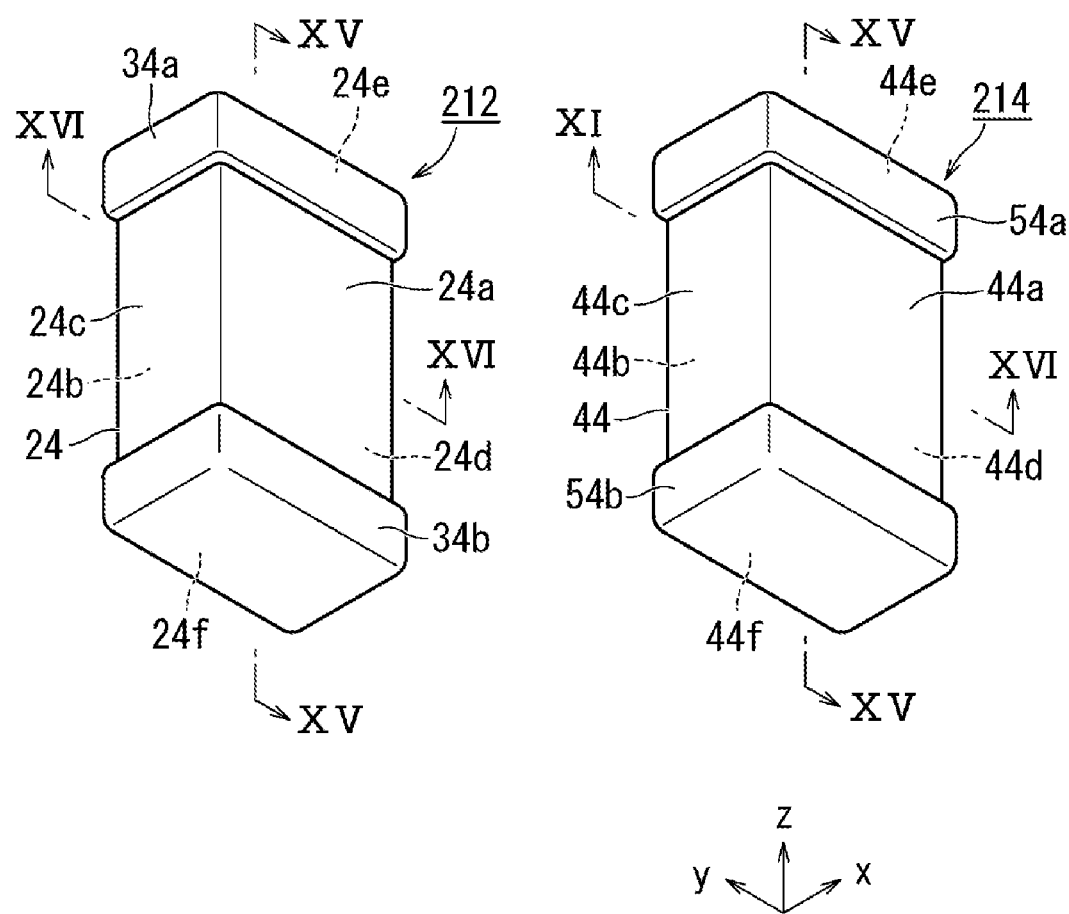
FIG. 14 is an external perspective view illustrating still another example of the multilayer ceramic electronic component body in FIG. 1.

A first multilayer ceramic electronic component body 212 in FIG. 14 is provided as still another example of the first multilayer ceramic electronic component body 12 in FIG. 1. The structure of the first multilayer ceramic electronic component body 212 is the same as or similar to that of the first multilayer ceramic electronic component body 12, except for the internal electrode. Thus, the same as or similar portions as those of the first laminated ceramic electronic component body 12 are denoted by the same reference numerals, and the description thereof is omitted.

Figure 15:
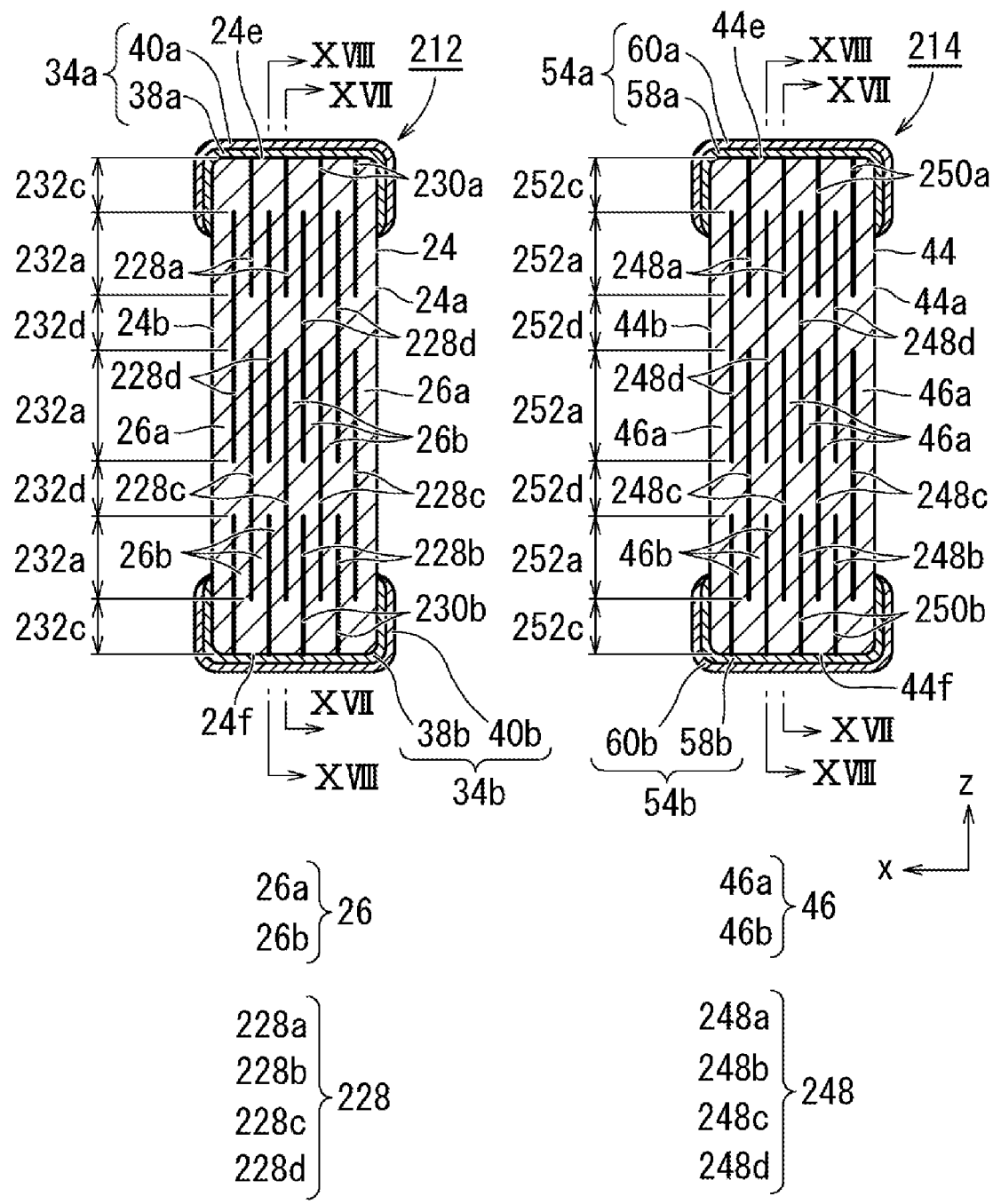
FIG. 15 is a cross-sectional view taken along line XV-XV in FIG. 14.
Figure 16:
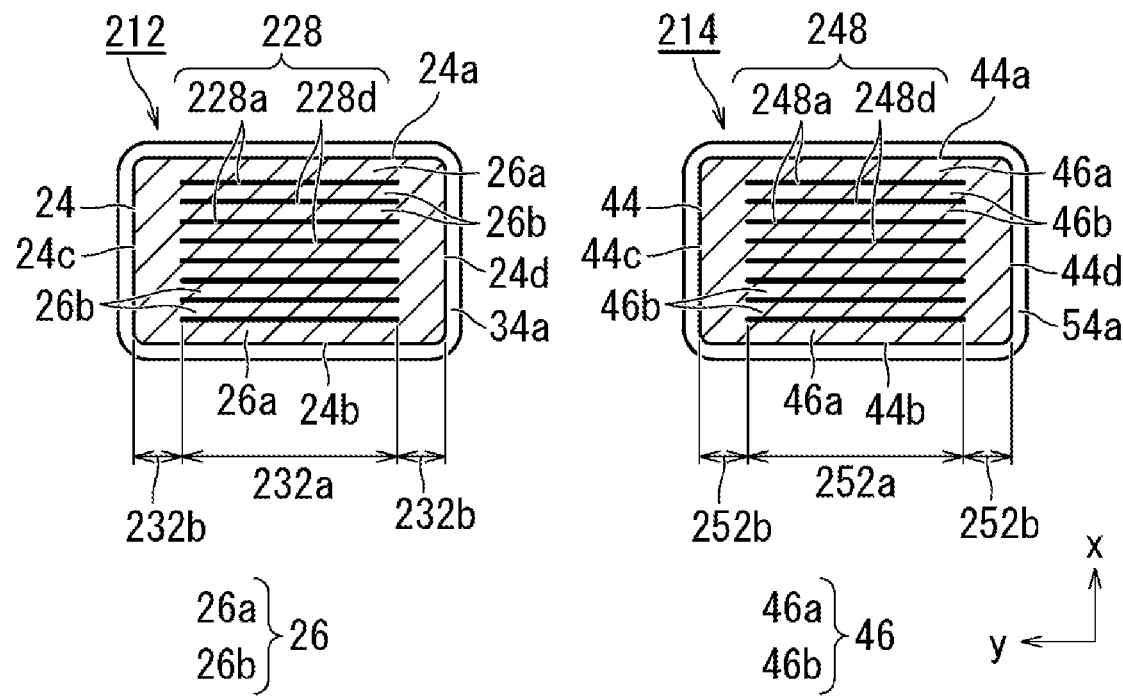
FIG. 16 is a cross-sectional view taken along line XVI-XVI in FIG. 14.
Figure 17:
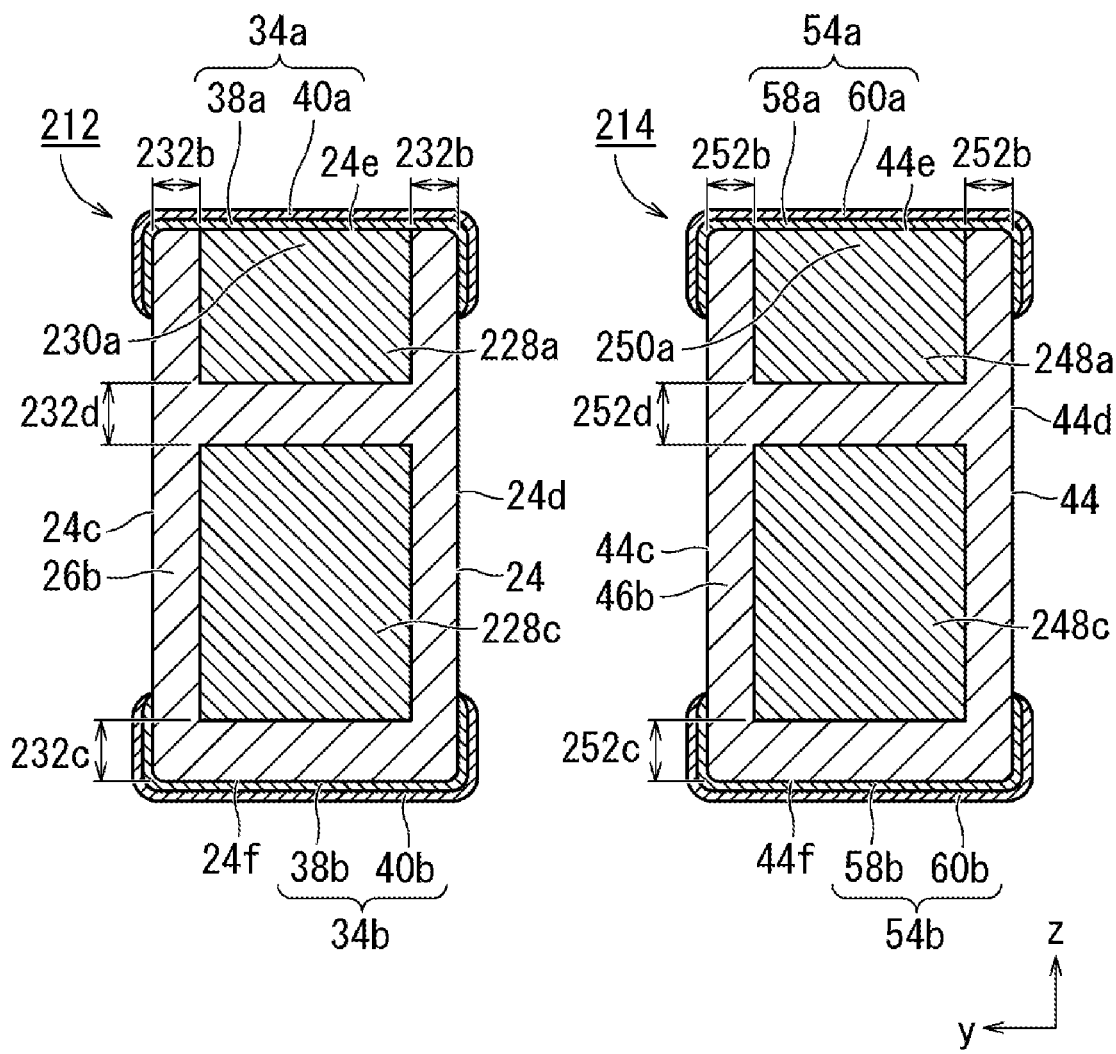
FIG. 17 is a cross-sectional view taken along line XVII-XVII in FIG. 15.
Figure 18:
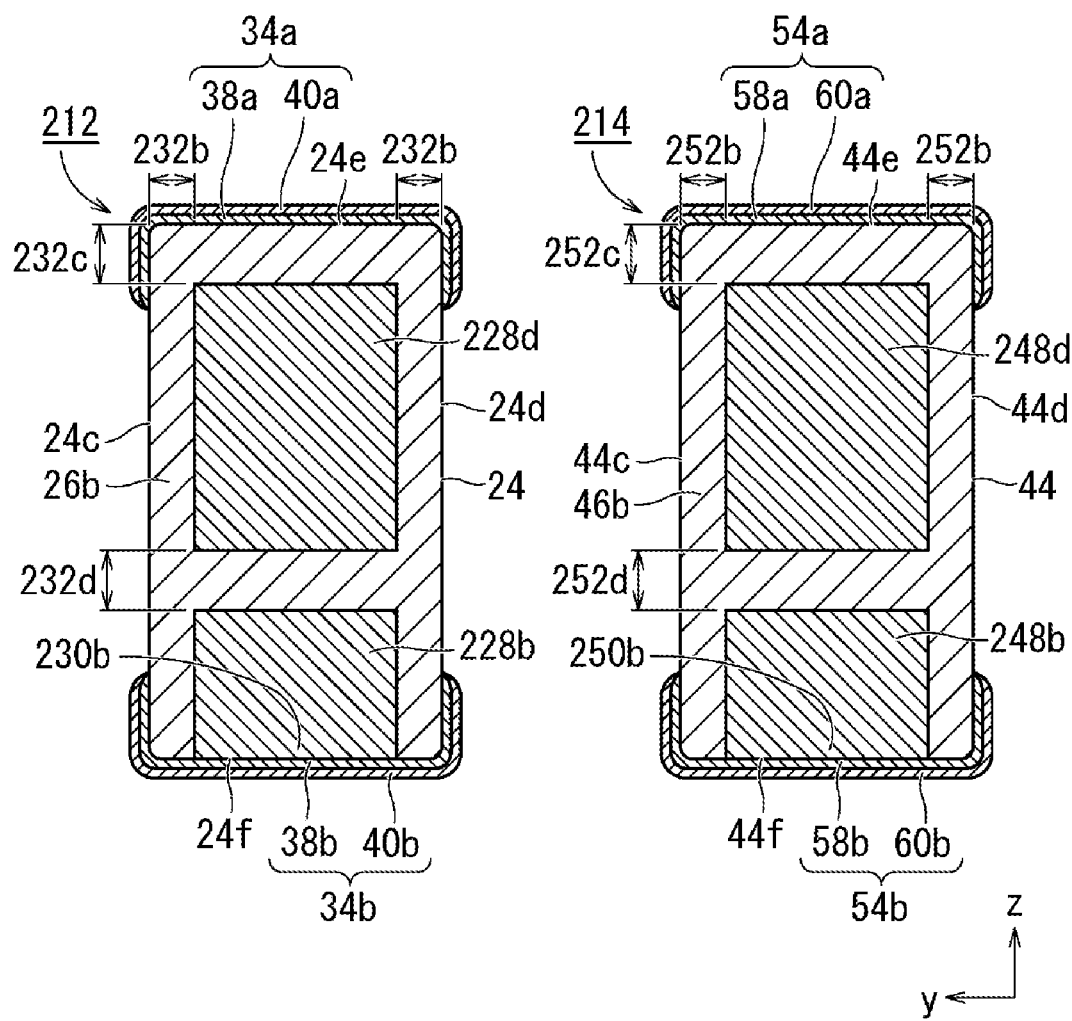
FIG. 18 is a cross-sectional view taken along line XVIII-XVIII in FIG. 15.

FIG. 14 is an external perspective view illustrating the multilayer ceramic electronic component body 212. FIG. 15 is a cross-sectional view taken along line XV-XV in FIG. 14. FIG. 16 is a cross-sectional view taken along line XVI-XVI in FIG. 14. FIG. 17 is a cross-sectional view taken along line XVII-XVII in FIG. 15. FIG. 18 is a cross-sectional view taken along line XVIII-XVIII in FIG. 15.

The first multilayer ceramic electronic component body 212 includes at least three and odd-numbered capacitors that are connected in series in the first laminated body 24.

As illustrated in FIG. 15, the first laminated body 24 of the first multilayer ceramic electronic component body 212 includes an eleventh internal electrode 228a connected to the first external electrode 34a, a twelfth internal electrode 228b on a dielectric layer 26 different from the dielectric layer 26 on which the eleventh internal electrode 228a is located and connected to the second external electrode 34b, at least one thirteenth internal electrode 228c on the same dielectric layer 26 as the eleventh internal electrode 228a and spaced away from the eleventh internal electrode 228a by a predetermined interval 232d, and at least one fourteenth internal electrode 228d on the same dielectric layer 26 as the twelfth internal electrode 228b and spaced away from the twelfth internal electrode 228b by the predetermined interval 232d.

In the case in which at least two thirteenth internal electrodes 228c are provided, the thirteenth internal electrodes 228c are provided on the same dielectric layer 26 at the predetermined interval 232d with the adjacent thirteenth internal electrode 228c in the direction connecting the first external electrode 34a and the second external electrode 34b.

Similarly, in the case in which at least two fourteenth internal electrodes 228d are provided, the fourteenth internal electrodes 228d are provided on the same dielectric layer 26 at the predetermined interval 232d with the adjacent fourteenth internal electrode 228d in the direction connecting the first external electrode 34a and the second external electrode 34b.

The thirteenth internal electrode 228c is opposed to any two of a portion of the twelfth internal electrode 228b, a portion of the fourteenth internal electrode 228d, and a portion of another fourteenth internal electrode 228d, and the fourteenth internal electrode 228d is opposed to any two of a portion of the eleventh internal electrode 228a, a portion of the thirteenth internal electrode 228c, and a portion of another thirteenth internal electrode 228c.

The case in which the first multilayer ceramic electronic component body 212 includes three capacitors that are connected in series in the first laminated body 24 will be described below as an example.

An eleventh extended electrode portion 230a led out to the first end surface 24e of the first laminated body 24 is provided on one end side of the eleventh internal electrode 228a. A twelfth extended electrode portion 230b led out to the second end surface 24f of the first laminated body 24 is provided on one end side of the twelfth internal electrode 228b. Specifically, the eleventh extended electrode portion 230a on one end side of the eleventh internal electrode 228a is exposed on the first end surface 24e of the first laminated body 24, and connected to the first external electrode 34a. The twelfth extended electrode portion 230b on one end side of the twelfth internal electrode 228b is exposed on the second end surface 24f of the first laminated body 24, and connected to the second external electrode 34b.

On the other hand, the thirteenth internal electrode 228c and the fourteenth internal electrode 228d do not include an extended electrode portion, and are not exposed on the surface of the first laminated body 24. Thus, the thirteenth internal electrode 228c and the fourteenth internal electrode 228d are connected to neither the first external electrode 34a nor the second external electrode 34b.

The thirteenth internal electrode 228c is opposed to a portion of the twelfth internal electrode 228b and a portion of the fourteenth internal electrode 228d. The fourteenth internal electrode 228d is opposed to a portion of the eleventh internal electrode 228a and a portion of the thirteenth internal electrode 228c. That is, the first laminated body 24 includes opposed electrode portions 232a in a portion in which a portion of the eleventh internal electrode 228a is opposed to the fourteenth internal electrode 228d with the dielectric layer 26 interposed therebetween, a portion in which a portion of the thirteenth internal electrode 228c is opposed to a portion of the fourteenth internal electrode 228d with the dielectric layer 26 interposed therebetween, and a portion in which a portion of the twelfth internal electrode 228b is opposed to the thirteenth internal electrode 228c with the dielectric layer 26 interposed therebetween. In the case in which the first multilayer ceramic electronic component body 212 is a capacitor, the electrostatic capacitance is produced in each of the three opposed electrode portions 232a.

The first laminated body 24 includes W gaps 232b between one end in the width direction y of the opposed electrode portion 232a and the first side surface 24c and between the other end in the width direction y of the opposed electrode portion 232a and the second side surface 24d. The first laminated body 24 includes the intervals 232d between a leading end of the eleventh internal electrode 228a and one end of the thirteenth internal electrode 228c and between a leading end of the twelfth internal electrode 228b and one end of the fourteenth internal electrode 228d. The first laminated body 24 includes L gaps 232c between the other end of the thirteenth internal electrode 228c and the second end surface 24f and between the other end of the fourteenth internal electrode 228d and the first end surface 24e.

In the first laminated body 24, the internal electrode 228 may be disposed so as to be parallel or substantially parallel to the sheet-shaped insulator 22 (opposed to the insulator 22), or the internal electrode 228 may be disposed so as to be orthogonal or substantially orthogonal to the insulator 22.

In the case in which the first multilayer ceramic electronic component body 212 is a capacitor, in the first laminated body 24, in each opposed electrode portion 232a, the eleventh internal electrode 228a and the fourteenth internal electrode 228d are opposed to each other with the dielectric layer interposed therebetween, the thirteenth internal electrode 228c and the fourteenth internal electrode 228d are opposed to each other with the dielectric layer 26 interposed therebetween, and the twelfth internal electrode 228b and the thirteenth internal electrode 228c are opposed to each other with the dielectric layer 26 interposed therebetween, thus producing the electrostatic capacitance. Consequently, in the first multilayer ceramic electronic component body 212, the three capacitors are connected in series between the first external electrode 34a and the second external electrode 34b. For this reason, the voltage applied to each capacitor is decreased, so that the internal withstand voltage is able to be further increased.

Figure 19:
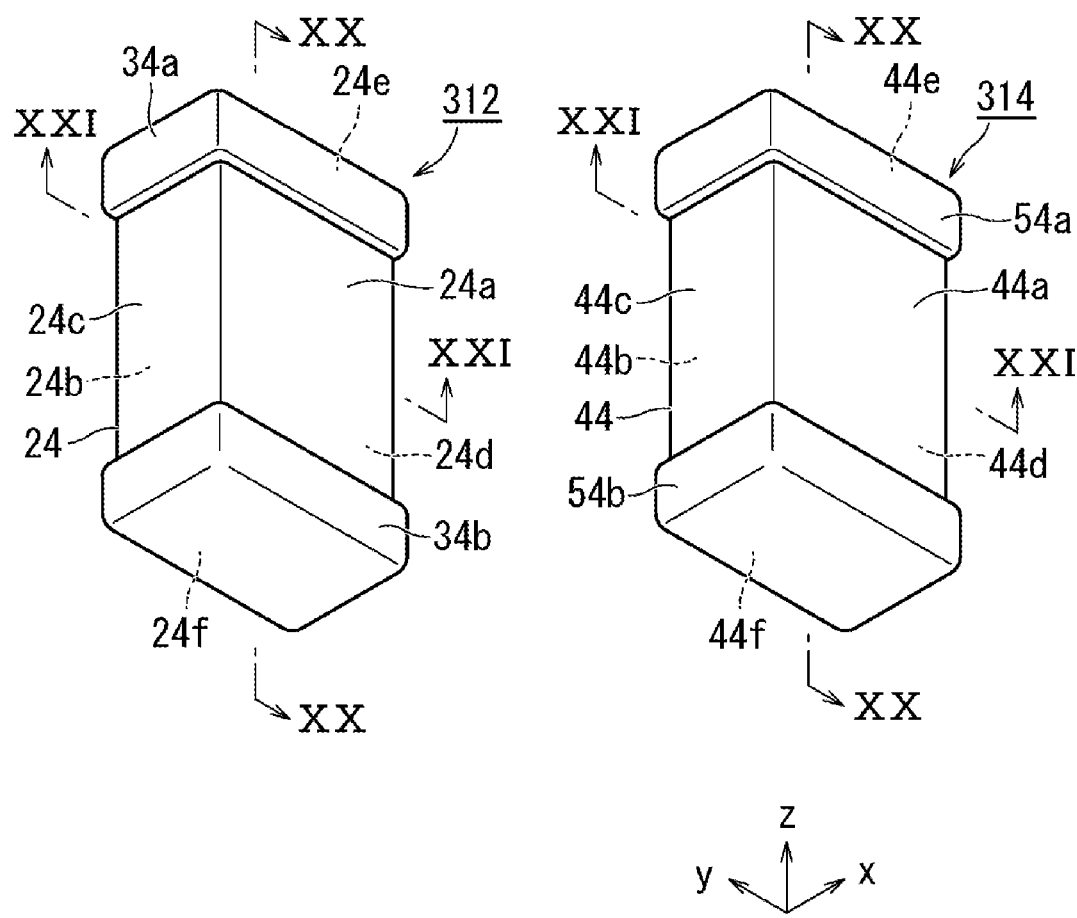
FIG. 19 is an external perspective view illustrating yet another example of the multilayer ceramic electronic component body in FIG. 1.

A first multilayer ceramic electronic component body 312 in FIG. 19 is provided as a yet another example of the first multilayer ceramic electronic component body 12 in FIG. 1. The structure of the first multilayer ceramic electronic component body 312 is the same as or similar to that of the first multilayer ceramic electronic component body 12 except for the internal electrode. Thus, the same or similar portions as those of the first laminated ceramic electronic component body 12 are denoted by the same reference numerals, and the description thereof is omitted.

Figure 20:
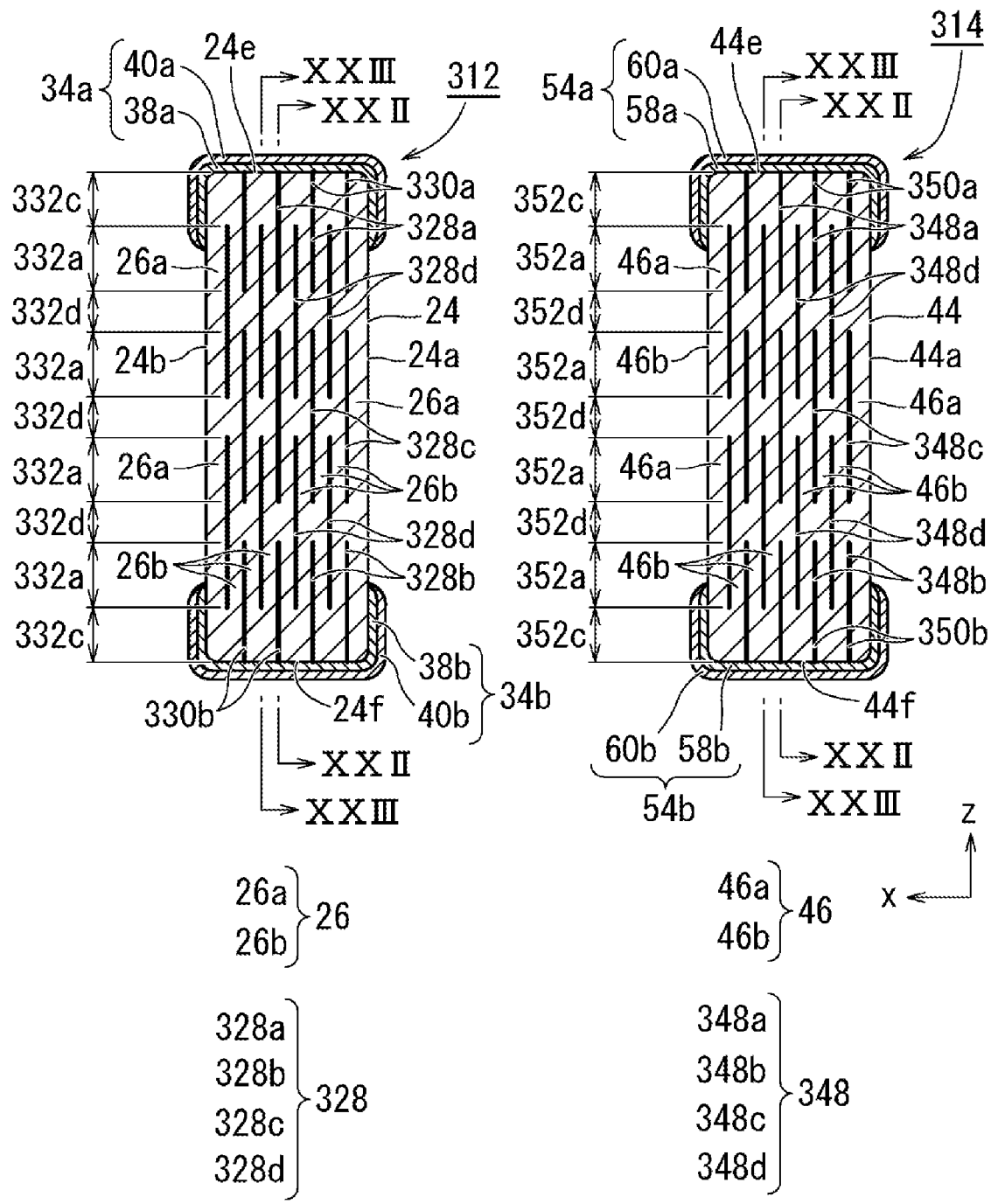
FIG. 20 is a cross-sectional view taken along line XX-XX in FIG. 19.
Figure 21:
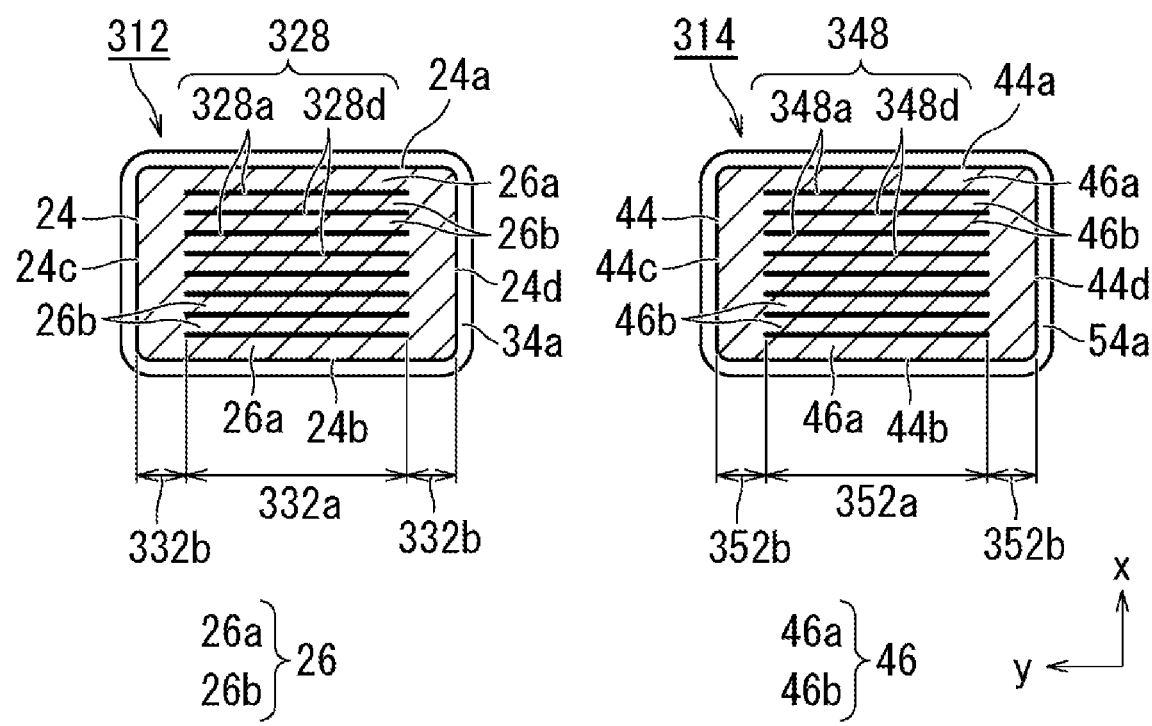
FIG. 21 is a cross-sectional view taken along line XXI-XXI in FIG. 19.
Figure 22:
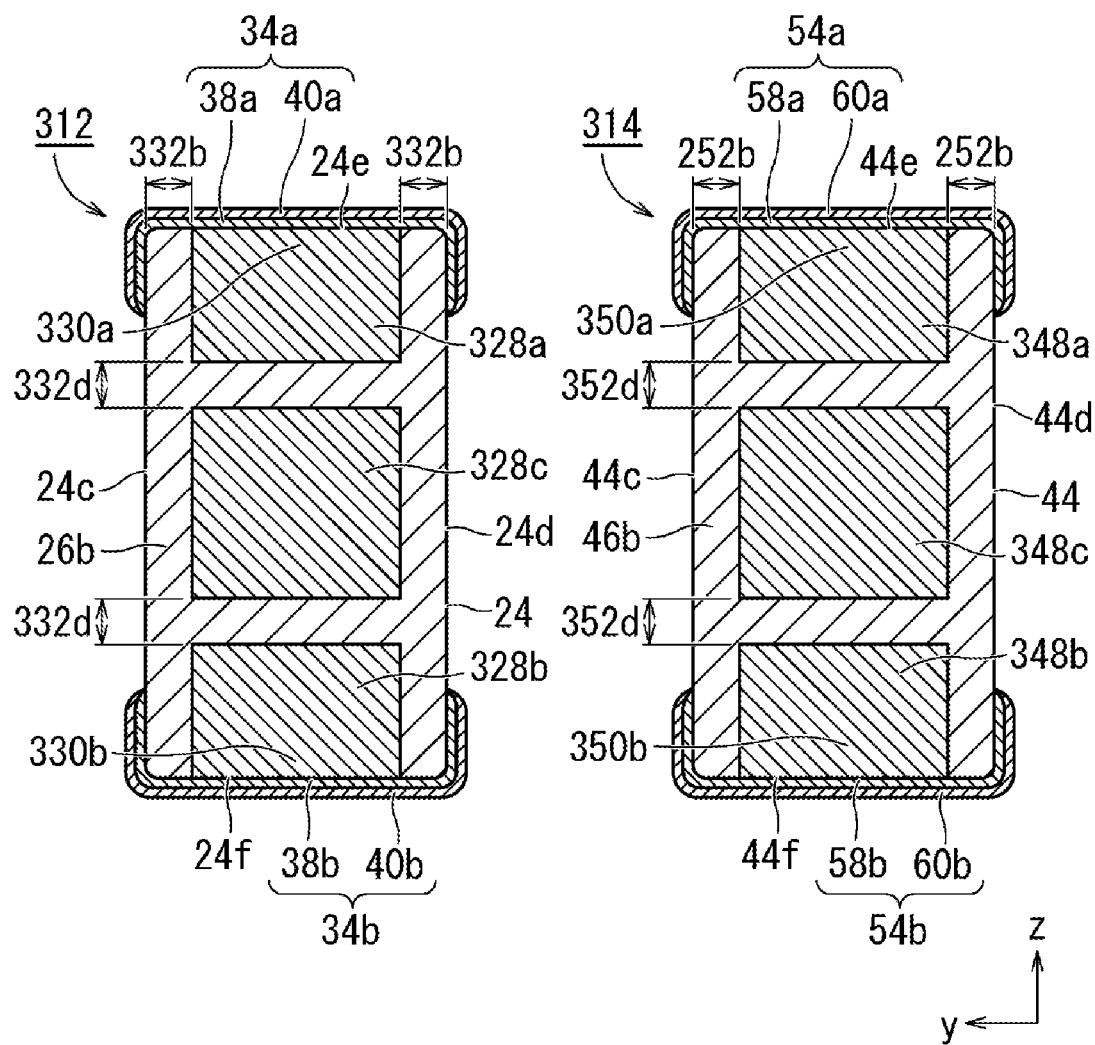
FIG. 22 is a cross-sectional view taken along line XXII-XXII in FIG. 20.
Figure 23:
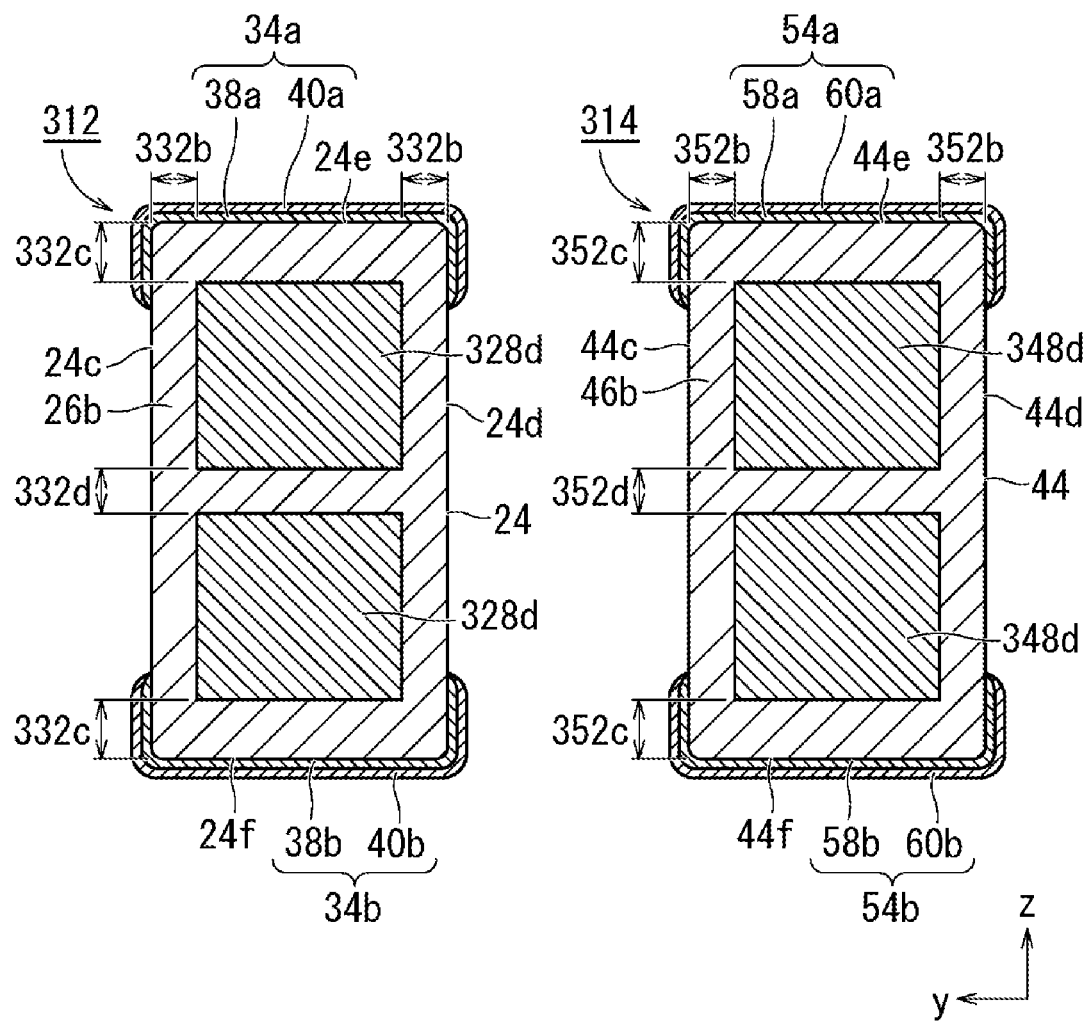
FIG. 23 is a cross-sectional view taken along line XXIII-XXIII in FIG. 20.

FIG. 19 is an external perspective view of the multilayer ceramic electronic component body 312. FIG. 20 is a cross-sectional view taken along line XX-XX in FIG. 19. FIG. 21 is a cross-sectional view taken along line XXI-XXI in FIG. 19. FIG. 22 is a cross-sectional view taken along line XXII-XXII in FIG. 20. FIG. 23 is a cross-sectional view taken along line XXIII-XXIII in FIG. 20.

The first multilayer ceramic electronic component body 312 includes at least four and even-numbered capacitors that are connected in series in the first laminated body 24.

As illustrated in FIG. 20, the first laminated body 24 of the first multilayer ceramic electronic component body 312 includes a nineteenth internal electrode 328a connected to the first external electrode 34a, a twentieth internal electrode 328b on the same dielectric layer 26 as the nineteenth internal electrode 328a and connected to the second external electrode 34b, at least one twenty-first internal electrode 328c on the same dielectric layer 26 as the nineteenth internal electrode 328a and twentieth internal electrode 328b and separated between the nineteenth internal electrode 328a and the twentieth internal electrode 328b at a predetermined interval 332d, and at least two twenty-second internal electrodes 328d on a dielectric layer 26 different from the dielectric layer 26 on which the nineteenth internal electrode 328a and the twentieth internal electrode 328b are located.

In the case in which at least two twenty-first internal electrodes 328c are provided, the twenty-first internal electrodes 328c are provided on the same dielectric layer 26 at the predetermined interval 332d with the adjacent twenty-first internal electrode 328c in the direction connecting the first external electrode 34a and the second external electrode 34b.

The at least two twenty-second internal electrodes 328d are provided on the same dielectric layer 26 at the predetermined interval 332d with the adjacent twenty-second internal electrode 328d in the direction connecting the first external electrode 34a and the second external electrode 34b.

The twenty-first internal electrode 328c is opposed to a portion of the twenty-second internal electrode 328d and a portion of another twenty-second internal electrode 328d. The twenty-second internal electrode 328d is opposed to any two of a portion of the nineteenth internal electrode 328a, a portion of the twentieth internal electrode 328b, a portion of the twenty-first internal electrode 328c, and a portion of another twenty-first internal electrodes 328c.

The case in which the first multilayer ceramic electronic component body 312 includes four capacitors that are connected in series in the first laminated body 24 will be described below as an example.

A nineteenth extended electrode portion 330a led out to the first end surface 24e of the first laminated body 24 is provided on one end side of the nineteenth internal electrode 328a. A twentieth extended electrode portion 330b led out to the second end surface 24f of the first laminated body 24 is provided on one end side of the twentieth internal electrode 328b. Specifically, the nineteenth extended electrode portion 330a on one end side of the nineteenth internal electrode 328a is exposed on the first end surface 24e of the first laminated body 24, and connected to the first external electrode 34a. The twentieth extended electrode portion 330b on one end side of the twentieth internal electrode 328b is exposed on the second end surface 24f of the first laminated body 24, and connected to the second external electrode 34b.

The twenty-first internal electrode 328c and the twenty-second internal electrode 328d do not include an extended electrode portion, and are not exposed on the surface of the first laminated body 24. Thus, the twenty-first internal electrode 328c and the twenty-second internal electrode 328d are connected to neither the first external electrode 34a nor the second external electrode 34b.

The twenty-second internal electrode 328d close to the first end surface 24e is opposed to a portion of the nineteenth internal electrode 328a and a portion of the twenty-first internal electrode 328c. The twenty-second internal electrode 328d close to the second end surface 24f is opposed to a portion of the twentieth internal electrode 328b and a portion of the twenty-first internal electrode 328c. The twenty-first internal electrode 328c is opposed to a portion of the twenty-second internal electrode 328d and a portion of another twenty-second internal electrodes 328d. That is, the first laminated body 24 includes opposed electrode portions 332a in a portion in which a portion of the nineteenth internal electrode 328a is opposed to a portion of the twenty-second internal electrode 328d with the dielectric layer 26 interposed therebetween, a portion in which a portion of the twenty-second internal electrode 328d is opposed to a portion of the twenty-first internal electrode 328c with the dielectric layer 26 interposed therebetween, a portion in which a portion of another twenty-second internal electrode 328d is opposed to the portion of the twenty-first internal electrode 328c with the dielectric layer 26 interposed therebetween, and a portion in which a portion of the twentieth internal electrode 328b is opposed to a portion of the another twenty-second internal electrode 328d with the dielectric layer 26 interposed therebetween. In the case in which the first multilayer ceramic electronic component body 312 is a capacitor, the electrostatic capacitance is produced in each of the four opposed electrode portions 332a.

The first laminated body 24 includes W gaps 332b between one end in the width direction y of the opposed electrode portion 332a and the first side surface 24c and between the other end in the width direction y of the opposed electrode portion 332a and the second side surface 24d. The first laminated body 24 includes the intervals 332d between the leading end of the nineteenth internal electrode 328a and one end of the twenty-first internal electrode 328c, between the leading end of the twentieth internal electrode 328b and the other end of the twenty-first internal electrode 328c, and between one end of the twenty-second internal electrode 328d and one end of another twenty-second internal electrode 328d. The first laminated body 24 includes L gaps 332c between the other end of the twenty-second internal electrode 328d and the first end surface 24e and between the other end of the twenty-second internal electrode 328d and the second end surface 24f.

In the first laminated body 24, the internal electrode 328 may be disposed so as to be parallel or substantially parallel to the sheet-shaped insulator 22 (opposed to the insulator 22), or the internal electrode 328 may be disposed so as to be orthogonal or substantially orthogonal to the insulator 22.

In the case in which the first multilayer ceramic electronic component body 312 is a capacitor, in the first laminated body 24, in each opposed electrode portion 332a, the nineteenth internal electrode 328a and the twenty-second internal electrode 328d are opposed to each other with the dielectric layer 26 interposed therebetween, the twenty-second internal electrode 328d and the twenty-first internal electrode 328c are opposed to each other with the dielectric layer 26 interposed therebetween, the twentieth internal electrode 328b and another twenty-second twelve internal electrodes 328d are opposed to each other with the dielectric layer 26 interposed therebetween, and the another twenty-second internal electrode 328d and the twentieth internal electrode 328b are opposed to each other with the dielectric layer interposed therebetween, thus producing the electrostatic capacitance. Consequently, in the first multilayer ceramic electronic component body 312, the four capacitors are connected in series between the first external electrode 34a and the second external electrode 34b. For this reason, the voltage applied to each capacitor is decreased, so that the internal withstand voltage is able to be further increased.

The second multilayer ceramic electronic component body 14 has the same or substantially the same configuration as the first multilayer ceramic electronic component body 12, and the same or similar portions as those of the first multilayer ceramic electronic component body 12 are denoted by the same reference numerals, and the detailed description thereof is omitted.

As illustrated in FIGS. 5 to 8, the second laminated body 44 includes a plurality of laminated dielectric layers 46 and a plurality of laminated internal electrodes 48. The second laminated body 44 includes a third main surface 44a and a fourth main surface 44b, which are opposed to each other in the lamination direction x, a third side surface 44c and a fourth side surface 44d, which are opposite to each other in the width direction y orthogonal or substantially orthogonal to the lamination direction x, and a third end surface 44e and a fourth end surface 44f, which are opposed to each other in the length direction z orthogonal or substantially orthogonal to the lamination direction x and the width direction y.

The second laminated body 44 includes an outer layer 46a including a plurality of dielectric layers 46, and an inner layer 46b including one or more of dielectric layers 46 and a plurality of internal electrodes 48 disposed on one or more of the dielectric layers 46. The outer layer 46a is located on the sides of the third main surface 44a and the fourth main surface 44b of the second laminated body 44, and includes the plurality of dielectric layers 46 located between the third main surface 44a and the internal electrode 48 closest to the third main surface 44a and the plurality of dielectric layers 46 located between the fourth main surface 44b and the internal electrode 48 closest to the fourth main surface 44b. A region sandwiched between both of the outer layers 46a is the inner layer 46b. In other words, the inner layer 46b includes the internal electrode 48, and the outer layer 46a does not include the internal electrode 48.

As illustrated in FIG. 6, the second laminated body 44 includes a plurality of rectangular or substantially rectangular third internal electrodes 48a and a plurality of rectangular or substantially rectangular fourth internal electrodes 48b. The plurality of third internal electrodes 48a and the plurality of fourth internal electrodes 48b are buried so as to be alternately arranged at equal intervals along the lamination direction x of the second laminated body 44.

A third extended electrode portion 50a led out to the third end surface 44e of the second laminated body 44 is provided on one end side of the third internal electrode 48a. A fourth extended electrode portion 50b led out to the fourth end surface 44f of the second laminated body 44 is provided on one end side of the fourth internal electrode 48b. Specifically, the third extended electrode portion 50a on one end side of the third internal electrode 48a is exposed on the third end surface 44e of the second laminated body 44. The fourth extended electrode portion 50b on one end side of the fourth internal electrode 48b is exposed on the fourth end surface 44f of the second laminated body 44.

The second laminated body 44 includes an opposed electrode portion 52a in which the third internal electrode 48a and the fourth internal electrode 48b are opposed to each other with the dielectric layer 46 interposed therebetween in the inner layer 46b of the dielectric layer 46. In the case in which the second multilayer ceramic electronic component body 14 is a capacitor, the electrostatic capacitance is produced in the opposed electrode portion 52a.

The second laminated body 44 includes side portions (hereinafter, referred to as "W gaps") 52b of the second laminated body 44, and the W gaps 52b between one end in the width direction y of the opposed electrode portion 52a and the third side surface 44c and between the other end in the width direction y of the opposed electrode portion 52a and the fourth side surface 44d. The second laminated body 44 includes ends (hereinafter, referred to as "L gaps") 52c of the second laminated body 44, and the L gaps 52c are between an end of the third internal electrode 48a on the side opposite to the third extended electrode portion 50a and the fourth end surface 44f and between an end of the fourth internal electrode 48b on the side opposite to the fourth extended electrode portion 50b and the third end surface 44e.

In the second laminated body 44, the internal electrode 48 may be disposed so as to be parallel or substantially parallel to the sheet-shaped insulator 22 (opposed to the insulator 22), or the internal electrode 48 may be disposed so as to be orthogonal or substantially orthogonal to the insulator 22. In the first preferred embodiment, the internal electrode 48 is preferably disposed so as to be parallel or substantially parallel to the insulator 22.

The third external electrode 54a is disposed on the side of the third end surface 44e of the second laminated body 44, and the fourth external electrode 54b is disposed on the side of the fourth end surface 44f.

The third external electrode 54a is disposed on the surface of the third end surface 44e of the second laminated body 44, extends from the third end surface 44e, and covers a portion of each of the third main surface 44a, the fourth main surface 44b, the third side surface 44c, and the fourth side surface 44d. In this case, the third external electrode 54a is electrically connected to the third extended electrode portion 50a of the third internal electrode 48a. Alternatively, the third external electrode 54a may be disposed only on the surface of the third end surface 44e of the second laminated body 44.

The fourth external electrode 54b is disposed on the surface of the fourth end surface 44f of the second laminated body 44, extends from the fourth end surface 44f, and covers a portion of the third main surface 44a, the fourth main surface 44b, the third side surface 44c, and the fourth side surface 44d. In this case, the fourth external electrode 54b is electrically connected to the fourth extended electrode portion 50b of the fourth internal electrode 48b. Alternatively, the fourth external electrode 54b may be disposed only on the surface of the fourth end surface 44f of the second laminated body 44.

In the case in which the second multilayer ceramic electronic component body 14 is a capacitor, in the second laminated body 44, the third internal electrode 48a and the fourth internal electrode 48b are opposed to each other with the dielectric layer 46 interposed therebetween in each opposed electrode portions 52a, thus producing the electrostatic capacitance. For this reason, the electrostatic capacitance is able to be obtained between the third external electrode 54a to which the third internal electrode 48a is connected and the fourth external electrode 54b to which the fourth internal electrode 48b is connected. That is, the second multilayer ceramic electronic component body 14 includes one capacitor in the second laminated body 44.

As illustrated in FIG. 6, the third external electrode 54a includes a third underlying electrode layer 58a and a third plating layer 60a disposed on the surface of the third underlying electrode layer 58a in order from the side of the second laminated body 44. Similarly, the fourth external electrode 54b includes a fourth underlying electrode layer 58b and a fourth plating layer 60b disposed on the surface of the fourth underlying electrode layer 58b in order from the side of the second laminated body 44.

The third underlying electrode layer 58a is disposed on the surface of the third end surface 44e of the second laminated body 44, extends from the third end surface 44e, and covers a portion of each of the third main surface 44a, the fourth main surface 44b, the third side surface 44c, and the fourth side surface 44d. Alternatively, the third underlying electrode layer 58a may be disposed only on the surface of the third end surface 44e of the second laminated body 44.

The fourth underlying electrode layer 58b is disposed on the surface of the fourth end surface 44f of the second laminate 44, extends from the fourth end surface 44f, and covers a portion of each of a third main surface 44a, the fourth main surface 44b, the third side surface 44c, and the fourth side surface 44d. Alternatively, the fourth underlying electrode layer 58b may be disposed only on the surface of the fourth end surface 44f of the second laminated body 44.

Each of the third underlying electrode layer 58a and the fourth underlying electrode layer 58b (hereinafter, also simply referred to as underlying electrode layer) preferably includes, for example, at least one selected from a baking layer, a resin layer, and a thin film layer. In the first preferred embodiment, the underlying electrode layer is preferably the baking layer.

The third plating layer 60a is disposed on the surface of the third underlying electrode layer 58a and covers the third underlying electrode layer 58a. Similarly, the fourth plating layer 60b is disposed on the surface of the fourth underlying electrode layer 58b and covers the fourth underlying electrode layer 58b.

A second multilayer ceramic electronic component body 114 in FIGS. 9 to 13 is provided as another example of the second multilayer ceramic electronic component body 14 in FIG. 1. The structure of the second multilayer ceramic electronic component body 114 is the same as or similar to that of the second multilayer ceramic electronic component body 14 except for the internal electrode. Thus, the same or similar portions as those of the second laminated ceramic electronic component body 14 are denoted by the same reference numerals, and the description thereof is omitted.

The second multilayer ceramic electronic component body 114 includes two capacitors that are connected in series in the second laminated body 44.

As illustrated in FIG. 10, the second laminated body 44 of the second multilayer ceramic electronic component body 114 includes an eighth internal electrode 148a connected to the third external electrode 54a, a ninth internal electrode 148b on the same dielectric layer 46 as the eighth internal electrode 148a and connected to the fourth external electrode 54b while being spaced away from the eighth internal electrode 148a by a predetermined interval 152d, and a tenth internal electrode 148c on a dielectric layer 46 different from the dielectric layer 46 on which the eighth internal electrode 148a and the ninth internal electrode 148b are located. The eighth internal electrode 148a, the ninth internal electrode 148b, and the tenth internal electrode 148c are buried so as to be alternately arranged at equal intervals along the lamination direction x of the second laminated body 44.

An eighth extended electrode portion 150a led out to the third end surface 44e of the second laminated body 44 is provided on one end side of the eighth internal electrode 148a. A ninth extended electrode portion 150b led out to the fourth end surface 44f of the second laminated body 44 is provided on one end side of the ninth internal electrode 148b. Specifically, the eighth extended electrode portion 150a on one end side of the eighth internal electrode 148a is exposed on the third end surface 44e of the second laminated body 44, and connected to the third external electrode 54a. The ninth extended electrode portion 150b on one end side of the ninth internal electrode 148b is exposed on the fourth end surface 44f of the second laminated body 44, and connected to the fourth external electrode 54b.

The tenth internal electrode 148c does not include an extended electrode portion, and is not exposed on the surface of the second laminated body 44. Thus, the tenth internal electrode 148c is connected to neither the third external electrode 54a nor the fourth external electrode 54b.

The tenth internal electrode 148c is opposed to a portion of the eighth internal electrode 148a and a portion of the ninth internal electrode 148b. That is, in the second laminated body 44, opposed electrode portions 152a are provided in a portion in which a portion of the eighth internal electrode 148a is opposed to the tenth internal electrode 148c with the dielectric layer 46 interposed therebetween and a portion in which a portion of the ninth internal electrode 148b is opposed to the tenth internal electrode 148c with the dielectric layer 46 interposed therebetween. In the case in which the second multilayer ceramic electronic component body 114 is a capacitor, the electrostatic capacitance is produced in each of the two opposed electrode portions 152a.

The second laminated body 44 includes W gaps 152b between one end in the width direction y of the opposed electrode portion 152a and the third side surface 44c and between the other end in the width direction y of the opposed electrode portion 152a and the fourth side surface 44d. The second laminated body 44 includes L gaps 152c between one end of the tenth internal electrode 148c and the third end surface 44e and between the other end of the tenth internal electrode 148c and the fourth end surface 44f.

In the second laminated body 44, the internal electrode 148 may be disposed so as to be parallel or substantially parallel to the sheet-shaped insulator 22 (opposed to the insulator 22), or the internal electrode 148 may be disposed so as to be orthogonal or substantially orthogonal to the insulator 22.

In the case in which the second multilayer ceramic electronic component body 114 is a capacitor, in the second laminated body 44, in each opposed electrode portion 152a, the eighth internal electrode 148a and the tenth internal electrode 148c are opposed to each other with the dielectric layer 46 interposed therebetween, and the ninth internal electrode 148b and the tenth internal electrode 148c are opposed to each other with the dielectric layer 46 interposed therebetween, thus producing the electrostatic capacitance. Consequently, in the second multilayer ceramic electronic component body 114, the two capacitors are connected in series between the third external electrode 54a and the fourth external electrode 54b. For this reason, the voltage applied to each capacitor is decreased, so that the internal withstand voltage is able to be further increased.

A second multilayer ceramic electronic component body 214 in FIGS. 14 to 18 is provided as still another example of the second multilayer ceramic electronic component body 14 in FIG. 1. The structure of the second multilayer ceramic electronic component body 214 is the same as or similar to that of the second multilayer ceramic electronic component body 14 except for the internal electrode. Thus, the same or similar portions as those of the second laminated ceramic electronic component body 14 are denoted by the same reference numerals, and the description thereof is omitted.

The second multilayer ceramic electronic component body 214 includes at least three and odd-numbered capacitors that are connected in series in the second laminated body 44.

As illustrated in FIG. 15, the second laminated body 44 of the second multilayer ceramic electronic component body 214 includes a fifteenth internal electrode 248*a* connected to the third external electrode 54*a*, a sixteenth internal electrode 248*b*, which is connected to the fourth external electrode 54*b* on a dielectric layer 46 different from the dielectric layer 46 on which the fifteenth internal electrode 248*a*, at least one seventeenth internal electrode 248*c* on the same dielectric layer 46 as the fifteenth internal electrode 248*a* and spaced away from the fifteenth internal electrode 248*a* by a predetermined interval 252*d*, and at least one eighteenth internal electrode 248*d* on the same dielectric layer 46 as the sixteenth internal electrode 248*b* and spaced away from the sixteenth internal electrode 248*b* by the predetermined interval 252*d*.

In the case in which at least two seventeenth internal electrodes 248*c* are provided, the seventeenth internal electrodes 248*c* are provided on the same dielectric layer 46 at the predetermined interval 252*d* with the adjacent seventeenth internal electrode 248*c* in the direction connecting the third external electrode 54*a* and the fourth external electrode 54*b*.

Similarly, in the case in which at least two eighteenth internal electrodes 248*d* are provided, the eighteenth internal electrodes 248*d* are provided on the same dielectric layer 46 at the predetermined interval 252*d* with the adjacent eighteenth internal electrode 248*d* in the direction connecting the third external electrode 54*a* and the fourth external electrode 54*b*.

The seventeenth internal electrode 248*c* is opposed to any two of a portion of the sixteenth internal electrode 248*b*, a portion of the eighteenth internal electrode 248*d*, and a portion of another eighteenth internal electrode 248*d*, and the eighteenth internal electrode 248*d* is opposed to any two of a portion of the fifteenth internal electrode 248*a*, a portion of the seventeenth internal electrode 248*c*, and a portion of another seventeenth internal electrode 248*c*.

The case in which the second multilayer ceramic electronic component body 214 includes three capacitors that are connected in series in the second laminated body 44 will be described below as an example.

A fifteenth extended electrode portion 250*a* led out to the third end surface 44*e* of the second laminated body 44 is provided on one end side of the fifteenth internal electrode 248*a*. A sixteenth extended electrode portion 250*b* led out to the fourth end surface 44*f* of the second laminated body 44 is provided on one end side of the sixteenth internal electrode 248*b*. Specifically, the fifteenth extended electrode portion 250*a* on one end side of the fifteenth internal electrode 248*a* is exposed on the third end surface 44*e* of the second laminated body 44, and connected to the third external electrode 54*a*. The sixteenth extended electrode portion 250*b* on one end side of the sixteenth internal electrode 248*b* is exposed on the fourth end surface 44*f* of the second laminated body 44, and connected to the fourth external electrode 54*b*.

The seventeenth internal electrode 248*c* and the eighteenth internal electrode 248*d* do not include the extended electrode portion, and are not exposed on the surface of the second laminated body 44. Thus, the seventeenth internal electrode 248*c* and the eighteenth internal electrode 248*d* are connected to neither the third external electrode 54*a* nor the fourth external electrode 54*b*.

The seventeenth internal electrode 248*c* is opposed to a portion of the sixteenth internal electrode 248*b* and a portion of the eighteenth internal electrode 248*d*. The eighteenth internal electrode 248*d* is opposed to a portion of the fifteenth internal electrode 248*a* and a portion of the seventeenth internal electrode 248*c*. That is, the second laminated body 44 includes opposed electrode portions 252*a*, which are provided in a portion in which a portion of the fifteenth internal electrode 248*a* is opposed to the eighteenth internal electrode 248*d* with the dielectric layer 46 interposed therebetween, a portion in which a portion of the seventeenth internal electrode 248*c* is opposed to a portion of the eighteenth internal electrode 248*d* with the dielectric layer 46 interposed therebetween, and a portion in which a portion of the sixteenth internal electrode 248*b* is opposed to the seventeenth internal electrode 248*c* with the dielectric layer 46 interposed therebetween. In the case in which the second multilayer ceramic electronic component body 214 is a capacitor, the electrostatic capacitance is produced in each of the three opposed electrode portions 252*a*.

The second laminated body 44 includes W gaps 252*b* between one end in the width direction y of the opposed electrode portion 252*a* and the third side surface 44*c* and between the other end in the width direction y of the opposed electrode portion 252*a* and the fourth side surface 44*d*. The second laminated body 44 includes the intervals 252*d* between the leading end of the fifteenth internal electrode 248*a* and one end of the seventeenth internal electrode 248*c* and between the leading end of the sixteenth internal electrode 248*b* and one end of the eighteenth internal electrode 248*d*. The second laminated body 44 includes L gaps 252*c* between the other end of the seventeenth internal electrode 248*c* and the fourth end surface 44*f* and between the other end of the eighteenth internal electrode 248*d* and the third end surface 44*e*.

In the second laminated body 44, the internal electrode 248 may be disposed so as to be parallel or substantially parallel to the sheet-shaped insulator 22 (opposed to the insulator 22), or the internal electrode 248 may be disposed so as to be orthogonal or substantially orthogonal to the insulator 22.

In the case in which the second multilayer ceramic electronic component body 214 is a capacitor, in the second laminated body 44, in each opposed electrode portion 252*a*, the fifteenth internal electrode 248*a* and the eighteenth internal electrode 248*d* are opposed to each other with the dielectric layer 46 interposed therebetween, the seventeenth internal electrode 248*c* and the eighteenth internal electrode 248*d* are opposed to each other with the dielectric layer 46 interposed therebetween, and the sixteenth internal electrode 248*b* and the seventeenth internal electrode 248*c* are opposed to each other with the dielectric layer 46 interposed therebetween thus producing the electrostatic capacitance. Consequently, in the second multilayer ceramic electronic component body 214, the three capacitors are connected in series between the third external electrode 54*a* and the fourth external electrode 54*b*. For this reason, the voltage applied to each capacitor is decreased, so that the internal withstand voltage is able to be further increased.

A second multilayer ceramic electronic component body 314 in FIGS. 19 to 23 is provided as yet another example of the second multilayer ceramic electronic component body 14 in FIG. 1. The structure of the second multilayer ceramic electronic component body 314 is the same as or similar to that of the second multilayer ceramic electronic component body 14 except for the internal electrode. Thus, the same or similar portions as those of the second laminated ceramic electronic component body 14 are denoted by the same reference numerals, and the description thereof is omitted.

The second multilayer ceramic electronic component body 314 includes at least four and even-numbered capacitors that are connected in series in the second laminated body 44.

As illustrated in FIG. 20, the second laminated body 44 of the second multilayer ceramic electronic component body 314 includes a twenty-third internal electrode 348a connected to the third external electrode 54a, a twenty-fourth internal electrode 348 on the same dielectric layer 46 as the twenty-third internal electrode 348a and connected to the fourth external electrode 54b, at least one twenty-fifth internal electrodes 348c on the same dielectric layer 46 as the twenty-third internal electrode 348a and the twenty-fourth internal electrode 348b and separated between the twenty-third internal electrode 348a and a twenty-fourth internal electrode 348b at a predetermined interval 352d, and at least two twenty-sixth internal electrodes 348d on a dielectric layer 46 different from the dielectric layer 46 on which the twenty-third internal electrode 348a and the twenty-fourth internal electrode 348b are located.

In the case in which at least two twenty-fifth internal electrodes 348c are provided, the twenty-fifth internal electrodes 348c are provided on the same dielectric layer 46 at the predetermined interval 352d with the adjacent twenty-fifth internal electrode 348c in the direction connecting the third external electrode 54a and the fourth external electrode 54b.

The at least two twenty-sixth internal electrodes 348d are provided on the same dielectric layer 46 at the predetermined interval 352d with the adjacent twenty-sixth internal electrode 348d in the direction connecting the third external electrode 54a and the fourth external electrode 54b.

The twenty-fifth internal electrode 348c is opposed to a portion of the twenty-sixth internal electrode 348d and a portion of another twenty-sixth internal electrode 348d. The twenty-sixth internal electrode 348d is opposed to any two of a portion of the twenty-third internal electrode 348a, a portion of the twenty-fourth internal electrode 348b, a portion of the twenty-fifth internal electrode 348c, and a portion of another twenty-fifth twelfth internal electrode 348c.

The case in which the second multilayer ceramic electronic component body 314 includes four capacitors that are connected in series in the second laminated body 44 will be described below as an example.

A twenty-third extended electrode portion 350a led out to the third end surface 44e of the second laminated body 44 is provided on one end side of the twenty-third internal electrode 348a. A twenty-fourth extended electrode portion 350b led out to the fourth end surface 44f of the second laminated body 44 is provided on one end side of the twenty-fourth internal electrode 348b. Specifically, the twenty-third extended electrode portion 350a on one end side of the twenty-third internal electrode 348a is exposed on the third end surface 44e of the second laminated body 44, and connected to the third external electrode 54a. The twenty-fourth extended electrode portion 350b on one end side of the twenty-fourth internal electrode 348b is exposed on the fourth end surface 44f of the second laminated body 44, and connected to the fourth external electrode 54b.

The twenty-fifth internal electrode 348c and the twenty-sixth internal electrode 348d do not include the extended electrode portion, and are not exposed on the surface of the second laminated body 44. Therefore, the twenty-fifth internal electrode 348c and the twenty-sixth internal electrode 348d are connected to neither the third external electrode 54a nor the fourth external electrode 54b.

A twenty-sixth internal electrode 348d close to the third end surface 44e is opposed to a portion of the twenty-third internal electrode 348a and a portion of the twenty-fifth internal electrode 348c. The twenty-sixth internal electrode 348d close to the fourth end surface 44f is opposed to a portion of the twenty-fourth internal electrode 348b and a portion of the twenty-fifth internal electrode 348c. The twenty-fifth internal electrode 348c is opposed to a portion of the twenty-sixth internal electrode 348d and a portion of another twenty-sixth internal electrode 348d. That is, the second laminated body 44 includes opposed electrode portions 352a, which are provided in a portion in which a portion of the twenty-third internal electrode 348a is opposed to a portion of the twenty-sixth internal electrode 348d with the dielectric layer 46 interposed therebetween, a portion in which a portion of the twenty-third internal electrode 348d is opposed to a portion of the twenty-fifth internal electrode 348c with the dielectric layer 46 interposed therebetween, a portion in which a portion of another twenty-sixth internal electrode 348d is opposed to the portion of the twenty-fifth internal electrode 348c with the dielectric layer 46 interposed therebetween, and a portion in which a portion of the twenty-fourth internal electrode 348b is opposed to a portion of the another twenty-sixth internal electrode 348d with the dielectric layer 46 interposed therebetween. In the case in which the second multilayer ceramic electronic component body 314 is a capacitor, the electrostatic capacitance is produced in each of the four opposed electrode portions 352a.

The second laminated body 44 includes W gaps 352b between one end in the width direction y of the opposed electrode portion 352a and the third side surface 44c and between the other end in the width direction y of the opposed electrode portion 352a and the fourth side surface 44d. The second laminated body 44 includes the intervals 352d between the leading end of the twenty-third internal electrode 348a and one end of the twenty-fifth internal electrode 348c, between the leading end of the twenty-fourth internal electrode 348b and the other end of the twenty-fifth internal electrode 348c, and between one end of the twenty-sixth internal electrode 348d and one end of another twenty-sixth internal electrode 348d. The second laminated body 44 includes L gaps 352c between the other end of the twenty-sixth internal electrode 348d and the third end surface 44e and between the other end of the twenty-sixth internal electrode 348d and the fourth end surface 44f.

In the second laminated body 44, the internal electrode 348 may be disposed so as to be parallel or substantially parallel to the sheet-shaped insulator 22 (opposed to the insulator 22), or the internal electrode 348 may be disposed so as to be orthogonal or substantially orthogonal to the insulator 22.

In the case in which the second multilayer ceramic electronic component body 314 is a capacitor, in the second laminated body 44, in each opposed electrode portion 352a, the twenty-third internal electrode 348a and the twenty-sixth internal electrode 348d are opposed to each other with the dielectric layer 46 interposed therebetween, the twenty-sixth internal electrode 348d and the twenty-fifth internal electrode 348c are opposed to each other with the dielectric layer 46 interposed therebetween, the twenty-fifth internal electrode 348c and another twenty-sixth internal electrode 348d are opposed to each other with the dielectric layer 46 interposed therebetween, and the another twenty-sixth internal electrode 348d and twenty-fourth internal electrode 348b are opposed to each other with the dielectric layer 46 interposed therebetween, thus producing the electrostatic capacitance. Consequently, in the second multilayer ceramic electronic component body 314, the four capacitors are connected in series between the third external electrode 54a and the fourth external electrode 54b. For this reason, the voltage applied to each capacitor is decreased, so that the internal withstand voltage is able to be further increased.

As illustrated in FIG. 1, the first metal terminal 16 is connected to the second external electrode 34b of the first multilayer ceramic electronic component body 12 using a bonding material. The second metal terminal 18 is connected to the fourth external electrode 54b of the second multilayer ceramic electronic component body 14 using a bonding material. The first metal terminal 16 and the second metal terminal 18 are provided to mount the multilayer ceramic electronic component 10A on the mounting substrate S.

The connection terminal 20 is connected across the first external electrode 34a of the first multilayer ceramic electronic component body 12 and the third external electrode 54a of the second multilayer ceramic electronic component body 14 using a bonding material. The connection terminal 20 is provided to connect the first multilayer ceramic electronic component body 12 and the second multilayer ceramic electronic component body 14 in series. Consequently, the first laminated body 24 and the second laminated body 44 are mounted on the mounting substrate S and connected in series, so that the withstand voltage of the multilayer ceramic electronic component 10A is able to be improved.

The first metal terminal 16 includes a first terminal bonding portion 62 connected to the second external electrode 34b of the first multilayer ceramic electronic component body 12, a first extended portion 64 that extends from the first terminal bonding portion 62 in the direction of the mounting surface such that a gap is provided between the multilayer ceramic electronic component body 12 and the mounting surface of the mounting substrate S, and a first mounting portion 66 that is connected to the first extended portion 64 and extends onto the side of the first multilayer ceramic electronic component body 12 in the direction connecting the second external electrode 34b and the fourth external electrode 54b (that is, extends in parallel or substantially in parallel to the mounting surface of the mounting substrate S from the first extended portion 64).

The second metal terminal 18 includes a second terminal bonding portion 82 connected to the fourth external electrode 54b of the second multilayer ceramic electronic component body 14, a second extended portion 84 extending from the second terminal bonding portion 82 in the direction of the mounting surface such that a gap is provided between the multilayer ceramic electronic component body 14 and the mounting surface of the mounting substrate S, and a second mounting portion 86 that is connected to the second extended portion 84 and extends onto the side of the second multilayer ceramic electronic component body 14 in the direction connecting the second external electrode 34b and the fourth external electrode 54b (that is, extends from the second extended portion 84 in parallel or substantially in parallel to the mounting surface of the mounting substrate S).

The connection terminal 20 includes a third terminal bonding portion 92 connected to the first external electrode 34a of the first multilayer ceramic electronic component body 12, a fourth terminal bonding portion 94 connected to the third external electrode 54a of the second multilayer ceramic electronic component body 14, and a third extended portion 96 connected to the third terminal bonding portion 92 and the fourth terminal bonding portion 94 and located between the first external electrode 34a and the third external electrode 54a to extend in the direction connecting the first external electrode 34a and the third external electrode 54a. The connection terminal 20 is in contact with the first end surface 22e (upper end surface, to be described later) of the insulator 22 by the third extended portion 96.

The first terminal bonding portion 62 of the first metal terminal 16 is connected to the second external electrode 34b disposed on the second end surface 24f of the first laminated body 24. The first terminal bonding portion 62 preferably has a plate shape, and one main surface opposed to the second end surface 24f of the first laminated body 24 is connected to the second external electrode 34b using a bonding material (not illustrated). The shape of the first terminal bonding portion 62 is not particularly limited, but preferably the first terminal bonding portion 62 has a rectangular or substantially rectangular shape, for example.

The second terminal bonding portion 82 of the second metal terminal 18 is connected to the fourth external electrode 54b disposed on the fourth end surface 44f of the second laminated body 44. The second terminal bonding portion 82 preferably has a plate shape, and one main surface opposed to the fourth end surface 44f of the second laminated body 44 is connected to the fourth external electrode 54b using a bonding material (not illustrated). The shape of the second terminal bonding portion 82 is not particularly limited, but preferably the second terminal bonding portion 82 has a rectangular or substantially rectangular shape, for example.

The third terminal bonding portion 92 of the connection terminal 20 is connected to the first external electrode 34a disposed on the first end surface 24e of the first laminated body 24. The third terminal bonding portion 92 preferably has a plate shape, and one main surface opposed to the first end surface 24e of the first laminated body 24 is connected to the first external electrode 34a using a bonding material (not illustrated). The shape of the third terminal bonding portion 92 is not particularly limited, but preferably the third terminal bonding portion 92 has a rectangular or substantially rectangular shape, for example.

The fourth terminal bonding portion 94 of the connecting terminal 20 is connected to the third external electrode 54a disposed on the third end surface 44e of the second laminated body 44. The fourth terminal bonding portion 94 preferably has a plate shape, and one main surface opposed to the third end surface 44e of the second laminated body 44 is connected to the third external electrode 54a using a bonding material (not illustrated). The shape of the fourth terminal bonding portion 94 is not particularly limited, but preferably the fourth terminal bonding portion 94 has a rectangular or substantially rectangular shape, for example.

The first extended portion 64 of the first metal terminal 16 is connected to the first terminal bonding portion 62, extends in the direction of the mounting surface such that a gap is provided between the second end surface 24f of the first laminated body 24 and the mounting surface of the mounting substrate S, and is connected to the first mounting portion 66. A length of the first extended portion 64 is designed such that a gap is provided between the second end surface (lower end surface) 22f of the insulator 22 protruding from the first multilayer ceramic electronic component body 12 toward the mounting surface side of the mounting substrate S and the mounting surface of the mounting substrate S.

The first extended portion 64 extends in a direction parallel or substantially parallel to the first main surface 24a or the second main surface 24b of the first laminated body 24. In other words, the first extended portion 64 intersects the first terminal bonding portion 62 and the first mounting portion 66 at right angles. However, the first extended portion 64 may be inclined with respect to the first main surface 24a or the second main surface 24b of the first laminated body 24. The shape of the first extended portion 64 is not particularly limited, but preferably the first extended portion 64 has a rectangular or substantially rectangular shape, for example.

The second extended portion 84 of the second metal terminal 18 is connected to the second terminal bonding portion 82, extends in the direction of the mounting surface such that a gap is provided between the fourth end surface 44f of the second laminated body 44 and the mounting surface of the mounting substrate S, and is connected to the second mounting portion 86. A length of the second extended portion 84 is designed such that a gap is provided between the second end surface (lower end surface) 22f of the insulator 22 protruding from the second multilayer ceramic electronic component body 14 toward the mounting surface side of the mounting substrate S and the mounting surface of the mounting substrate S.

The second extended portion 84 extends in a direction parallel or substantially parallel to the third main surface 44a or the fourth main surface 44b of the second laminated body 44. In other words, the second extended portion 84 intersects the second terminal bonding portion 82 and the second mounting portion 86 at right angles. However, the second extended portion 84 may be inclined with respect to the third main surface 44a or the fourth main surface 44b of the second laminated body 44. The shape of the second extended portion 84 is not particularly limited, but preferably the second extended portion 84 has a rectangular or substantially rectangular shape, for example.

The first extended portion 64 of the first metal terminal 16 and the second extended portion 84 of the second metal terminal 18 are provided to space the first multilayer ceramic electronic component body 12 and the second multilayer ceramic electronic component body 14 away from the mounting substrate S on which the multilayer ceramic electronic component 10A is mounted. Consequently, a stress caused by a difference in thermal expansion coefficient between the mounting substrate S and the multilayer ceramic electronic component 10A, a stress caused by deflection of the mounting substrate S, or a mechanical distortion generated in the dielectric layer due to application of voltage is absorbed by elastic deformation of the first extended portion 64 and the second extended portion 84. As a result, problems, such as a crack being generated in the first multilayer ceramic electronic component body 12 and the second multilayer ceramic electronic component body 14 and the second external electrode 34b being peeled off from the first multilayer ceramic electronic component body 12 are prevented, and the generation of a noise (squeal) is reduced by reducing or preventing transmission of vibration to the mounting substrate S through the first metal terminal 16 and the second metal terminal 18.

The third extended portion 96 of the connection terminal 20 is connected to the third terminal bonding portion 92 and the fourth terminal bonding portion 94, and extends such that a gap is provided between the first multilayer ceramic electronic component body 12 and the second multilayer ceramic electronic component body 14. The third extended portion 96 is in close contact with the insulator 22. The shape of the third extended portion 96 is not particularly limited, but preferably the third extended portion 96 has a rectangular or substantially rectangular shape, for example.

The first mounting portion 66 of the first metal terminal 16 is connected to the first extended portion 64, and mounted on the mounting substrate S. Specifically, the first mounting portion 66 is bent from a terminal end of the first extended portion 64, and extends so as to be parallel or substantially parallel to the mounting surface. The shape of the first mounting portion 66 is not particularly limited, but preferably the first mounting portion 66 has a rectangular or substantially rectangular shape, for example.

The second mounting portion 86 of the second metal terminal 18 is connected to the second extended portion 84, and mounted on the mounting substrate S. Specifically, the second mounting portion 86 is bent from the terminal end of the second extended portion 84, and extends so as to be parallel or substantially parallel to the mounting surface. The shape of the second mounting portion 86 is not particularly limited, but preferably the second mounting portion 86 has a rectangular or substantially rectangular shape, for example.

The mounting surfaces of the first mounting portion 66 and the second mounting portion 86 are flat or substantially flat with respect to the mounting surface of the mounting substrate S, so that the multilayer ceramic electronic component 10A is able to be sucked by a mounter (automatic mounting machine).

In the first preferred embodiment, the first metal terminal 16, the second metal terminal 18, and the connection terminal 20 are preferably plate-shaped frame terminals, for example. Consequently, bonding using the solder or the conductive adhesive is ensured, and surface mounting is able to be performed. However, the connection terminal 20 may be a lead terminal.

The first metal terminal 16 and the second metal terminal 18 preferably have a substantially U-shaped in cross section, for example. Thus, between the second external electrode 34b and the first metal terminal 16, between the fourth external electrode 54b and the second metal terminal 18, and between the mounting substrate S and the first metal terminal 16 and the second metal terminal 18, a bonding area is increased, a contact resistance is decreased, and the physical bonding is ensured. As a result, resistance to the deflection of the mounting substrate S is able to be improved when the multilayer ceramic electronic component 10A is mounted on the mounting substrate S. The shapes of the first metal terminal 16 and the second metal terminal 18 are not limited as long as the resistance to the deflection of the mounting substrate S is able to be improved.

The first metal terminal 16, the second metal terminal 18, and the connection terminal 20 include a terminal body and a plating film provided on the surface of the terminal body.

Preferably the terminal body is made of, for example Ni, Fe, Cu, Ag, Cr, or an alloy mainly including at least one of these metals. Specifically, for example, the metal of the base material of the terminal body may preferably be Fe-42 Ni alloy, Fe-18 Cr alloy, or Cu-8 Sn alloy. Preferably, the thicknesses of the first metal terminal 16, the second metal terminal 18, and the connection terminal 20 are in a range of about 0.05 mm to about 0.5 mm, for example.

For example, the plating film includes a lower plating film and an upper plating film.

The lower plating film is provided on the surface of the terminal body, and the upper plating film is provided on the surface of the lower plating film. Each of the lower plating film and the upper plating film may include a plurality of plating layers.

The plating film may not be provided in at least peripheral surfaces of the first extended portion 64 and the first mounting portion 66 of the first metal terminal 16 and peripheral surfaces of the second extended portion 84 and the second mounting portion 86 of the second metal terminal 18. Consequently, spread of solder to the first metal terminal 16 and the second metal terminal 18 is able to be prevented when the multilayer ceramic electronic component 10A is mounted on the mounting substrate S using the solder. The spread of the solder is prevented between the first multilayer ceramic electronic component body 12 and the first metal terminal 16 (floating portion) and between the second multilayer ceramic electronic component body 14 and the second metal terminal 18 (floating portion), so that the floating portion is prevented from being filled with the solder. Thus, a space of the floating portion is sufficiently ensured. The first extended portion 64 of the first metal terminal 16 and the second extended portion 84 of the second metal terminal 18 are easily elastically deformed, so that the mechanical distortion generated in the ceramic layer due to the application of the AC voltage is able to be further absorbed. This enables the vibration generated at this time to be prevented from being transmitted to the mounting substrate S through the second external electrode 34b and the fourth external electrode 54b. Thus, the generation of an acoustic noise (squeal) is able to be reduced or prevented by including the first metal terminal 16 and the second metal terminal 18. The plating film may not be provided on the entire peripheral surfaces of the first metal terminal 16 and the second metal terminal 18.

A removal (cutting, polishing) method using a machine, a removal method by laser trimming, a removal method by a plating remover (for example, sodium hydroxide), and a method of covering a portion not to be plated with the resist film before forming the plating film on the first metal terminal 16 and the second metal terminal 18 and removing the resist film after forming the plating film on the first metal terminal 16 and the second metal terminal 18 are conceivable in the case in which the plating films of the first extended portion 64 and the first mounting portion 66 of the first metal terminal 16 and the second extended portion 84 and the second mounting portion 86 of the second metal terminal 18 or the entire peripheral surfaces of the first metal terminal 16 and the second metal terminal 18 are removed.

Preferably the lower plating film is made of, for example, Ni, Fe, Cu, Ag, Cr or an alloy mainly including at least one of these metals. More preferably, the lower plating film is made of, for example, Ni, Fe, Cr or an alloy mainly including at least one of these metals. Preferably, the thickness of the lower plating film is in a range of about 0.2 μm to about 5.0 μm, for example.

Preferably, the upper plating film is made of, for example, Sn, Ag, Au, or an alloy mainly including at least one of these metals. More preferably, the upper plating film is made of, for example, Sn or an alloy mainly including Sn. The upper plating film is preferably made of Sn or an alloy mainly including Sn, which improves solderability between the first metal terminal 16, the second metal terminal 18 and the connection terminal 20 and the external electrode. Preferably, the thickness of the upper plating film is in a range of about 1.0 μm to about 5.0 μm, for example.

Each of the terminal body and the lower plating film is preferably made of, for example, Ni, Fe, Cr having a high melting point, or an alloy mainly including at least one of these metals, which improves heat resistance of the external electrode.

The bonding material is not particularly limited. For example, the solder or the conductive adhesive may be used.

Preferably, Sn—Sb base, Sn—Ag—Cu base, Sn—Cu base, or Sn—Bi base LF solder, for example, is used in the case in which solder is used. For the Sn—Sb base solder, preferably an Sb content is in a range of about 5% to 15%, for example.

Preferably, a bonding agent in which a metal filler made of Ag is added to a thermosetting resin, such as an epoxy resin, for example, is used in the case in which the conductive adhesive is used.

Figure 24:
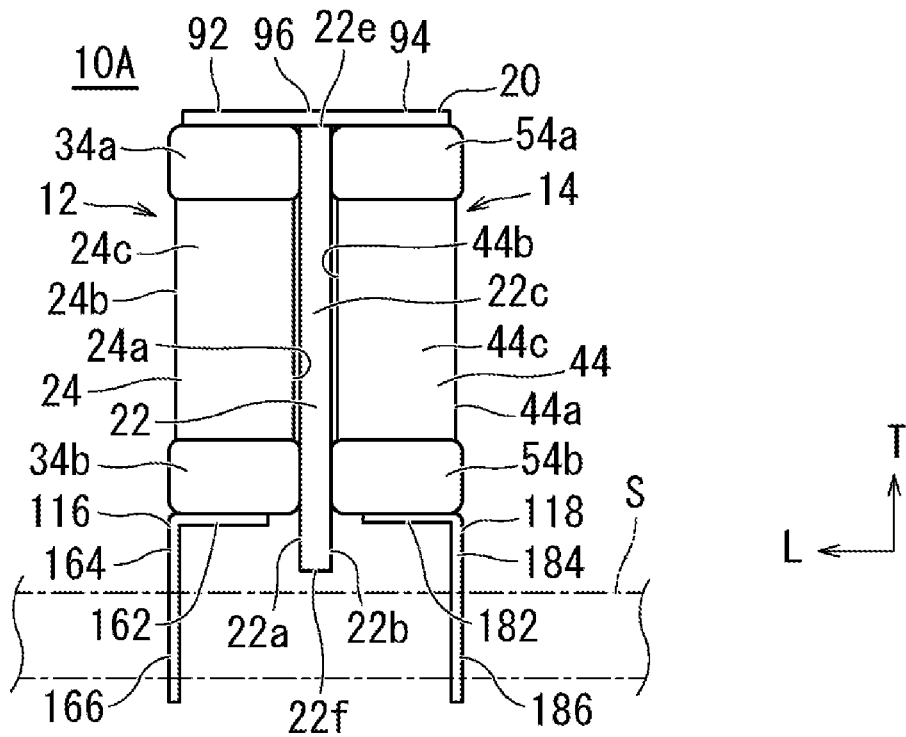
FIG. 24 is a front view of a multilayer ceramic electronic component for illustrating a modification of a metal terminal in FIG. 1.

A first metal terminal 116 and a second metal terminal 118 in FIG. 24 are provided as another example of the first metal terminal 16 and the second metal terminal 18 in FIG. 1. FIG. 24 is a front view of a multilayer ceramic electronic component for illustrating a modification of the metal terminal in FIG. 1.

The first metal terminal 116 includes a first terminal bonding portion 162 connected to the second external electrode 34b of the first multilayer ceramic electronic component body 12, a first extended portion 164 that extends from the first terminal bonding portion 162 in the direction of the mounting surface such that a gap is provided between the multilayer ceramic electronic component body 12 and the mounting surface of the mounting substrate S, and a first mounting portion 166 that is connected to the first extended portion 164 and extends on the extension line of the first extended portion 164. That is, the first metal terminal 116 has a structure in which a portion of the first extended portion 164 defines the first mounting portion 166.

The second metal terminal 118 includes a second terminal bonding portion 182 connected to the fourth external electrode 54b of the second multilayer ceramic electronic component body 14, a second extended portion 184 that extends from the second terminal bonding portion 182 in the direction of the mounting surface such that a gap is provided between the multilayer ceramic electronic component body 14 and the mounting surface of the mounting substrate S, and a second mounting portion 186 that is connected to the second extended portion 184 and extends on the extension line of the second extended portion 184. That is, the second metal terminal 118 has a structure in which a portion of the second extended portion 184 defines the second mounting portion 186.

The first metal terminal 116 preferably has an inverted or substantially inverted L-shaped in section, for example, and may be a frame terminal or a lead terminal. The first terminal bonding portion 162 of the first metal terminal 116 is connected to the second external electrode 34b disposed on the second end surface 24f of the first laminated body 24 using a bonding material.

The second metal terminal 118 preferably has an inverted or substantially inverted L-shape in section, and may be a frame terminal or a lead terminal. The second terminal bonding portion 182 of the second metal terminal 118 is connected to the fourth external electrode 54b disposed on the fourth end surface 44f of the second laminated body 44 using a bonding material.

The first extended portion 164 of the first metal terminal 116 is connected to the first terminal bonding portion 162, extends in the direction of the mounting surface such that a gap is provided between the second end surface 24f of the first laminated body 24 and the mounting surface of the mounting substrate S, and is connected to the first mounting portion 166. The first extended portion 164 extends in a direction parallel or substantially parallel to the first main surface 24a or the second main surface 24b of the first laminated body 24. In other words, the first extended portion 164 intersects the first terminal bonding portion 162 substantially at right angles.

The second extended portion 184 of the second metal terminal 118 is connected to the second terminal boding unit 182, extends in the direction of the mounting surface such that a gap is provided between the fourth end surface 44f of the second laminated body 44 and the mounting surface of the mounting substrate S, and is connected to the second mounting portion 186. The second extended portion 184 extends in a direction parallel or substantially parallel to the third main surface 44a or the fourth main surface 44b of the second laminated body 44. In other words, the second extended portion 184 intersects the second terminal bonding portion 182 substantially at right angles.

The first mounting portion 166 of the first metal terminal 116 is connected to the first extended portion 164, and mounted on the mounting substrate S. Specifically, the first mounting portion 166 extends on the extension line from the terminal end of the first extended portion 164.

The second mounting portion 186 of the second metal terminal 118 is connected to the second extended portion 184, and mounted on the mounting substrate S. Specifically, the second mounting portion 186 extends on the extension line from the terminal end of the second extended portion 184.

In the case in which the first metal terminal 116 and the second metal terminal 118 are a lead terminal, the first mounting portion 166 and the second mounting portion 186 are inserted into through holes of the mounting substrate S, and the multilayer ceramic electronic component 10A is able to be inserted and mounted. The multilayer ceramic electronic component 10A may also be mounted by welding the first metal terminal 116 and the second metal terminal 118.

Figure 25:
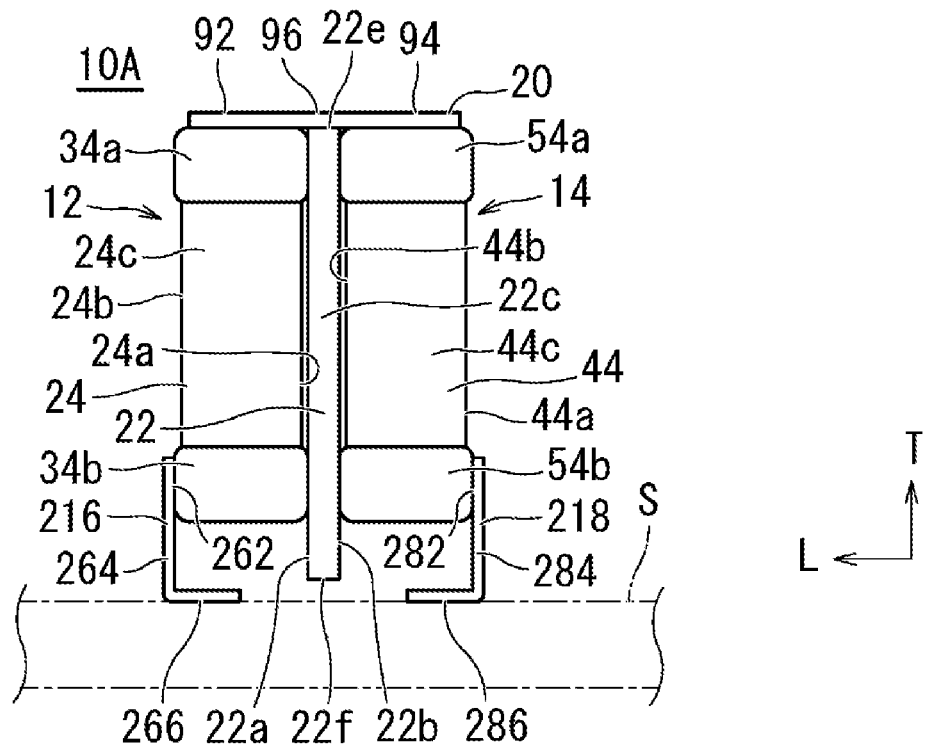
FIG. 25 is a front view of a multilayer ceramic electronic component for illustrating another modification of the metal terminal in FIG. 1.

A first metal terminal 216 and a second metal terminal 218 in FIG. 25 are provided as another example of the first metal terminal 16 and the second metal terminal 18 in FIG. 1. FIG. 25 is a front view of a multilayer ceramic electronic component for illustrating another modification of the metal terminal in FIG. 1.

The first metal terminal 216 includes a first terminal bonding portion 262 connected to the second external electrode 34b of the first multilayer ceramic electronic component body 12, a first extended portion 264 that extends on the extension line from the first terminal bonding portion 262 and extends in the direction of the mounting surface such that a gap is provided between the first multilayer ceramic electronic component body 12 and the mounting surface of the mounting substrate S, and a first mounting portion 266 that is connected to the first extended portion 264 and extends onto the side of the first multilayer ceramic electronic component body 12 in the direction connecting the second external electrode 34b and the fourth external electrode 54b (that is, extends from the first extended portion 264 in parallel or substantially in parallel to the mounting surface of the mounting substrate S).

The first metal terminal 216 preferably has an L-shape or a substantially L-shape in cross section, for example, and may be a frame terminal or a lead terminal.

The second metal terminal 218 includes a second terminal bonding portion 282 connected to the fourth external electrode 54b of the second multilayer ceramic electronic component body 14, a second extended portion 284 extending on the extension line from the second terminal bonding portion 282 and extends in the direction of the mounting surface such that a gap is provided between the multilayer ceramic electronic component body 14 and the mounting surface of the mounting substrate S, and a second mounting portion 286 that is connected to the second extended portion 284 and extends onto the side of the second multilayer ceramic electronic component body 14 in the direction connecting the second external electrode 34b and the fourth external electrode 54b (that is, extends from the second extended portion 284 in parallel to the mounting surface of the mounting substrate S).

The second metal terminal 118 preferably has an L-shape or a substantially L-shape in section, for example, and may be a frame terminal or a lead terminal.

The first terminal bonding portion 262 of the first metal terminal 216 is connected to the second external electrode 34b located on the first main surface 24a, the second main surface 24b, the first side surface 24c, or the second side surface 24d of the first laminated body 24 using a bonding material. That is, when any one of the first main surface 24a, the second main surface 24b, the first side surface 24c, and the second side surface 24d of the first laminated body 24 of the first multilayer ceramic electronic component body 12 is in contact with the insulator 22, the first terminal bonding portion 262 is connected to the second external electrode 34b located on a surface opposed to the contact surface using a bonding material.

For example, in the first preferred embodiment, because the first main surface 24a of the first laminated body 24 of the first multilayer ceramic electronic component body 12 is in contact with the insulator 22, the first terminal bonding portion 262 is connected to the second external electrode 34b located on the second main surface 24b opposed to the first main surface 24a using a bonding material.

The second terminal bonding portion 282 of the second metal terminal 218 is connected to the fourth external electrode 54b located on the third main surface 44a, the fourth main surface 44b, the third side surface 44c, or the fourth side surface 44d of the second laminated body 44 using a bonding material. That is, when any one of the third main surface 44a, the fourth main surface 44b, the third side surface 44c, or the fourth side surface 44d of the second laminated body 44 of the second multilayer ceramic electronic component body 14 is in contact with the insulator 22, the second terminal bonding portion 282 is connected to the fourth external electrode 54b located on a surface opposed to the contact surface using a bonding material.

For example, in the first preferred embodiment, because the fourth main surface 44b of the second laminated body 44 of the second multilayer ceramic electronic component body 14 is in contact with the insulator 22, the second terminal bonding portion 282 is connected to the fourth external electrode 54b located on the third main surface 44a opposed to the fourth main surface 44b using a bonding material.

The first extended portion 264 of the first metal terminal 216 is connected to the first terminal bonding portion 262, extends in the direction of the mounting surface such that a gap is provided between the second end surface 24f of the first laminated body 24 and the mounting surface of the mounting substrate S, and is connected to the first mounting portion 266. The first extended portion 264 extends in a direction parallel or substantially parallel to the first main surface 24a or the second main surface 24b of the first laminated body 24. In other words, the first extended portion 264 intersects the first mounting portion 266 substantially at right angles.

The second extended portion 284 of the second metal terminal 218 is connected to the second terminal bonding portion 282, extends in the direction of the mounting surface such that a gap is provided between the fourth end surface 44f of the second laminated body 44 and the mounting surface of the mounting substrate S, and is connected to the second mounting portion 286. The second extended portion 284 extends in a direction parallel or substantially parallel to the third main surface 44a or the fourth main surface 44b of the second laminated body 44. In other words, the second extended portion 284 intersects the second mounting portion 286 substantially at right angles.

The first mounting portion 266 of the first metal terminal 216 is connected to the first extended portion 264, and mounted on the mounting substrate S. Specifically, the first mounting portion 266 is bent from the terminal end of the first extended portion 264, and extends so as to be parallel or substantially parallel to the mounting surface.

The second mounting portion 286 of the second metal terminal 218 is connected to the second extended portion 284, and mounted on the mounting substrate S. Specifically, the second mounting portion 286 is bent from the terminal end of the second extended portion 284, and extends so as to be parallel or substantially parallel to the mounting surface.

Because the first metal terminal 216 and the second metal terminal 218 preferably have the L-shape or substantially L-shape in section, the first terminal bonding portion 262 and the second terminal bonding portion 282 is small. Thus, a total length of the first metal terminal 216 and the second metal terminal 218 is shortened, and a cost is able to be reduced.

The height dimension of the multilayer ceramic electronic component 10 is easily adjusted only by changing the bonding position between the first terminal bonding portion 262 and the second external electrode 34b and the bonding position between the second terminal bonding portion 282 and the fourth external electrode 54b.

As illustrated in FIGS. 1 and 2, the insulator 22 is disposed between the first multilayer ceramic electronic component body 12 and the second multilayer ceramic electronic component body 14. The insulator 22 includes a first main surface 22a and a second main surface 22b that are opposed to each other in the thickness direction (the length direction L of the multilayer ceramic electronic component 10A), a first side surface 22c and a second side surface 22d that are opposed to each other in the width direction W orthogonal or substantially orthogonal to the length direction L of the multilayer ceramic electronic component 10A, and a first end surface (hereinafter, also referred to as upper end surface) 22e and a second end surface (hereinafter, also referred to as lower end surface) 22f that are opposed to each other in the height direction T orthogonal or substantially orthogonal to the length direction L and the width direction W of the multilayer ceramic electronic component 10A.

The size of the insulator 22 is longer than the lengths of the first multilayer ceramic electronic component body 12 and the second multilayer ceramic electronic component body 14 in the height direction T, and is longer than the width dimensions of the first multilayer ceramic electronic component body 12 and the second multilayer ceramic electronic component body 14 in the width direction W.

The insulator 22 is disposed such that the first main surface 24a or the second main surface 24b of the first laminated body 24 of the first multilayer ceramic electronic component body 12 is in contact with the first main surface 22a of the insulator 22, and such that the third main surface 44a or the fourth main surface 44b of the second laminated body 44 of the second multilayer ceramic electronic component body 14 is in contact with the second main surface 22b of the insulator 22. Alternatively, the insulator 22 is disposed such that the first side surface 24c or the second side surface 24d of the first laminated body 24 of the first multilayer ceramic electronic component body 12 is in contact with the first main surface 22a of the insulator 22, and such that the third side surface 44c or the fourth side surface 44d of the second laminated body 44 of the second multilayer ceramic electronic component body 14 is in contact with the second main surface 22b of the insulator 22.

In the first preferred embodiment, the insulator 22 is disposed such that the first main surface 22a is in contact with the first main surface 24a of the first laminated body 24 of the first multilayer ceramic electronic component body 12, and such that the second main surface 22b is in contact with the fourth main surface 44b of the second laminated body 44 of the second multilayer ceramic electronic component body 14.

In the insulator 22, the first end surface (upper end surface) 22e is in contact with the lower surface of the third extended portion 96 of the connection terminal 20, and the second end surface (lower end surface) 22f protrudes from the second end surface 24f of the first multilayer ceramic electronic component body 12 and the fourth end surface 44f of the second multilayer ceramic electronic component body 14. In the insulator 22, the first side surface 22c protrudes from the first side surface 24c of the first multilayer ceramic electronic component body 12 and the third side surface 44c of the second multilayer ceramic electronic component body 14, and the second side surface 22d protrudes from the second side surface 24d of the first multilayer ceramic electronic component body 12 and the fourth side surface 44d of the second multilayer ceramic electronic component body 14. Thus, the insulator 22 protrudes from the second external electrode 34b of the first multilayer ceramic electronic component body 12 and the fourth external electrode 54b of the second multilayer ceramic electronic component body 14 in the lower portion in the height direction T, so that the insulator 22 effectively reduces or prevents edge-surface discharge between the second external electrode 34b and the fourth external electrode 54b.

In this manner, by disposing the insulator 22 between the first multilayer ceramic electronic component body 12 and the second multilayer ceramic electronic component body 14, the first multilayer ceramic electronic component body 12 and the second multilayer ceramic electronic component body 14 are insulated from each other, and connected in series. Consequently, the first metal terminal 16 and the second metal terminal 18 are insulated from each other, and the first laminated body 24 of the first multilayer ceramic electronic component body 12 and the second laminated body 44 of the second multilayer ceramic electronic component body 14 are connected in series, so that the advantageous effect of improving the withstand voltage of the multilayer ceramic electronic component 10A is able to be obtained.

The first laminated body 24 and the second laminate 44 are in contact with the insulator 22, and the advantageous effect of stabilizing the bonding relationship between the connection terminal 20 and the first laminated body 24 and the second laminate 44 is able to be obtained.

An insulating sheet or a resin, for example, may preferably be used as the insulator 22. In the case in which the insulating sheet is used, the insulator 22 is thin, so that the dimensions of the multilayer ceramic electronic component 10A are able to be reduced. For example, a ceramic sheet, a rubber sheet, or an epoxy film can be used as the insulating sheet. Preferably the thickness of the insulating sheet is in a range of about 0.2 mm to about 2 mm, for example.

In the case in which the resin is used as the insulator 22, the withstand voltage of the insulator 22 is increased, and the multilayer ceramic electronic component 10A having high withstand voltage is able to be provided. For example, an epoxy resin, a phenol resin, a polyurethane resin, a silicone resin, or a polyimide resin may preferably be used as the resin.

The insulator 22 may be provided such that the first end surface (upper end surface) 22e is spaced apart from the lower surface of the third extended portion 96 of the connection terminal 20. Consequently, the size of the insulator 22 is able to be reduced so as to reduce the cost.

In the multilayer ceramic electronic component 10A having the above-described structure, because the first multilayer ceramic electronic component body 12 and the second multilayer ceramic electronic component body 14 are connected in series, the voltage applied to each of the first multilayer ceramic electronic component body 12 and the second multilayer ceramic electronic component body 14 is decreased, and the high withstand voltage is able to be achieved.

As compared to the disposition of the conventional multilayer ceramic electronic components side by side on the mounting substrate, a mounting area is able to be reduced when the single multilayer ceramic electronic component 10A according to a preferred embodiment of the present invention is disposed on the mounting substrate. In the monolithic ceramic electronic component 10A, the acquired electrostatic capacitance is increased with respect to the mounting area as compared to the multilayer ceramic electronic component described in Patent Application Laid-Open No. 2003-272946 having the configuration in which the plurality of capacitors are connected in the ceramic laminated body. Thus, the acquired capacitance is secured and the reduction of the mounting area is able to be achieved in the multilayer ceramic electronic component 10A.

Second Preferred Embodiment

Figure 26:
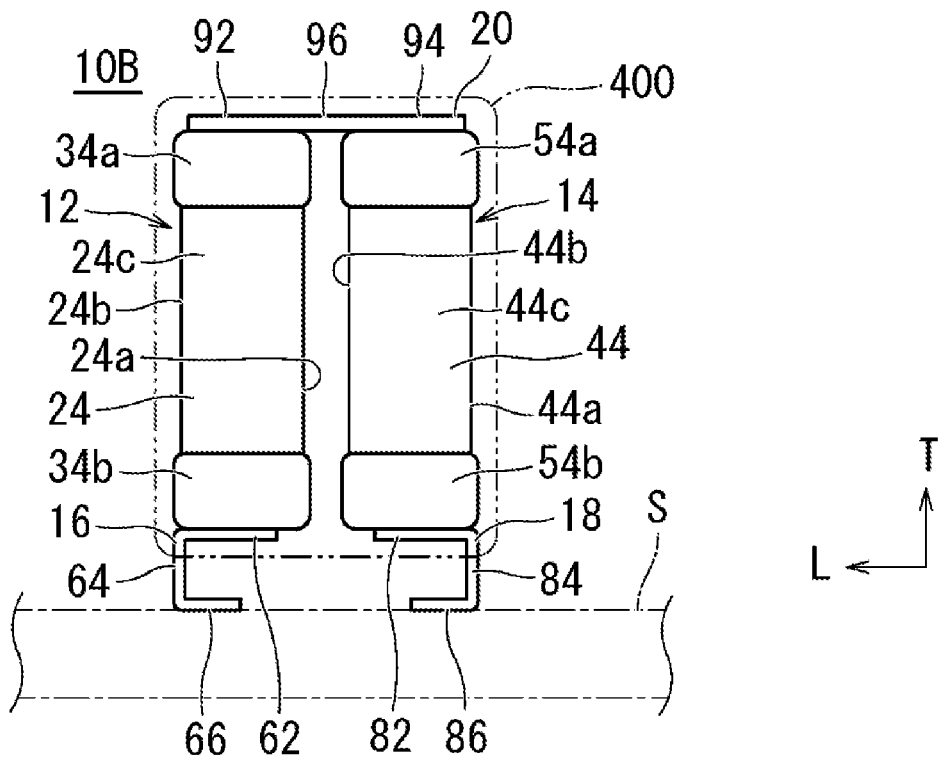
FIG. 26 is a front view illustrating a multilayer ceramic electronic component according to a second preferred embodiment of the present invention.

A multilayer ceramic electronic component according to a second preferred embodiment of the present invention will be described. FIG. 26 is a front view illustrating the multilayer ceramic electronic component of the second preferred embodiment of the present invention. A multilayer ceramic electronic component 10B of the second preferred embodiment is similar to the multilayer ceramic electronic component 10A of the first preferred embodiment in FIG. 1 except for the insulator. Thus, the same or similar portions as those of the multilayer ceramic electronic component 10A are denoted by the same reference numerals, and the description thereof is omitted.

As illustrated in FIG. 26, an insulator 400 (denoted by a two-dot chain line) is preferably a resin, for example, and the resin is disposed between the first multilayer ceramic electronic component body 12 and the second multilayer ceramic electronic component body 14, and disposed so as to cover the first multilayer ceramic electronic component body 12, the second multilayer ceramic electronic component body 14, a portion (first terminal bonding portion 62) of the first metal terminal 16, a portion (second terminal bonding portion 82) of the second metal terminal 18, and the connection terminal 20 (hereinafter, referred to as exterior resin 400).

In the case in which the first metal terminal 16 and the second metal terminal 18 are a plate-shaped frame terminal, the bonding using the solder or the conductive adhesive is ensured, and surface mounting is able to be performed.

In the multilayer ceramic electronic component 10B having the above-described configuration, the exterior resin 400 is only slightly larger than the width dimensions of the first multilayer ceramic electronic component body 12 and the second multilayer ceramic electronic component body 14, so that the size of the multilayer ceramic electronic component 10B is able to be reduced.

The edge-surface discharges of the second external electrode 34b and the fourth external electrode 54b are prevented by using the exterior resin 400. The multilayer ceramic electronic component 10B is covered with the resin, so that a gas (such as sulfur) corrosion resistance is improved. The bonding unit between the first metal terminal 16 and the second external electrode 34b and the bonding unit between the second metal terminal 18 and the fourth external electrode 54b are covered with the resin, so that physical bonding stability and the heat resistance of the bonding unit are improved.

Figure 27:
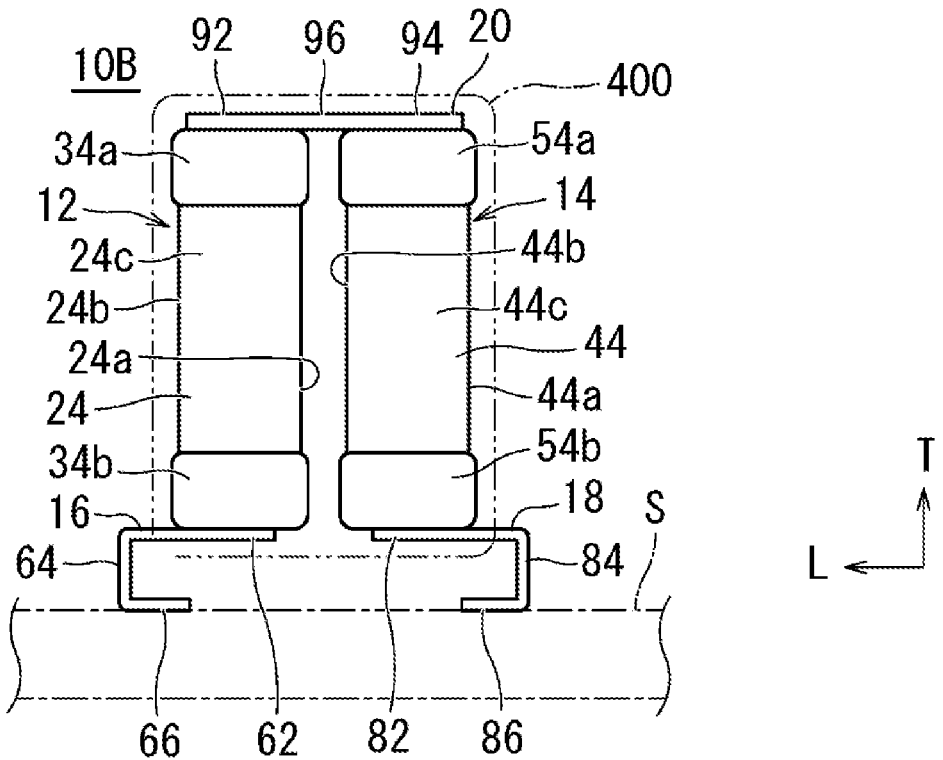
FIG. 27 is a front view of a multilayer ceramic electronic component for illustrating a modification of the metal terminal in FIG. 26.

As illustrated in FIG. 27, the first metal terminal 16 and the second metal terminal 18 are deformed such that the first extended portion 64 and the second extended portion 84 are exposed and extend from a side portion of the exterior resin 400, so that a creeping distance between the first mounting portion 66 of the first metal terminal 16 and the second mounting portion 86 of the second metal terminal 18 is able to be lengthened to prevent the edge-surface discharge.

Figure 28:
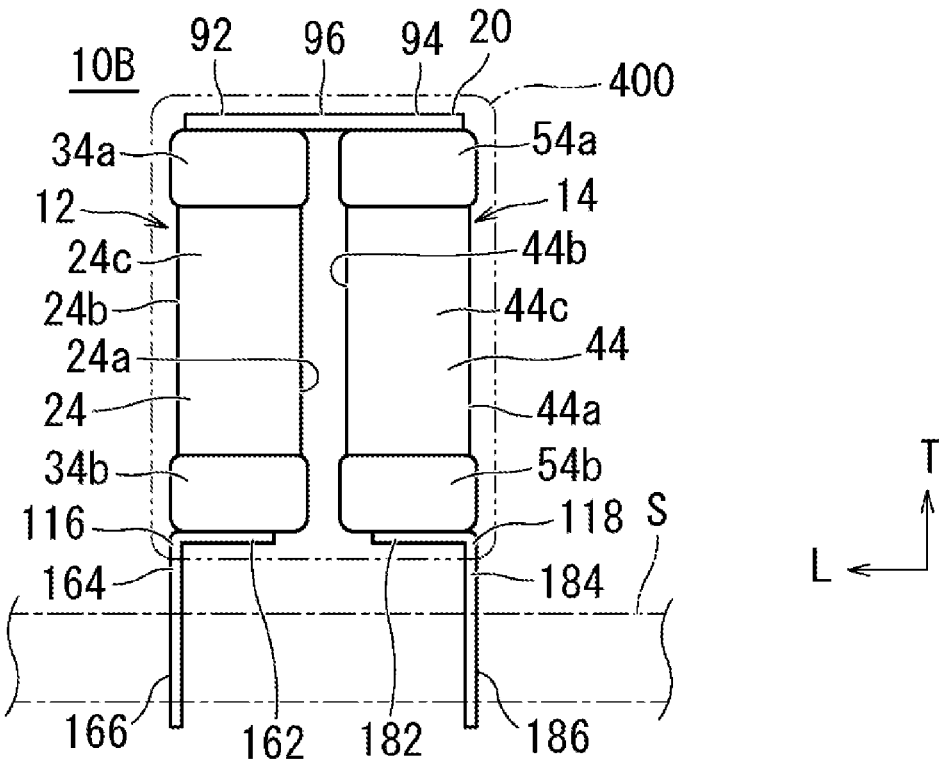
FIG. 28 is a front view of a multilayer ceramic electronic component for illustrating another modification of the metal terminal in FIG. 26.

The first metal terminal 116 and the second metal terminal 118 in FIG. 28 are provided as another example of the first metal terminal 16 and the second metal terminal 18 in FIG. 26. Because the first metal terminal 116 and the second metal terminal 118 is already described with reference to FIG. 24, the detailed description is omitted.

The exterior resin 400 is disposed between the first multilayer ceramic electronic component body 12 and the second multilayer ceramic electronic component body 14, and disposed so as to cover the first multilayer ceramic electronic component body 12, the second multilayer ceramic electronic component body 14, a portion (first terminal bonding portion 162) of the first metal terminal 116, a portion (second terminal bonding portion 182) of the second metal terminal 118, and the connection terminal 20.

In the case in which the first metal terminal 116 and the second metal terminal 118 are lead terminals, the first mounting portion 166 and the second mounting portion 186 are inserted into through holes of the mounting substrate S, and the multilayer ceramic electronic component 10B is able to be inserted and mounted.

Figure 29:
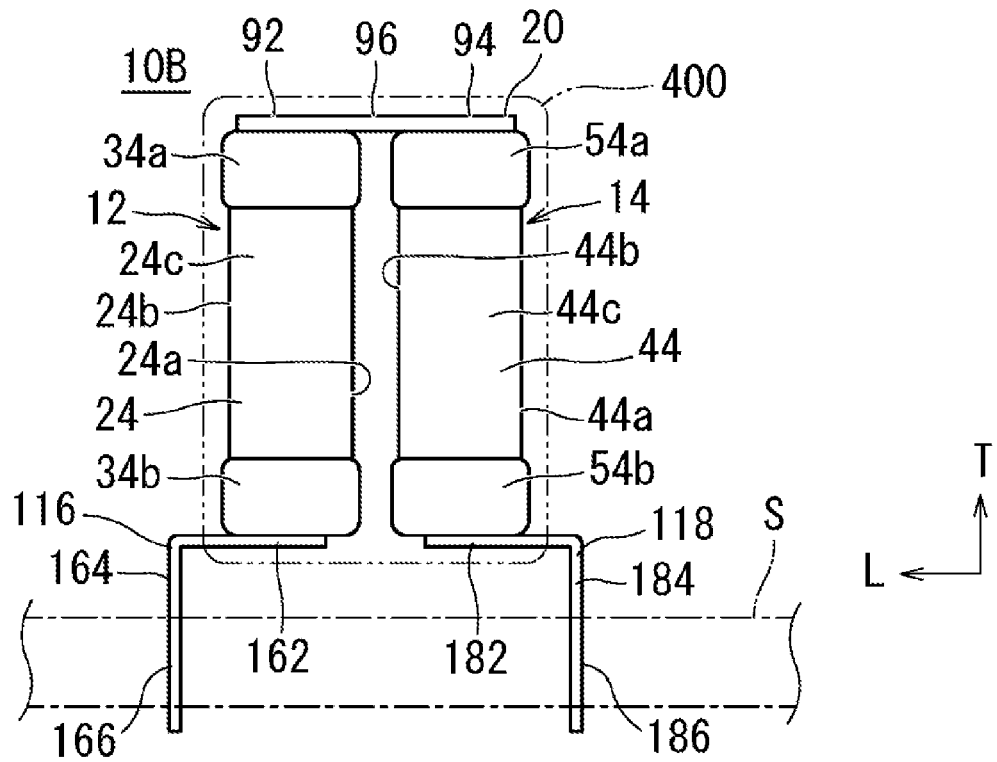
FIG. 29 is a front view of a multilayer ceramic electronic component for illustrating still another modification of the metal terminal illustrated in FIG. 26.

As illustrated in FIG. 29, the first metal terminal 116 and the second metal terminal 118 are deformed such that the first extended portion 164 and the second extended portion 184 are exposed and extend from the side portion of the exterior resin 400, so that the creeping distance between the first metal terminal 116 and the second metal terminal 118 is able to be lengthened to prevent the edge-surface discharge.

Third Preferred Embodiment

Figure 30:
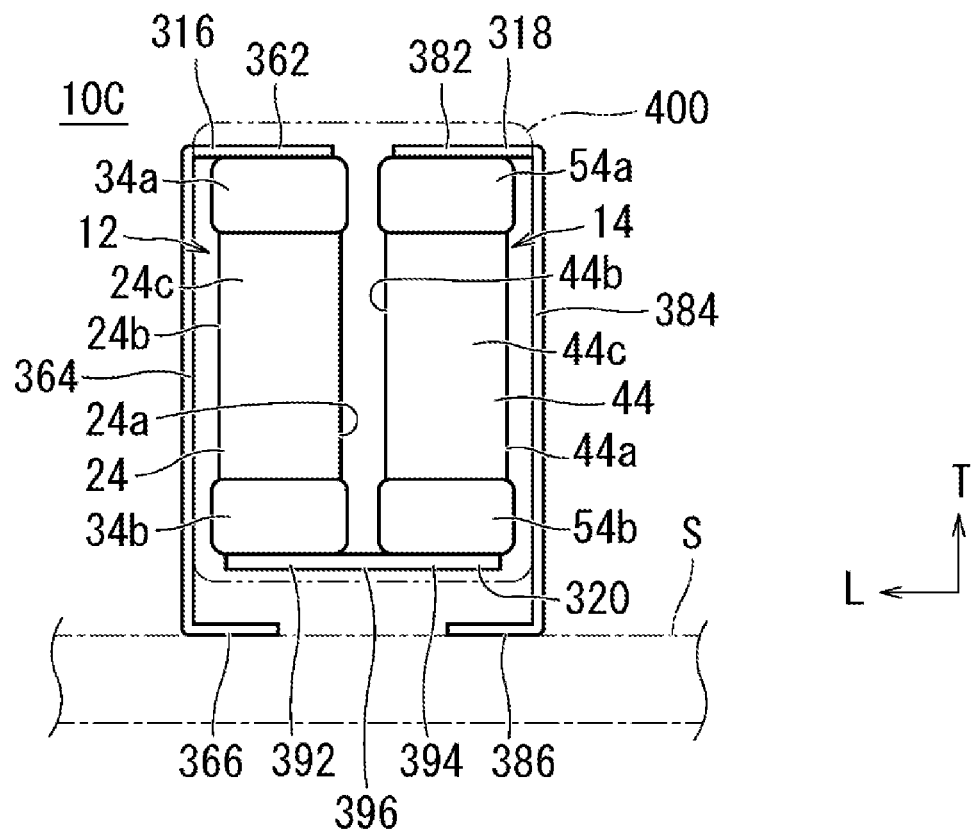
FIG. 30 is a front view illustrating a multilayer ceramic electronic component according to a third preferred embodiment of the present invention.

A multilayer ceramic electronic component according to a third preferred embodiment of the present invention will be described. FIG. 30 is a front view illustrating the multilayer ceramic electronic component of the third preferred embodiment of the present invention. A multilayer ceramic electronic component 10C of the third preferred embodiment is similar to the multilayer ceramic electronic component 10B of the second preferred embodiment in FIG. 26 except for the metal terminal and the connection terminals. Therefore, the same or similar portions as those of the multilayer ceramic electronic component 10B are denoted by the same reference numerals, and the description thereof is omitted.

As illustrated in FIG. 30, a first metal terminal 316 is connected to the first external electrode 34a of the first multilayer ceramic electronic component body 12 using a bonding material. The second metal terminal 318 is connected to the third external electrode 54a of the second multilayer ceramic electronic component body 14 using a bonding material. The first metal terminal 316 and the second metal terminal 318 are provided to mount the multilayer ceramic electronic component 10C on the mounting substrate S.

A connection terminal 320 is connected across the second external electrode 34b of the first multilayer ceramic electronic component body 12 and the fourth external electrode 54b of the second multilayer ceramic electronic component body 14 using a bonding material. The connection terminal 320 is provided to connect the first multilayer ceramic electronic component body 12 and the second multilayer ceramic electronic component body 14 in series. Consequently, the first laminated body 24 and the second laminated body 44 are mounted on the mounting substrate S while being connected in series, so that the advantageous effect of improving the withstand voltage of the multilayer ceramic electronic component 10C is able to be obtained.

The first metal terminal 316 includes a first terminal bonding portion 362 connected to the first external electrode 34a of the first multilayer ceramic electronic component body 12, a first extended portion 364 that is connected to the first terminal bonding portion 362 and extends in the direction of the mounting surface such that a gap is provided between the first multilayer ceramic electronic component body 12 and the mounting surface of the mounting substrate S, and a mounting portion 366 that is connected to the first extended portion 364 and extends onto the side of the first multilayer ceramic electronic component body 12 in the direction connecting the second external electrode 34b and the fourth external electrode 54b (that is, extends from the first extending portion 364 in parallel or substantially in parallel to the mounting surface of the mounting substrate S).

The second metal terminal 318 includes a second terminal bonding portion 382 connected to the third external electrode 54a of the second multilayer ceramic electronic component body 14, a second extended portion 384 that is connected to the second terminal bonding portion 382 and extends in the direction of the mounting surface such that a gap is provided between the multilayer ceramic electronic component body 14 and the mounting surface of the mounting substrate S, and a second mounting portion 386 that is connected to the second extended portion 384 and extends onto the side of the second multilayer ceramic electronic component body 14 in the direction connecting the second external electrode 34b and the fourth external electrode 54b (that is, extends from the second extended portion 384 in parallel or substantially in parallel to the mounting surface of the mounting substrate S).

The connection terminal 320 includes a third terminal bonding portion 392 connected to the second external electrode 34b of the first multilayer ceramic electronic component body 12, a fourth terminal bonding portion 394 connected to the fourth external electrode 54b of the second multilayer ceramic electronic component body 14, and a third extended portion 396 that is connected to the third terminal bonding portion 392 and the fourth terminal bonding portion 394 and located between the second external electrode 34b and the fourth external electrode 54b to extend in the direction connecting the second external electrode 34b and the fourth external electrode 54b.

The first terminal bonding portion 362 of the first metal terminal 316 is connected to the first external electrode 34a disposed on the first end surface 24e of the first laminated body 24 using a bonding material (not illustrated). The first terminal bonding portion 362 preferably has a plate shape.

The second terminal bonding portion 382 of the second metal terminal 318 is connected to the third external electrode 54a disposed on the third end surface 44e of the second laminated body 44 using a bonding material (not illustrated). The second terminal bonding portion 382 preferably has a plate shape.

The third terminal bonding portion 392 of the connection terminal 320 is connected to the second external electrode 34b disposed on the second end surface 24f of the first laminated body 24 using a bonding material (not illustrated). The third terminal bonding portion 392 preferably has a plate shape.

The fourth terminal bonding portion 394 of the connection terminal 320 is connected to the fourth external electrode 54b disposed on the fourth end surface 44f of the second laminated body 44 using a bonding material (not illustrated). The fourth terminal bonding portion 394 preferably has a plate shape.

The first extended portion 364 of the first metal terminal 316 slightly extends outward from the first terminal bonding portion 362 on the extension line of the first terminal bonding portion 362 to be extended out to the side portion of the exterior resin 400 such that a gap is provided between the first extended portion 364 and the second main surface 24b of the first multilayer ceramic electronic component body 12, namely, such that the first extended portion 364 does not contact the second external electrode 34b disposed on the second main surface 24b of the first laminated body 24. The first extended portion 364 is bent at right angles on the surface of the insulator, extends along the side portion in the direction of the mounting surface such that a gap is provided between the first multilayer ceramic electronic component body 12 and the mounting surface of the mounting substrate S, and is connected to the first mounting portion 366.

The first extended portion 364 extends in a direction parallel or substantially parallel to the first main surface 24a or the second main surface 24b of the first laminated body 24. In other words, the first extended portion 364 intersects the first terminal bonding portion 362 and the first mounting portion 366 substantially at right angles. However, the first extended portion 364 may be inclined with respect to the first main surface 24a or the second main surface 24b of the first laminated body 24.

The second extended portion 384 of the second metal terminal 318 slightly extends outward from the first terminal bonding portion 382 on the extension line of the first terminal bonding portion 382 to be extended out to the side portion of the exterior resin 400 such that a gap is provided between the second extended portion 384 and the first main surface 44a of the second multilayer ceramic electronic component body 14, namely, such that the second extended portion 384 does not contact the fourth external electrode 54b disposed on the first main surface 44e of the second laminated body 44. The first extended portion 384 is bent at right angles on the surface of the insulator, extends along the side portion in the direction of the mounting surface such that a gap is provided between the second multilayer ceramic electronic component body 14 and the mounting surface of the mounting substrate S, and is connected to the second mounting portion 386.

The second extended portion 384 extends in a direction parallel or substantially parallel to the third main surface 44a or the fourth main surface 44b of the second laminated body 44. In other words, the second extended portion 384 intersects the second terminal bonding portion 382 and the second mounting portion 386 substantially at right angles. However, the second extended portion 384 may be inclined with respect to the third main surface 44a or the fourth main surface 44b of the second laminated body 44.

The first extended portion 364 of the first metal terminal 316 and the second extended portion 384 of the second metal terminal 318 are used to space the first multilayer ceramic electronic component body 12 and the second multilayer ceramic electronic component body 14 away from the mounting substrate S on which the multilayer ceramic electronic component 10C is mounted. Consequently, a stress caused by a difference in thermal expansion coefficient between the mounting substrate S and the multilayer ceramic electronic component 10C, a stress caused by deflection of the mounting substrate S, or a mechanical distortion generated in the dielectric layer due to application of voltage is able to be absorbed by elastic deformation of the first extended portion 364 and the second extended portion 384. As a result, problems such as a crack generated in the first multilayer ceramic electronic component body 12 and the second multilayer ceramic electronic component body 14 and the first external electrode 34a being peeled off from the first multilayer ceramic electronic component body 12 are able to be prevented, and generation of a noise (squeal) is able to be reduced by reducing or preventing transmission of vibration to the mounting substrate S through the first metal terminal 316 and the second metal terminal 318.

The third extended portion 396 of the connection terminal 320 is connected to the third terminal bonding portion 392 and the fourth terminal bonding portion 394, and extends such that a gap is provided between the first multilayer ceramic electronic component body 12 and the second multilayer ceramic electronic component body 14.

The first mounting portion 366 of the first metal terminal 316 is connected to the first extended portion 364, and mounted on the mounting substrate S. Specifically, the first mounting portion 366 is bent from the terminal end of the first extended portion 364, and extends so as to be parallel or substantially parallel to the mounting surface.

The second mounting portion 386 of the second metal terminal 318 is connected to the second extended portion 384, and mounted on the mounting substrate S. Specifically, the second mounting portion 386 is bent from the terminal end of the second extended portion 384, and extends so as to be parallel or substantially parallel to the mounting surface.

In the third preferred embodiment, the first metal terminal 316, the second metal terminal 318, and the connection terminal 320 are preferably a plate-shaped frame terminal. Consequently, the bonding using the solder or the conductive adhesive is ensured, and surface mounting is able to be performed. However, the connection terminal 20 may be a lead terminal.

The first metal terminal 316 and the second metal terminal 318 preferably have a substantially U-shape in cross section. Thus, between the first external electrode 34a and the first metal terminal 316, between the third external electrode 54a and the second metal terminal 318, and between the mounting substrate S and the first metal terminal 316 and the second metal terminal 318, the bonding area is increased, the contact resistance is decreased, and the physical bonding is ensured. As a result, resistance to the deflection of the mounting substrate S is able to be improved when the multilayer ceramic electronic component 10C is mounted on the mounting substrate S. The shapes of the first metal terminal 316 and the second metal terminal 318 are not limited as long as the resistance to the deflection of the mounting substrate S is able to be improved.

Fourth Preferred Embodiment

Figure 31:
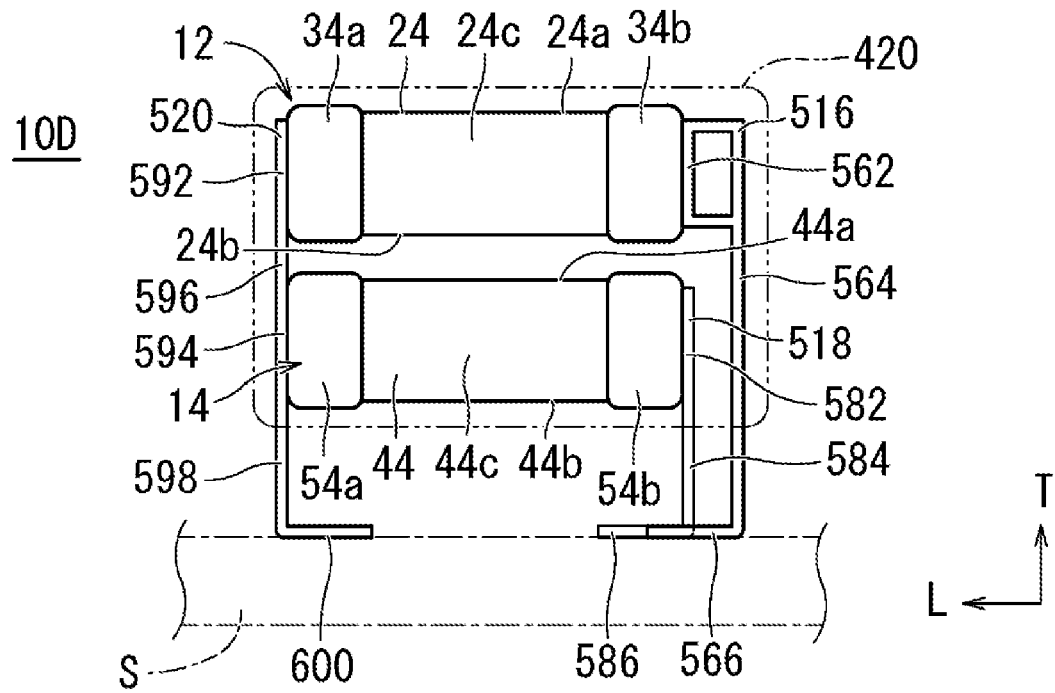
FIG. 31 is a front view illustrating a multilayer ceramic electronic component according to a fourth preferred embodiment of the present invention.
Figure 32:
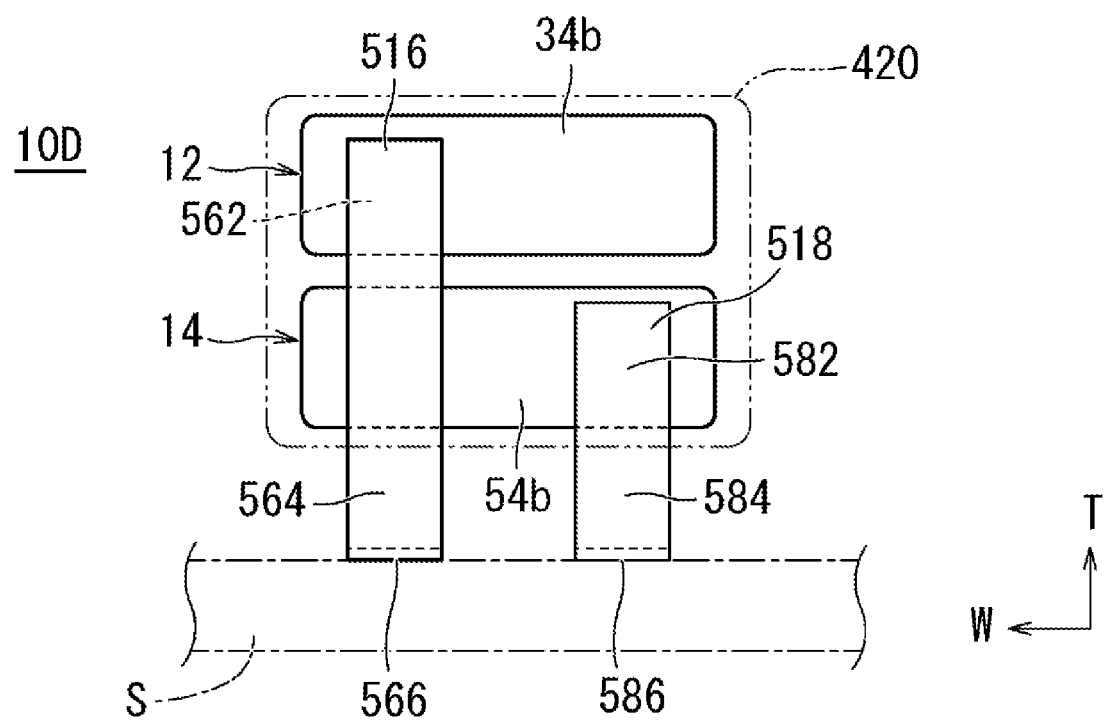
FIG. 32 is a side view of the multilayer ceramic electronic component in FIG. 31.
Figure 33A:
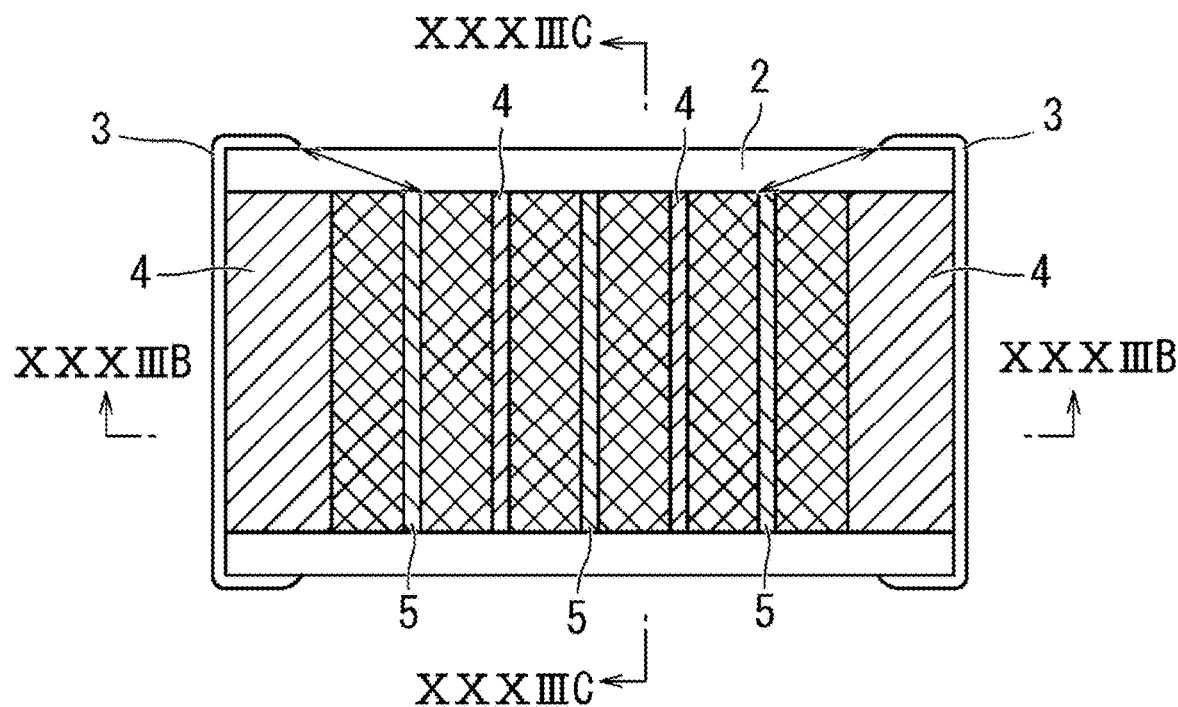
FIGS. 33A to 33C are cross-sectional views illustrating conventional multilayer ceramic electronic components.
Figure 33B:
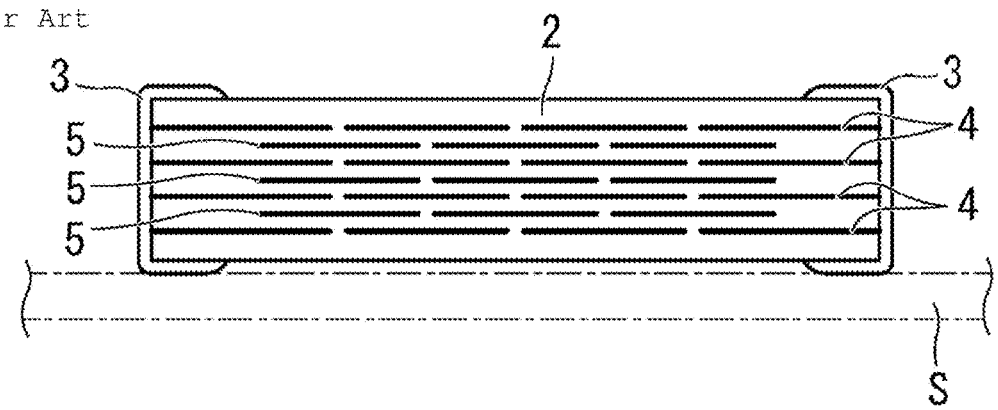
Figure 33C:
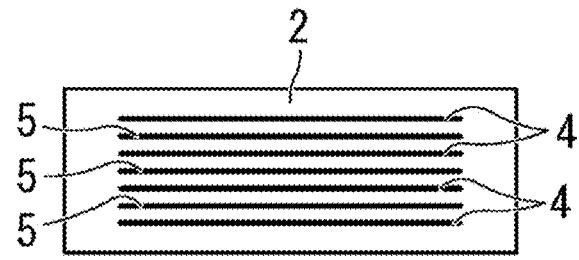

A multilayer ceramic electronic component according to a fourth preferred embodiment of the present invention will be described. FIG. 31 is a front view illustrating the multilayer ceramic electronic component of the fourth preferred embodiment of the present invention. FIG. 32 is a side view of the multilayer ceramic electronic component in FIG. 31. In a multilayer ceramic electronic component 10D of the fourth preferred embodiment, the same or similar components and portions as those of the multilayer ceramic electronic component 10A of the first preferred embodiment in FIG. 1 are denoted by the same reference numerals, and the description thereof is omitted.

As illustrated in FIG. 31, the multilayer ceramic electronic component 10D includes the first multilayer ceramic electronic component body 12, the second multilayer ceramic electronic component body 14, a first metal terminal 516, a second metal terminal 518, a connection terminal 520, and an insulator 420.

The first multilayer ceramic electronic component body includes a rectangular or substantially rectangular parallelepiped first laminated body 24, a first external electrode 34a, and a second external electrode 34b. The second multilayer ceramic electronic component body 14 includes a rectangular or substantially rectangular parallelepiped second laminated body 44, a third external electrode 54a, and a fourth external electrode 54b.

The first multilayer ceramic electronic component body (upper stage) and the second multilayer ceramic electronic component body 14 (lower stage) are vertically disposed with respect to the height direction T of the multilayer ceramic electronic component 10D. In the first multilayer ceramic electronic component body 12, the first main surface 24a, the second main surface 24b, the first side surface 24c, or the second side surface 24d of the first laminated body 24 faces the mounting surface. In the second multilayer ceramic electronic component body 14, the third main surface 44a, the fourth main surface 44b, the third side surface 44c, or the fourth side surface 44d of the second laminated body 44 faces the mounting surface. In the fourth preferred embodiment, the second main surface 24b of the first multilayer ceramic electronic component body 12 and the fourth main surface 44b of the second multilayer ceramic electronic component body 14 face the mounting surface of the mounting substrate S on which the multilayer ceramic electronic component 10D is mounted. Thus, the multilayer ceramic electronic component 10D is mounted on the mounting substrate S while the first multilayer ceramic electronic component body 12 and the second multilayer ceramic electronic component body 14 are in a horizontally disposed state. As used herein, the horizontally disposed state means a state in which the length direction x of the first multilayer ceramic electronic component body 12 and the second multilayer ceramic electronic component body 14 is perpendicular or substantially perpendicular to the height direction T of the multilayer ceramic electronic component 10D.

The first metal terminal 516 is connected to the second external electrode 34b, and the second metal terminal 518 is connected to the fourth external electrode 54b. The connection terminal 520 is connected across the first external electrode 34a and the third external electrode 54a. The first metal terminal 516 and the second metal terminal 518 are spaced apart from each other in the width direction W so as not to contact with each other.

The first metal terminal 516 and the second metal terminal 518 are provided to mount the multilayer ceramic electronic component 10D on the mounting substrate S.

The third metal terminal 520 is provided to connect the first multilayer ceramic electronic component body 12 and the second multilayer ceramic electronic component body 14 in series and to mount the multilayer ceramic electronic component 10D on the mounting substrate S. Consequently, the first laminated body 24 and the second laminated body 44 are mounted on the mounting substrate S and connected in series, so that the advantageous effect of improving the withstand voltage of the multilayer ceramic electronic component 10D is able to be obtained.

The first metal terminal 516 includes a first terminal bonding portion 562 connected to the second external electrode 34b of the first multilayer ceramic electronic component body 12, a first extended portion 564 that is connected to the first terminal bonding portion 562 and extends in the direction of the mounting surface such that a gap is provided between the first multilayer ceramic electronic component body 12 and the mounting surface of the mounting substrate S, and a mounting portion 566 that is connected to the first extended portion 564 and extends onto the side of the first multilayer ceramic electronic component body 12 in the direction perpendicular or substantially perpendicular to the direction connecting the second external electrode 34b and the fourth external electrode 54b (that is, extends from the first extending portion 564 in parallel or substantially in parallel to the mounting surface of the mounting substrate S).

The second metal terminal 518 includes a second terminal bonding portion 582 connected to the fourth external electrode 54a of the second multilayer ceramic electronic component body 14, a second extended portion 584 that is connected to the second terminal bonding portion 582 and extends in the direction of the mounting surface such that a gap is provided between the multilayer ceramic electronic component body 14 and the mounting surface of the mounting substrate S, and a second mounting portion 586 that is connected to the second extended portion 584 and extends onto the side of the second multilayer ceramic electronic component body 14 in the direction perpendicular or substantially perpendicular to the direction connecting the second external electrode 34b and the fourth external electrode 54b (that is, extends from the second extended portion 584 in parallel or substantially in parallel to the mounting surface of the mounting substrate S).

The connection terminal 520 includes a third terminal bonding portion 592 connected to the first external electrode 34a of the first multilayer ceramic electronic component body 12, a fourth terminal bonding portion 594 connected to the third external electrode 54a of the second multilayer ceramic electronic component body 14, a third extended portion 596 that is connected to the third terminal bonding portion 592 and the fourth terminal bonding portion 594 and located between the first external electrode 34a and the third external electrode 54a to extend in the direction connecting the first external electrode 34a and the third external electrode 54a, and a fourth extended portion 598 that is connected to the fourth terminal bonding portion 594 and extends in the direction of the mounting surface such that a gap is provided between the second multilayer ceramic electronic component body 14 and the mounting surface of the mounting substrate S, and a third mounting portion 600 that is connected to the fourth extended portion 598 and extends onto the side of the second multilayer ceramic electronic component body 14 in the direction perpendicular or substantially perpendicular to the direction connecting the first external electrode 34a and the third external electrodes 54a (that is, extends from the fourth extended portion 598 to in parallel or substantially in parallel to the mounting surface of the mounting substrate S).

The first terminal bonding portion 562 of the first metal terminal 516 is connected to the second external electrode 34b disposed on the second end surface 24f of the first laminated body 24 using a bonding material (not illustrated). The first terminal bonding portion 562 preferably has a plate shape.

The second terminal bonding portion 582 of the second metal terminal 518 is connected to the fourth external electrode 54b disposed on the fourth end surface 44f of the second laminated body 44 using a bonding material (not illustrated). The second terminal bonding portion 582 preferably has a plate shape.

The third terminal bonding portion 592 of the connecting terminal 520 is connected to the first external electrode 34a disposed on the first end surface 24e of the first laminated body 24 using a bonding material (not illustrated). The third terminal bonding portion 592 preferably has a plate shape.

The fourth terminal bonding portion 594 of the connecting terminal 520 is connected to the third external electrode 54a disposed on the third end surface 44e of the second laminated body 44 using a bonding material (not illustrated). The fourth terminal bonding portion 594 preferably has a plate shape.

The first extended portion 564 of the first metal terminal 516 slightly extends outward in the direction connecting the first external electrode 34a and the second external electrode 34b from the first terminal bonding portion 562 such that a gap is provided between the he first extended portion 564 and the fourth end surface 44f of the second multilayer ceramic electronic component body 14, namely, such that the first extended portion 564 does not contact with the second external electrode 54b disposed on the fourth end surface 44f of the second laminated body 44, to be bent at right angles and extends in the direction of the mounting surface such that a gap is provided between the second multilayer ceramic electronic component body 14 disposed in a lower stage and the mounting surface of the mounting substrate S, and is connected to the first mounting portion 566.

The first extended portion 564 extends in a direction parallel or substantially parallel to the first end surface 24e or the second end surface 24f of the first laminated body 24. In other words, the first extended portion 564 extends so as to be parallel or substantially parallel to the first terminal bonding portion 562 and to intersect the first mounting portion 566 substantially at right angles.

The second extended portion 584 of the second metal terminal 518 extends from the first terminal bonding portion 582 in the mounting surface direction on the extension line of the first terminal bonding portion 582 so that a gap is provided between the second multilayer ceramic electronic component body 14 and the mounting surface of the mounting substrate S, and is connected to the second mounting portion 586. The second extended portion 584 extends in a direction parallel or substantially parallel to the third end surface 44e or the fourth end surface 44f of the second laminated body 44. In other words, the second extended portion 584 intersects the second mounting portion 586 substantially at right angles.

The third extended portion 596 of the connection terminal 520 is connected to the third terminal bonding portion 592 and the fourth terminal bonding portion 594, extends such that a gap is provided between the first multilayer ceramic electronic component body 12 and the second multilayer ceramic electronic component body 14.

The fourth extended portion 598 of the connection terminal 520 extends from the fourth terminal bonding portion 594 in the direction of the mounting surface on the extension line of the fourth terminal bonding portion 594 such that a gap is provided between the second multilayer ceramic electronic component body 14 and the mounting surface of the mounting substrate S, and is connected to the third mounting portion 600.

The first extended portion 564 of the first metal terminal 516, the second extended portion 584 of the second metal terminal 518, and the fourth extended portion 598 of the connection terminal 520 are used to space the first multilayer ceramic electronic component body 12 and the second multilayer ceramic electronic component body 14 away from the mounting substrate S on which the multilayer ceramic electronic component 10D is mounted. Consequently, a stress caused by a difference in thermal expansion coefficient between the mounting substrate S and the multilayer ceramic electronic component 10D, a stress caused by deflection of the mounting substrate S, or the mechanical distortion generated in the dielectric layer due to the application of the voltage is able to be absorbed by the elastic deformation of the first extended portion 564, the second extended portion 584, and the fourth extended portion 598. As a result, problems such as a crack generated in the first multilayer ceramic electronic component body 12 and the second multilayer ceramic electronic component body 14 and the second external electrode 34b being peeled off from the first multilayer ceramic electronic component body 12 are able to be prevented, and generation of a noise (squeal) is able to be reduced by reducing or preventing transmission of vibration to the mounting substrate S through the first metal terminal 516, the second metal terminal 518, and the connection terminal 520.

The first mounting portion 566 of the first metal terminal 516 is connected to the first extended portion 564, and mounted on the mounting substrate S. Specifically, the first mounting portion 566 is bent from the terminal end of the first extended portion 564, and extends so as to be parallel or substantially parallel to the mounting surface.

The second mounting portion 586 of the second metal terminal 518 is connected to the second extended portion 584, and mounted on the mounting substrate S. Specifically, the second mounting portion 586 is bent from the terminal end of the second extended portion 584, and extends so as to be parallel or substantially parallel to the mounting surface.

The third mounting portion 600 of the connection terminal 520 is connected to the fourth extended portion 598, and mounted on the mounting substrate S. Specifically, the third mounting portion 600 is bent from the terminal end of the fourth extended portion 598, and extends so as to be parallel or substantially parallel to the mounting surface.

In the fourth preferred embodiment, the first metal terminal 516, the second metal terminal 518, and the connection terminal 520 are preferably plate-shaped frame terminals. Consequently, the bonding using the solder or the conductive adhesive is ensured, and surface mounting is able to be performed.

The first metal terminal 516, the second metal terminal 518, and the connection terminal 520 preferably have an L-shape or a substantially L-shape in cross section, for example. Thus, between the first external electrode 34a and the third external electrode 54a and the connection terminal 520, between the second external electrode 34b and the first metal terminal 516, between the fourth external electrode 54b and the second metal terminal 518, and between the mounting substrate S and the first metal terminal 516, the second metal terminal 518, and the connection terminal 520, the bonding area is increased, the contact resistance is decreased, and the physical bonding is ensured. As a result, resistance to the deflection of the mounting substrate S is able to be improved when the multilayer ceramic electronic component 10C is mounted on the mounting substrate S.

The insulator 420 (indicated by a two-dot chain line) is preferably a resin, for example, and the resin is disposed between the first multilayer ceramic electronic component body 12 and the second multilayer ceramic electronic component body 14, and covers the first multilayer ceramic electronic component body 12, the second multilayer ceramic electronic component body 14, a portion (a portion of the first terminal bonding portion 562 and a portion of the first extended portion 564) of the first metal terminal 516, a portion (a portion of the second terminal bonding portion 582 and a portion of the second extended portion 584) of the second metal terminal 518, and a portion (a portion of the third terminal bonding portion 592, a portion of the fourth terminal bonding portion 594, a portion of the third extended portion 596 and a portion of the fourth extended portion 598) of the third metal terminal 520 (hereinafter, referred to as exterior resin 420).

In the multilayer ceramic electronic component 10D having the above-described configuration, the exterior resin 420 is only slightly larger than the width dimensions of the first multilayer ceramic electronic component body 12 and the second multilayer ceramic electronic component body 14, so that the size of the multilayer ceramic electronic component 10D is able to be reduced.

The edge-surface discharges of the second external electrode 34b and the fourth external electrode 54b are prevented by using the exterior resin 420. The multilayer ceramic electronic component 10D is covered with the resin, so that the gas (such as sulfur) corrosion resistance is improved. The bonding unit between the first metal terminal 516 and the second external electrode 34b, the bonding unit between the second metal terminal 518 and the fourth external electrode 54b, and the bonding unit between the connection terminal 520 and the first external electrode 34a and the third external electrode 54a are covered with the resin, so that the physical bonding stability and the heat resistance of the bonding unit are improved.

A preferred embodiment of a method for manufacturing a multilayer ceramic electronic component having the above-described structure will be described below.

First, a method for manufacturing the first multilayer ceramic electronic component body 12 and the second multilayer ceramic electronic component body 14 will be described.

A dielectric green sheet and an internal electrode conductive paste for forming an internal electrode are prepared. The dielectric green sheet and the internal electrode conductive paste include a binder and a solvent, and a known organic binder or organic solvent may preferably be used.

The internal electrode conductive paste is printed on the dielectric green sheet with a predetermined pattern by, for example, a screen printing method or a gravure printing method, and an internal electrode pattern is formed.

Subsequently, a predetermined number of dielectric green sheets for outer layers on which the internal electrode pattern is not printed are laminated, the dielectric green sheet on which the internal electrode pattern is printed is sequentially laminated on the dielectric green sheets for outer layers, and a predetermined number of dielectric layers for outer layers are laminated to produce a laminated sheet.

Subsequently, the laminated sheet is pressed in the laminating direction by isostatic pressing to prepare a laminated block.

Subsequently, the laminated block is cut into a predetermined shape having predetermined dimensions, and a raw laminated chip is cut out. At this point, a corner and a ridge of the raw laminated body may be rounded by barrel polishing or other suitable method. Subsequently, the cut raw laminated chip is fired to produce the laminated body. A firing temperature of the raw laminated chip depends on the material of the dielectric or the internal electrode conductive paste, but preferably the firing temperature is in a range of about 900° C. to about 1300° C., for example.

Subsequently, in order to form a baking layer of the external electrode, an external electrode conductive paste is applied to both end surfaces of the laminated body, and baked to form the baking layer of the external electrode. At this point, preferably the baking temperature is in a range of about 700° C. to about 900° C., for example. As necessary, at least one plating layer is formed on the surface of the baking layer, and the external electrode is formed to manufacture the multilayer ceramic electronic component.

Instead of forming the baking layer as the external electrode, a plating treatment may be directly applied on the surface of the laminated body to form an underlying plating film on the exposed portion of the internal electrode exposed from the end surface. Either electrolytic plating or electroless plating may be used as the plating treatment. However, in the electroless plating, a pretreatment with a catalyst, for example, is required in order to improve a plating deposition rate, and disadvantageously the process becomes complicated. Thus, usually the electrolytic plating is preferably used. Preferably, barrel plating is used as the plating method.

In the case in which a portion of the conductor of the external electrode is formed on the main surface of the laminated body, a surface conductor pattern may previously be printed on the dielectric green sheet of the outermost layer, and simultaneously fired together with the laminated body, or the surface conductors may be printed on the main surface of the fired laminated body, and then baked. As necessary, the upper plating layer is formed on the surface of the underlying plating film.

In this manner, a plating electrode is formed on the end surface of the laminated body.

A method for attaching the first metal terminal, the second metal terminal, and the connection terminal (hereinafter, referred to as metal terminal) to the laminated body will be described below.

The external terminal having a predetermined form is prepared. The first metal terminal and the second metal terminal are formed by bending. At this point, in the first preferred embodiment, the insulator 22 is prepared, the adhesive, such as the solder, for example, is applied to the insulator 22, the external electrode of the laminated body, or the terminal bonding portion of the metal terminal, and the insulator 22 is provided between the first multilayer ceramic electronic component body 12 and the second multilayer ceramic electronic component body 14, while the external electrode and the metal terminal are bonded to each other. In the case in which the solder is used as the adhesive, reflow is performed after the application of the solder, and the metal terminal is attached to the laminated body.

In the second to fourth preferred embodiments, the exterior resin is used to define and function as the insulator 22 of the first preferred embodiment, and the resin is molded and prepared by a transfer molding method. That is, after the laminated body to which the metal terminal is attached is placed in the mold, a thermosetting resin is injected into the mold while a pressure ranging from about 130° C. to about 150° C., for example, is applied. Subsequently, the thermosetting resin is cured at a temperature in a range of about 170° C. to about 190° C., for example. Subsequently, the mold is removed, and the multilayer ceramic electronic component having the exterior resin is taken out.

Samples of a multilayer ceramic capacitor were prepared, evaluation was performed to verify the improvement of the withstand voltage, and a dielectric breakdown voltage was measured.

An example and comparative examples were designed as follows.

In the Example, the multilayer ceramic electronic component 10A of the first preferred embodiment in FIGS. 1 to 8 was manufactured and evaluated. The multilayer ceramic capacitors of the following designs were used as the first multilayer ceramic electronic component body 12 and the second multilayer ceramic electronic component body 14.

Length×width×height size (design value): about 5.7 mm×about 5.0 mm×about 2.7 mm

Dielectric (ceramic) material: $BaTiO_3$

Structure of internal electrode

Metal: Ni

As illustrated in FIG. 6, only the first internal electrode and the second internal electrode are provided, and the laminated body includes one capacitor.

Structure of external electrode

Underlying electrode layer: baked electrode containing conductive metal (Cu) and glass Plating layer: two-layer structure of Ni plating layer and Sn plating layer Structure of metal terminal Terminal body: SUS 430

Lower layer plating: Cu

Upper layer plating: Sn

Capacitance: about 1000 nF

Dielectric breakdown voltage: about 900 V

In the Comparative Example 1, a conventional multilayer ceramic capacitor having the following design was manufactured and evaluated.

Length×width×height size (design value): about 5.7 mm×about 5.0 mm×about 2.7 mm

Dielectric (ceramic) material: $BaTiO_3$

Structure of internal electrode
Metal: Ni
Only the first internal electrode and the second internal electrode are provided and the laminated body includes one capacitor
Structure of external electrode
Underlying electrode layer: baked electrode containing conductive metal (Cu) and glass
Plating layer: two-layer structure of Ni plating layer and Sn plating layer
Capacitance: about 1000 nF
Dielectric breakdown voltage: 895 V
In the Comparative Example 2, a conventional multilayer ceramic capacitor having the following design was manufactured and evaluated.
Length×width×height size (design value): about 5.7 mm×about 5.0 mm×about 2.7 mm
Dielectric (ceramic) material: $BaTiO_3$
Structure of internal electrode
Metal: Ni
Similarly to FIG. 10, three kinds of internal electrodes are provided and the laminated body includes two capacitors connected in series.
Structure of external electrode
Underlying electrode layer: baked electrode containing conductive metal (Cu) and glass
Plating layer: two-layer structure of Ni plating layer and Sn plating layer
Capacitance: about 240 nF
Dielectric breakdown voltage: about 1790 V
In Comparative Example 3, a conventional multilayer ceramic capacitor having the following design was manufactured, and the evaluation was performed while the laminated ceramic capacitors connected in series were provided in the horizontally disposed state on the mounting substrate.
Length×width×height size (design value): about 5.7 mm×about 5.0 mm×about 2.7 mm
Dielectric (ceramic) material: $BaTiO_3$
Structure of internal electrode
Metal: Ni
Only the first internal electrode and the second internal electrode are provided and the laminated body includes one capacitor.
Structure of external electrode
Underlying electrode layer: baked electrode containing conductive metal (Cu) and glass
Plating layer: two-layer structure of Ni plating layer and Sn plating layer
Capacitance: about 1000 nF
Dielectric breakdown voltage: about 895 V
The voltage was applied to the prepared sample while the voltage is increased at a boosting rate of about 200 V/sec, and the voltage during passage of current exceeding the detection current of about 1 mA was measured as the dielectric breakdown voltage.
The sample was left at a temperature of about 150° C. for about 1 hour, and left at a temperature of about 25° C. for about hours. Subsequently, the electrostatic capacitance was measured under the following conditions.
Voltage: about 1 V
Frequency: about 1 kHz
DC bias: about 0 V
The dimension L and the dimension W of the sample were measured, and dimension L×dimension W was set to the mounting area.
Table 1 illustrates the evaluation result.

TABLE 1

| | Dielectric breakdown voltage | Electrostatic capacitance | Mounting surface |
|---|---|---|---|
| Example | 1795 V | 500 nF | 32.0 mm$^2$ |
| Comparative Example 1 | 895 V | 1000 nF | 28.5 mm$^2$ |
| Comparative Example 2 | 1790 V | 240 nF | 28.5 mm$^2$ |
| Comparative Example 3 | 1795 V | 500 nF | 57.0 mm$^2$ |

Table 1 shows that the Comparative Example 1 has a low dielectric breakdown voltage and cannot be used in applications in which the high withstand voltage is required for a single capacitor.

In the Comparative Example 2, although the dielectric breakdown voltage is doubled with a single capacitor, the dielectric breakdown voltage is incompatible with the capacitance.

In the Comparative Example 3, although the dielectric breakdown voltage is compatible with the electrostatic capacitance, the mounting area is increased.

On the other hand, in the multilayer ceramic capacitor 10A of the Example, the compatibility between the dielectric breakdown voltage and the electrostatic capacitance is able to be established while the increase in mounting area is prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
   a first multilayer ceramic electronic component body including:
      a first laminated body including a plurality of laminated dielectric layers and a plurality of laminated internal electrodes, the first laminated body including a first main surface and a second main surface that are opposed to each other in a laminating direction, a first side surface and a second side surface that are opposed to each other in a width direction orthogonal or substantially orthogonal to the laminating direction, and a first end surface and a second end surface that are opposed to each other in a length direction orthogonal or substantially orthogonal to the laminating direction and the width direction; and
      a first external electrode disposed on the first end surface of the first laminated body and a second external electrode disposed on the second end surface of the first laminated body;
   a second multilayer ceramic electronic component body including:
      a second laminated body including a plurality of laminated dielectric layers and a plurality of laminated internal electrodes, the second laminated body including a third main surface and a fourth main surface that are opposed to each other in the laminating direction, a third side surface and a fourth side surface that are opposed to each other in the width direction orthogonal or substantially orthogonal to the laminating direction, a third end surface and a fourth end surface that are opposed to each other in the length direction orthogonal or substantially orthogonal to the laminating direction and the width direction; and a third external electrode disposed on the third end surface of the second laminated body and a fourth external electrode disposed on the fourth end surface of the second laminated body; and a first metal terminal, a second metal terminal, and a connection terminal; wherein a dimension in the length direction of each of the first and second laminated bodies is greater than a dimension in the laminating direction and a dimension in the width direction of each of the first and second laminated bodies;

an end surface of the second external electrode and an end surface of the fourth external electrode face a mounting surface of a mounting substrate on which the first multilayer ceramic electronic component body and the second multilayer ceramic electronic component body are mounted;

the first metal terminal is connected to the second external electrode by solder, the second metal terminal is connected to the fourth external electrode by solder, and the connection terminal is connected across the first external electrode and the third external electrode by solder; and an insulator is disposed between the first multilayer ceramic electronic component body and the second multilayer ceramic electronic component body.

2. The multilayer ceramic electronic component according to claim 1, wherein the plurality of internal electrodes provided in the first multilayer ceramic electronic component body include:
a fifth internal electrode connected to the first external electrode;
a sixth internal electrode on a same dielectric layer as the fifth internal electrode, connected to the second external electrode, and spaced away from the fifth internal electrode by a predetermined interval; and
a seventh internal electrode on a dielectric layer different from the dielectric layer on which the fifth internal electrode and the sixth internal electrode are provided; and
the seventh internal electrode is opposed to a portion of the fifth internal electrode and a portion of the sixth internal electrode.

3. The multilayer ceramic electronic component according to claim 1, wherein the plurality of internal electrodes provided in the first multilayer ceramic electronic component body include:
an eleventh internal electrode connected to the first external electrode;
a twelfth internal electrode on a dielectric layer different from a dielectric layer on which the eleventh internal electrode is provided, and connected to the second external electrode;
at least one thirteenth internal electrode on the same dielectric layer as the eleventh internal electrode and spaced away from the eleventh internal electrode by a predetermined interval; and
at least two fourteenth internal electrodes on the same dielectric layer as the twelfth internal electrode and spaced away from the twelfth internal electrode by a predetermined interval;
the at least one thirteenth internal electrode is opposed to any two of a portion of the twelfth internal electrode, and portions of the at least two fourteenth internal electrodes; and
one of the at least two fourteenth internal electrodes is opposed to any two of a portion of the eleventh internal electrode, a portion of a first of the at least one thirteenth internal electrode and a portion of a second of the at least one thirteenth internal electrode.

4. The multilayer ceramic electronic component according to claim 1, wherein the plurality of internal electrodes provided in the first multilayer ceramic electronic component body include:
a nineteenth internal electrode connected to the first external electrode;
a twentieth internal electrode on a same dielectric layer as the dielectric layer of the nineteenth internal electrode, connected to the second external electrode, and spaced away from the nineteenth internal electrode by a predetermined interval;
at least one twenty-first internal electrode on the same dielectric layer as of the nineteenth internal electrode and the twentieth internal electrode and spaced away from the nineteenth internal electrode and the twentieth internal electrode by a predetermined interval; and
at least two twenty-second internal electrodes on a dielectric layer different from the dielectric layer on which the nineteenth internal electrode and the twentieth internal electrode are provided;
the at least one twenty-first internal electrode is opposed to portions of the at least two twenty-second internal electrodes; and
one of the at least two twenty-second internal electrodes is opposed to any two of a portion of the nineteenth internal electrode, a portion of the twentieth internal electrode, a portion of a first of the at least one twenty-first internal electrode, and a portion of a second of the at least one twenty-first internal electrode.

5. The multilayer ceramic electronic component according to claim 1, wherein the plurality of internal electrodes provided in the second multilayer ceramic electronic component body include:
an eighth internal electrode connected to the third external electrode;
a ninth internal electrode on a same dielectric layer as the eighth internal electrode, connected to the fourth external electrode, and spaced away from the eighth internal electrode by a predetermined interval; and
a tenth internal electrode on a dielectric layer different from the dielectric layer on which the eighth internal electrode and the ninth internal electrode are provided; and
the tenth internal electrode is opposed to a portion of the eighth internal electrode and a portion of the ninth internal electrode.

6. The multiplayer ceramic electronic component according to claim 1, wherein the plurality of internal electrodes provided in the second multilayer ceramic electronic component body include:
a fifteenth internal electrode connected to the third external electrode;
a sixteenth internal electrode on a dielectric layer different from a dielectric layer on which the fifteenth internal electrode is provided, and connected to the fourth external electrode;
at least one seventeenth internal electrode on the same dielectric layer as the fifteenth internal electrode and spaced away from the fifteenth internal electrode by a predetermined interval; and at least two eighteenth internal electrodes on the same dielectric layer as the sixteenth internal electrode and spaced away from the sixteenth internal electrode by a predetermined interval;

the seventeenth internal electrode is opposed to any two of a portion of the sixteenth internal electrode, and portions of the at least two eighteenth internal electrodes; and one of the at least two eighteenth internal electrodes is opposed to any two of a portion of the fifteenth internal electrode, a portion of a first of the at least one seventeenth internal electrode, and a portion of a second of the at least one seventeenth internal electrode.

7. The multilayer ceramic electronic component according to claim 1, wherein the plurality of internal electrodes provided in the second multilayer ceramic electronic component body include:

a twenty-third internal electrode connected to the third external electrode;

a twenty-fourth internal electrode on a same dielectric layer as the twenty-third internal electrode, connected to the fourth external electrode, spaced away from the twenty-third internal electrode by a predetermined interval;

at least one twenty-fifth internal electrode on the same dielectric layer as the twenty-third internal electrode and the twenty-fourth internal electrode and spaced away from the twenty-third internal electrode and the twenty-fourth internal electrode by a predetermined interval; and at least two twenty-sixth internal electrodes on a dielectric layer different from the dielectric layer on which the twenty-third internal electrode and the twenty-fourth internal electrode are provided;

the at least one twenty-fifth internal electrode is opposed to portions of the at least two twenty-sixth internal electrodes; and one of the at least two twenty-sixth internal electrodes is opposed to any two of a portion of the twenty-third internal electrode, a portion of the twenty-fourth internal electrode, a portion of a first of the at least one twenty-fifth internal electrode, and a portion of a second of the at least one twenty-fifth internal electrode.

8. The multilayer ceramic electronic component according to claim 1, wherein the insulator is disposed such that the first main surface or the second main surface of the first multilayer ceramic electronic component body contacts a first main surface of the insulator and such that the third main surface or the fourth main surface of the second multilayer ceramic electronic component body contacts a second main surface of the insulator.

9. The multilayer ceramic electronic component according to claim 1, wherein the insulator is disposed such that the first side surface or the second side surface of the first multilayer ceramic electronic component body contacts a first main surface of the insulator and such that the third side surface or the fourth side surface of the second multilayer ceramic electronic component body contacts second main surface of the insulator.

10. The multilayer ceramic electronic component according to claim 1, wherein the first metal terminal includes:

a first terminal bonding portion connected to the second external electrode;

a first extended portion that is connected to the first terminal bonding portion and extends in a direction of the mounting surface such that a gap is provided between the first multilayer ceramic electronic component body and the mounting surface of the mounting substrate; and a first mounting portion connected to the first extended portion;

the second metal terminal includes:

a second terminal bonding portion connected to the fourth external electrode;

a second extended portion that is connected to the second terminal bonding portion and extends in the direction of the mounting surface such that a gap is provided between the second multilayer ceramic electronic component body and the mounting surface of the mounting substrate; and a second mounting portion connected to the second extended portion; and the connection terminal includes:

a third terminal bonding portion connected to the first external electrode;

a fourth terminal bonding portion connected to the third external electrode; and a third extended portion that is connected to the third terminal bonding portion and the fourth terminal bonding portion, extends in a direction connecting the first external electrode and the third external electrode, and located between the first external electrode and the third external electrode.

11. The multilayer ceramic electronic component according to claim 10, wherein the first metal terminal and the second metal terminal are lead wires;

the first mounting portion extends on an extension line of the first extended portion; and the second mounting portion extends on an extension line of the second extended portion.

12. The multilayer ceramic electronic component according to claim 1, wherein the first metal terminal and the second metal terminal are frame terminals.

13. The multilayer ceramic electronic component according to claim 12, wherein the first metal terminal and the second metal terminal have a substantially U-shape in a front view.

14. The multilayer ceramic electronic component according to claim 12, wherein the first metal terminal and the second metal terminal have a substantially L-shape in a front view.

15. The multilayer ceramic electronic component according to claim 1, wherein the insulator is an insulating sheet.

16. The multilayer ceramic electronic component according to claim 1, wherein the insulator is a resin.

17. The multilayer ceramic electronic component according to claim 16, wherein the resin is disposed between the first multilayer ceramic electronic component body and the second multilayer ceramic electronic component body, and covers the first multilayer ceramic electronic component body, the second multilayer ceramic electronic component body, the connection terminal, a portion of the first metal terminal, and a portion of the second metal terminal.

18. The multilayer ceramic electronic component according to claim 1, wherein a dimension in a length direction of the multilayer ceramic electronic component is in a range from about 1 mm to about 15 mm, a dimension in a thickness direction of the multilayer ceramic electronic component is in a range from about 2 mm to about 15 mm, and a dimension in a width direction of the multilayer ceramic electronic component is in a range from about 1 mm to about 15 mm.

19. The multilayer ceramic electronic component according to claim 1, wherein
- each of the first and second multilayer ceramic electronic component bodies defines and functions as a capacitor; and
- the plurality of laminated dielectric layers of each of the first and second multilayer ceramic electronic component bodies include at least one of $BaTiO_3$, $CaTiO_3$, $SrTiO_3$, and $CaZrO_3$.

20. The multilayer ceramic electronic component according to claim 1, wherein
- each of the first and second multilayer ceramic electronic component bodies defines and functions as a ceramic piezoelectric element; and
- the plurality of laminated dielectric layers of each of the first and second multilayer ceramic electronic component bodies include a lead titanate zirconate-based ceramic material.

* * * * *